United States Patent
Malandraki et al.

(10) Patent No.: US 12,245,492 B2
(45) Date of Patent: Mar. 4, 2025

(54) ORGANIC SEMICONDUCTOR FORMULATION

(71) Applicant: RAYNERGY TEK INCORPORATION, Hsinchu (TW)

(72) Inventors: Andromachi Malandraki, Bischofsheim (DE); Lichun Chen, Southampton (GB); Philip Edward May, Sidcup (GB); Pawel Miskiewicz, Bahnhofstrasse (DE)

(73) Assignee: RAYNERGY TEK INCORPORATION, Hsinchu (TW)

( * ) Notice: Subject to any disclaimer, the term of this patent is extended or adjusted under 35 U.S.C. 154(b) by 440 days.

(21) Appl. No.: 17/593,921

(22) PCT Filed: Mar. 25, 2020

(86) PCT No.: PCT/EP2020/058312
§ 371 (c)(1),
(2) Date: Sep. 28, 2021

(87) PCT Pub. No.: WO2020/193612
PCT Pub. Date: Oct. 1, 2020

(65) Prior Publication Data
US 2022/0165953 A1    May 26, 2022

(30) Foreign Application Priority Data
Mar. 28, 2019 (EP) .................... 19165719

(51) Int. Cl.
*H10K 71/15* (2023.01)
*H10K 30/30* (2023.01)
(Continued)

(52) U.S. Cl.
CPC .............. *H10K 71/15* (2023.02); *H10K 71/13* (2023.02); *H10K 85/113* (2023.02);
(Continued)

(58) Field of Classification Search
None
See application file for complete search history.

(56) References Cited

U.S. PATENT DOCUMENTS

2010/0043876 A1* 2/2010 Tuttle ................. H10K 71/15
257/E31.13
2011/0006265 A1* 1/2011 James ................. B82Y 10/00
252/500

(Continued)

FOREIGN PATENT DOCUMENTS

WO    2007019944 A1    2/2007
WO    2017102061 A1    6/2017

OTHER PUBLICATIONS

Mathieu Lamarche, et al., Limonene as Green Solvent for Depositing Thin Layers of Molecular Electronic Materials with Controlled Interdiffusion; Sustainable Chemistry & Engineering; ACS Publications; 2017 American Chemical Society, 2017, 5, 5994-5998.

(Continued)

*Primary Examiner* — Katie L. Hammer
(74) *Attorney, Agent, or Firm* — WPAT, PC

(57) ABSTRACT

The invention relates to novel organic semiconductor (OSC) formulations, to their use for the preparation of OSC layers or OSC patterns in organic electronic (OE) devices, especially organic photovoltaic (OPV) devices, perovskite-based solar cell (PSC) devices, organic photo-detectors (OPD), organic field effect transistors (OFET) and organic light emitting diodes (OLED), and to OE, OPV, PSC, OPD, OFET and OLED devices comprising an OSC layer or OSC pattern prepared from these OSC formulations.

17 Claims, 1 Drawing Sheet

(51) Int. Cl.
*H10K 71/13* (2023.01)
*H10K 85/10* (2023.01)
*H10K 85/20* (2023.01)

(52) U.S. Cl.
CPC ......... *H10K 85/151* (2023.02); *H10K 85/211* (2023.02); *H10K 85/215* (2023.02); *H10K 30/30* (2023.02); *Y02E 10/549* (2013.01)

(56) References Cited

U.S. PATENT DOCUMENTS

2014/0230900 A1* 8/2014 Cull ....................... H10K 71/15
 252/500
2017/0237012 A1* 8/2017 Shen .................... C09D 11/033
 257/40

OTHER PUBLICATIONS

International Search Report, PCT/EP2020/058312, Sep. 25, 2020.

* cited by examiner

ORGANIC SEMICONDUCTOR FORMULATION

TECHNICAL FIELD

The invention relates to novel organic semiconductor (OSC) formulations, to their use for the preparation of OSC layers or OSC patterns in organic electronic (OE) devices, especially organic photovoltaic (OPV) devices, perovskite-based solar cell (PSC) devices, organic photo-detectors (OPD), organic field effect transistors (OFET) and organic light emitting diodes (OLED), and to OE, OPV, PSC, OPD, OFET and OLED devices comprising an OSC layer or OSC pattern prepared from these OSC formulations.

BACKGROUND

In recent years, there has been development of organic semiconducting (OSC) materials in order to produce more versatile, lower cost electronic devices. Such materials find application in a wide range of devices or apparatus, including organic field effect transistors (OFETs), organic light emitting diodes (OLEDs), organic photodetectors (OPDs), organic photovoltaic (OPV) cells, sensors, memory elements and logic circuits to name just a few. The organic semiconducting materials are typically present in the electronic device in the form of a thin layer, for example of between 50 and 300 nm thickness.

One particular area of importance is organic photovoltaics (OPV). Conjugated polymers have found use in OPVs as they allow devices to be manufactured by solution-processing techniques such as spin casting, dip coating or ink jet printing. Solution processing can be carried out cheaper and on a larger scale compared to the evaporative techniques used to make inorganic thin film devices. Currently, polymer based photovoltaic devices are achieving efficiencies above 10%.

Organic photodetectors (OPDs) are a further particular area of importance, for which conjugated light-absorbing polymers offer the hope of allowing efficient devices to be produced by solution-processing technologies, such as spin casting, dip coating or ink jet printing, to name a few only.

Another particular area of importance are OFETs. The performance of OFET devices is principally based upon the charge carrier mobility of the semiconducting material and the current on/off ratio, so the ideal semiconductor should have a low conductivity in the off state, combined with high charge carrier mobility ($>1\times10^{-3}$ cm$^2$V$^{-1}$s$^{-1}$). In addition, it is important that the semiconducting material is stable to oxidation i.e. it has a high ionisation potential, as oxidation leads to reduced device performance. Further requirements for the semiconducting material are good processibility, especially for large-scale production of thin layers and desired patterns, and high stability, film uniformity and integrity of the OSC layer.

For OE devices like OPV, OPD and OFET solution processable OSC layers are especially desired. The OSC materials should be solution based and should be suitable for solution based deposition methods like spin-coating, slot-die coating and doctor blade coating, and especially wider area printing methods such as inkjet, flexo, gravure or screen printing. Key requirements for OSC formulations used in such solution processed layers are, inter alia, suitable viscosity, rheology and printability.

The photosensitive layer in an OPV or OPD device is usually composed of at least two materials, a p-type OSC, which is typically a conjugated polymer, an oligomer or a defined molecular unit, and an n-type OSC, which is typically a fullerene or substituted fullerene, non-fullerene acceptor (NFA), graphene, metal oxide, or quantum dots.

In particular, there is a need for OSC formulations for the preparation of the photoactive layer in an OPV or OPD device by printing methods like screen printing, which should preferably consist solely of a mixture of organic p-type and n-type OSCs and a solvent or mixture of solvents, and optionally further volatile additives. The main characteristic of screen printable formulations is a significant shear thinning behaviour which means that the formulation when let idle has high viscosity (like a paste or gel) but becomes liquid upon shearing and it regains its paste/gel-like form when the shearing is eliminated. In addition the solvent mixture should be evaporated upon drying (under heat and/or vacuum) allowing the two types of semiconductors to form a smooth film or a well-defined pattern that enables the charge transfer when illuminated.

However, the literature regarding screen printing formulation reports that screen printable inks usually contain polymers, fillers and non-volatile viscosity additives that when mixed together lead to high viscosity formulations, see for example K. Fan et al., *Renewable Energy* 2010, 35, 555-561, K. Gilleo, *Screen Printing* 1989, 128-132, and R. Fijan et al., *Carbohydrate Polymers* 2009, 78, 25-35.

It was an aim of the present invention to provide new OSC formulations, especially containing a p-type and an n-type OSC, which can overcome the drawbacks of the formulations from prior art, which contain, apart from the two OSCs only liquid and volatile components, and which enable the formation of smooth photoactive OSC layers and well-defined patterns by printing methods, especially by screen printing.

Another aim of the invention was to extend the pool of printable OSC formulations available to the expert. Other aims of the present invention are immediately evident to the expert from the following detailed description.

The inventors of the present invention have found that these aims can be achieved by providing OSC formulations as described hereinafter. These are based on a solvent mixture containing a first solvent detected from terpenes and terpenoids, and a second solvent selected from aromatic, heteroaromatic, or partially unsaturated alicyclic or heterocyclic solvents.

SUMMARY

The invention relates to a formulation comprising a p-type organic semiconductor (OSC) and an n-type OSC, wherein the p-type OSC is preferably a conjugated polymer, very preferably a conjugated copolymer containing electron donor units and electron acceptor units, and the n-type OSC is preferably a small molecule, very preferably a fullerene or substituted fullerene, the formulation further comprising a first solvent selected from terpenes or terpenoids and a second solvent selected from aromatic, heteroaromatic, or partially unsaturated alicyclic or heterocyclic solvents.

The invention further relates to the use of a formulation according to the present invention for preparing an OSC layer or OSC pattern by printing methods, preferably by gravure printing, flexographic printing, inkjet printing or screen printing, very preferably by screen printing.

The invention further relates to a method of preparing an OSC layer or pattern from a formulation according to the present invention by printing methods, preferably by gravure printing, flexographic printing, inkjet printing or screen printing, very preferably by screen printing. The invention further relates to an OSC layer or pattern which is prepared by such a method.

The OSC layer or pattern is preferably a photoactive OSC layer or pattern in an optical, optoelectronic, electroluminescent or photoluminescent device, preferably in an OPV device or OPD.

In a preferred embodiment of the present invention the total solid content of the formulation is ≤6%. In another preferred embodiment of the present invention the formulation contains, apart of the p-type and n-type OSCs, only volatile organic compounds (VOCs). This helps to minimise the insulation paths or the disruption of the charge transfer paths in the bulk heterojunction.

The invention further relates to an optical, optoelectronic, electroluminescent or photoluminescent device, or a component thereof, or an assembly comprising it, which contains an OSC layer or pattern, preferably a photoactive OSC layer or pattern that is prepared using a formulation according to the present invention.

The optical, electronic, optoelectronic, electroluminescent and photoluminescent device include, without limitation, organic field effect transistors (OFET), organic thin film transistors (OTFT), organic light emitting diodes (OLED), organic light emitting transistors (OLET), organic photovoltaic devices (OPV), organic photodetectors (OPD), organic solar cells, dye-sensitized solar cells (DSSC), perovskite-based solar cells (PSC), laser diodes, Schottky diodes, photoconductors and photodetectors.

Preferred devices are OFETs, OTFTs, OPVs, PSCs, OPDs and OLEDs, in particular OTFTs, PSCs, OPDs and bulk heterojunction (BHJ) OPVs or inverted BHJ OPVs.

The component of the above devices includes, without limitation, charge injection layers, charge transport layers, interlayers, planarising layers, antistatic films, polymer electrolyte membranes (PEM), conducting substrates and conducting patterns.

The assembly comprising such a device or component includes, without limitation, integrated circuits (IC), radio frequency identification (RFID) tags or security markings or security devices containing them, flat panel displays or backlights thereof, electrophotographic devices, electrophotographic recording devices, organic memory devices, sensor devices, biosensors and biochips.

TERMS AND DEFINITIONS

Figure 1A:
FIG. 1a shows a microscope image of squares printed with an OSC formulation according to Comparison Example 1.

As used herein, the term "terpene" means an organic compound having one or more of building blocks delivered from the hydrocarbon isoprene (2-methyl-1,3-butadiene).

As used herein, the term "terpenoid" means an organic compound having one or more of building blocks delivered from the hydrocarbon isoprene and in addition containing one or more oxygen containing functional groups like hydroxy, ether, ketone or ester groups.

As used herein, the terms "donor" or "donating" and "acceptor" or "accepting" will be understood to mean an electron donor or electron acceptor, respectively. "Electron donor" will be understood to mean a chemical entity that donates electrons to another compound or another group of atoms of a compound. "Electron acceptor" will be understood to mean a chemical entity that accepts electrons transferred to it from another compound or another group of atoms of a compound. See also International Union of Pure and Applied Chemistry, Compendium of Chemical Technology, Gold Book, Version 2.3.2, 19. August 2012, pages 477 and 480.

As used herein, the term "donor unit" will be understood to mean a unit, preferably a conjugated arylene or heteroarylene unit, which has an electron donating or electron pushing property towards a neighboured conjugated unit. The term "acceptor unit" will be understood to mean a unit, preferably a conjugated arylene or heteroarylene unit, which has an electron accepting or electron withdrawing property towards a neighboured conjugated unit. The term "spacer unit" will be understood to mean a unit which can be conjugated or non-conjugated and is located between a donor and an acceptor unit, and is preferably selected such that it does not have electron accepting property towards a neighboured donor unit.

As used herein, the term "spacer unit" will be understood to mean a unit, preferably a conjugated arylene or heteroarylene unit, which is located between two donor units, or between two acceptor units, or between an acceptor unit and a donor unit, such that said donor and acceptor units are not connected directly with each other.

As used herein, the term "n-type" or "n-type OSC" will be understood to mean an extrinsic semiconductor in which the conduction electron density is in excess of the mobile hole density, and the term "p-type" or "p-type OSC" will be understood to mean an extrinsic semiconductor in which mobile hole density is in excess of the conduction electron density (see also, J. Thewlis, *Concise Dictionary of Physics*, Pergamon Press, Oxford, 1973).

As used herein, the term "conjugated" will be understood to mean a compound (for example a polymer) that contains mainly C atoms with $sp^2$-hybridization (or optionally also sp-hybridization), and wherein these C atoms may also be replaced by hetero atoms. In the simplest case this is for example a compound with alternating C—C single and double (or triple) bonds, but is also inclusive of compounds with aromatic units like for example 1,4-phenylene. The term "mainly" in this connection will be understood to mean that a compound with naturally (spontaneously) occurring defects, or with defects included by design, which may lead to interruption of the conjugation, is still regarded as a conjugated compound.

As used herein, the term "polymer" will be understood to mean a molecule of high relative molecular mass, the structure of which essentially comprises multiple repetitions of units derived, actually or conceptually, from molecules of low relative molecular mass (*Pure Appl. Chem.*, 1996, 68, 2291). The term "oligomer" will be understood to mean a molecule of intermediate relative molecular mass, the structure of which essentially comprises a small plurality of units derived, actually or conceptually, from molecules of lower relative molecular mass (*Pure Appl. Chem.*, 1996, 68, 2291). In a preferred meaning as used herein present invention a polymer will be understood to mean a compound having >1, i.e. at least 2 repeat units, preferably ≥5, very preferably ≥10, repeat units, and an oligomer will be understood to mean a compound with >1 and <10, preferably <5, repeat units.

Further, as used herein, the term "polymer" will be understood to mean a molecule that encompasses a backbone (also referred to as "main chain") of one or more distinct types of repeat units (the smallest constitutional unit of the molecule) and is inclusive of the commonly known terms "oligomer", "copolymer", "homopolymer", "random polymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, in a formula showing a polymer or a repeat unit an asterisk (*) will be understood to mean a chemical linkage, usually a single bond, to an adjacent unit or to a terminal group in the polymer backbone. In a ring, like for example a benzene or thiophene ring, an asterisk (*) will be understood to mean a C atom that is fused to an adjacent ring.

As used herein, in a formula showing a ring, a polymer or a repeat unit a dashed line (-----) will be understood to mean a single bond.

As used herein, the terms "repeat unit", "repeating unit" and "monomeric unit" are used interchangeably and will be understood to mean the constitutional repeating unit (CRU), which is the smallest constitutional unit the repetition of which constitutes a regular macromolecule, a regular oligomer molecule, a regular block or a regular chain (*Pure Appl. Chem.*, 1996, 68, 2291). As further used herein, the term "unit" will be understood to mean a structural unit which can be a repeating unit on its own, or can together with other units form a constitutional repeating unit.

As used herein, a "terminal group" will be understood to mean a group that terminates a polymer backbone. The expression "in terminal position in the backbone" will be understood to mean a divalent unit or repeat unit that is linked at one side to such a terminal group and at the other side to another repeat unit. Such terminal groups include endcap groups, or reactive groups that are attached to a monomer forming the polymer backbone which did not participate in the polymerization reaction, like for example a group having the meaning of $R^{31}$ or $R^{32}$ as defined below.

As used herein, the term "endcap group" will be understood to mean a group that is attached to, or replacing, a terminal group of the polymer backbone. The endcap group can be introduced into the polymer by an endcapping process. Endcapping can be carried out for example by reacting the terminal groups of the polymer backbone with a monofunctional compound ("endcapper") like for example an alkyl- or arylhalide, an alkyl- or arylstannane or an alkyl- or arylboronate. The endcapper can be added for example after the polymerization reaction. Alternatively the endcapper can be added in situ to the reaction mixture before or during the polymerization reaction. In situ addition of an endcapper can also be used to terminate the polymerization reaction and thus control the molecular weight of the forming polymer. Typical endcap groups are for example H, phenyl and lower alkyl.

As used herein, the term "small molecule" will be understood to mean a monomeric compound which typically does not contain a reactive group by which it can be reacted to form a polymer, and which is designated to be used in monomeric form. In contrast thereto, the term "monomer" unless stated otherwise will be understood to mean a monomeric compound that carries one or more reactive functional groups by which it can be reacted to form a polymer.

As used herein, the term "leaving group" will be understood to mean an atom or group (which may be charged or uncharged) that becomes detached from an atom in what is considered to be the residual or main part of the molecule taking part in a specified reaction (see also *Pure Appl. Chem.*, 1994, 66, 1134).

As used herein, unless stated otherwise the molecular weight is given as the number average molecular weight $M_n$ or weight average molecular weight $M_w$, which is determined by gel permeation chromatography (GPC) against polystyrene standards in eluent solvents such as tetrahydrofuran, trichloromethane (TCM, chloroform), chlorobenzene or 1,2,4-trichloro-benzene. Unless stated otherwise, chlorobenzene is used as solvent. The degree of polymerization, also referred to as total number of repeat units, n, will be understood to mean the number average degree of polymerization given as $n=M_n/M_U$, wherein $M_n$ is the number average molecular weight and $M_U$ is the molecular weight of the single repeat unit, see J. M. G. Cowie, *Polymers: Chemistry & Physics of Modern Materials*, Blackie, Glasgow, 1991.

As used herein, the term "carbyl group" will be understood to mean any monovalent or multivalent organic moiety which comprises at least one carbon atom either without any non-carbon atoms (like for example —C≡C—), or optionally combined with at least one non-carbon atom such as B, N, O, S, P, Si, Se, As, Te or Ge (for example carbonyl etc.).

As used herein, the term "hydrocarbyl group" will be understood to mean a carbyl group that does additionally contain one or more H atoms and optionally contains one or more hetero atoms like for example B, N, O, S, P, Si, Se, As, Te or Ge.

As used herein, the term "hetero atom" will be understood to mean an atom in an organic compound that is not a H- or C-atom, and preferably will be understood to mean B, N, O, S, P, Si, Se, Sn, As, Te or Ge.

A carbyl or hydrocarbyl group comprising a chain of 3 or more C atoms may be straight-chain, branched and/or cyclic, and may include spiro-connected and/or fused rings.

Preferred carbyl and hydrocarbyl groups include alkyl, alkoxy, thioalkyl, alkylcarbonyl, alkoxycarbonyl, alkylcarbonyloxy and alkoxycarbonyloxy, each of which is optionally substituted and has up to 40, preferably up to 25, very preferably up to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 1 to 40, preferably 6 to 40 C atoms, wherein each of these groups optionally contains one or more hetero atoms, preferably selected from B, N, O, S, P, Si, Se, As, Te and Ge.

Further preferred carbyl and hydrocarbyl group include for example: a $C_1$—$C_{40}$ alkyl group, a $C_1$-$C_{40}$ fluoroalkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_2$-$C_{40}$ ketone group, a $C_2$-$C_{40}$ ester group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_1$-$C_{20}$ fluoroalkyl group, a $C_2$-$C_{20}$ alkenyl group, a $C_2$-$C_{20}$ alkynyl group, a $C_3$-$C_{20}$ allyl group, a $C_4$-$C_{20}$ alkyldienyl group, a $C_2$-$C_{20}$ ketone group, a $C_2$-$C_{20}$ ester group, a $C_6$-$C_{12}$ aryl group, and a $C_4$-$C_{20}$ polyenyl group, respectively.

Also included are combinations of groups having carbon atoms and groups having hetero atoms, like e.g. an alkynyl group, preferably ethynyl, that is substituted with a silyl group, preferably a trialkylsilyl group.

The carbyl or hydrocarbyl group may be an acyclic group or a cyclic group. Where the carbyl or hydrocarbyl group is an acyclic group, it may be straight-chain or branched. Where the carbyl or hydrocarbyl group is a cyclic group, it may be a non-aromatic carbocyclic or heterocyclic group, or an aryl or heteroaryl group.

A non-aromatic carbocyclic group as referred to above and below is saturated or unsaturated and preferably has 4 to 30 ring C atoms. A non-aromatic heterocyclic group as referred to above and below preferably has 4 to 30 ring C atoms, wherein one or more of the C ring atoms are each optionally replaced by a hetero atom, preferably selected from N, O, P, S, Si and Se, or by a —S(O)— or —S(O)$_2$— group. The non-aromatic carbo- and heterocyclic groups are mono- or polycyclic, may also contain fused rings, preferably contain 1, 2, 3 or 4 fused or unfused rings, and are optionally substituted with one or more groups L.

L is selected from F, Cl, —CN, —NO$_2$, —NC, —NCO, —NCS, —OCN, —SCN, —R$^0$, —OR$^0$, —SR$^0$, —C(=O) X$^0$, —C(=O)R$^0$, —C(=O)—OR$^0$, —O—C(=O)—R$^0$, —NH$_2$, —NHR$^0$, —NR$^0$R$^{00}$, —C(=O)NHR$^0$, —C(=O) NR$^0$R$^{00}$, —SO$_3$R$^0$, —SO$_2$R$^0$, —OH, —CF$_3$, —SF$_5$, or optionally substituted silyl, or carbyl or hydrocarbyl with 1 to 30, preferably 1 to 20 C atoms that is optionally substituted and optionally comprises one or more hetero atoms, wherein X$^0$ is halogen, preferably F or Cl, and R$^0$, R$^{00}$ each independently denote H or straight-chain or branched alkyl with 1 to 20, preferably 1 to 12 C atoms that is optionally fluorinated.

Preferably L is selected from F, —CN, R$^0$, —OR$^0$, —SR$^0$, —C(=O)—R$^0$, —C(=O)—OR$^0$, —O—C(=O)—R$^0$, —O—C(=O)—OR$^0$, —C(=O)—NHR$^0$ and —C(=O)—NR$^0$R$^{00}$.

Further preferably L is selected from F or alkyl, alkoxy, oxaalkyl, thioalkyl, fluoroalkyl, fluoroalkoxy, alkylcarbonyl, alkoxycarbonyl, with 1 to 16 C atoms, or alkenyl or alkynyl with 2 to 16 C atoms.

Preferred non-aromatic carbocyclic or heterocyclic groups are tetrahydrofuran, indane, pyran, pyrrolidine, piperidine, cyclopentane, cyclohexane, cycloheptane, cyclopentanone, cyclohexanone, dihydro-furan-2-one, tetrahydro-pyran-2-one and oxepan-2-one.

An aryl group as referred to above and below preferably has 4 to 30, very preferably 5 to 20, ring C atoms, is mono- or polycyclic and may also contain fused rings, preferably contains 1, 2, 3 or 4 fused or unfused rings, and is optionally substituted with one or more groups L as defined above.

A heteroaryl group as referred to above and below preferably has 4 to 30, very preferably 5 to 20, ring C atoms, wherein one or more of the ring C atoms are replaced by a hetero atom, preferably selected from N, O, S, Si and Se, is mono- or polycyclic and may also contain fused rings, preferably contains 1, 2, 3 or 4 fused or unfused rings, and is optionally substituted with one or more groups L as defined above.

An arylalkyl or heteroarylalkyl group as referred to above and below preferably denotes —(CH$_2$)$_a$-aryl or —(CH$_2$)$_a$-heteroaryl, wherein a is an integer from 1 to 6, preferably 1, and "aryl" and "heteroaryl" have the meanings given above and below. A preferred arylalkyl group is benzyl which is optionally substituted by L.

As used herein, "arylene" will be understood to mean a divalent aryl group, and "heteroarylene" will be understood to mean a divalent heteroaryl group, including all preferred meanings of aryl and heteroaryl as given above and below.

Preferred aryl and heteroaryl groups are phenyl in which, in addition, one or more CH groups may each be replaced by N, naphthalene, thiophene, selenophene, thienothiophene, dithienothiophene, fluorene and oxazole, all of which can be unsubstituted, mono- or polysubstituted with L as defined above. Very preferred aryl and heteroaryl groups are selected from phenyl, pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, 2,5-dithiophene-2',5'-diyl, thieno[3,2-b]thiophene, thieno[2,3-b]thiophene, furo[3,2-b]furan, furo[2,3-b]furan, seleno[3,2-b]selenophene, seleno[2,3-b]selenophene, thieno[3,2-b]selenophene, thieno[3,2-b]furan, indole, isoindole, benzo[b]furan, benzo[b]thiophene, benzo[1,2-b;4,5-b']dithiophene, benzo[2,1-b;3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole, benzothiadiazole, 4H-cyclopenta[2,1-b;3,4-b']dithiophene, 7H-3,4-dithia-7-sila-cyclopenta[a]pentalene, all of which can be unsubstituted, mono- or polysubstituted with L as defined above. Further examples of aryl and heteroaryl groups are those selected from the groups shown hereinafter.

An alkyl group or an alkoxy group, i.e., where the terminal CH$_2$ group is replaced by —O—, can be straight-chain or branched. Particularly preferred straight-chains have 2, 3, 4, 5, 6, 7, 8, 12 or 16 carbon atoms and accordingly denote preferably ethyl, propyl, butyl, pentyl, hexyl, heptyl, octyl, dodecyl or hexadecyl, ethoxy, propoxy, butoxy, pentoxy, hexoxy, heptoxy, octoxy, dodecoxy or hexadecoxy, furthermore methyl, nonyl, decyl, undecyl, tridecyl, tetradecyl, pentadecyl, nonoxy, decoxy, undecoxy, tridecoxy or tetradecoxy, for example.

An alkenyl group, i.e., wherein one or more CH$_2$ groups are each replaced by —CH=CH— can be straight-chain or branched. It is preferably straight-chain, has 2 to 10 C atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples for particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Groups having up to 5 C atoms are generally preferred.

An oxaalkyl group, i.e., where one CH$_2$ group is replaced by —O—, can be straight-chain. Particularly preferred straight-chains are 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

In an alkyl group wherein one CH$_2$ group is replaced by —O— and one CH$_2$ group is replaced by —C(O)—, these radicals are preferably neighboured. Accordingly, these radicals together form a carbonyloxy group —C(O)—O— or an oxycarbonyl group —O—C(O)—. Preferably this group is straight-chain and has 2 to 6 C atoms. It is accordingly preferably acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxycarbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl or 4-(methoxycarbonyl)-butyl.

An alkyl group wherein two or more CH$_2$ groups are replaced by —O— and/or —C(O)O— can be straight-chain or branched. It is preferably straight-chain and has 3 to 12 C atoms. Accordingly, it is preferably bis-carboxy-methyl, 2,2-bis-carboxy-ethyl, 3,3-bis-carboxy-propyl, 4,4-bis-carboxy-butyl, 5,5-bis-carboxy-pentyl, 6,6-bis-carboxy-hexyl, 7,7-bis-carboxy-heptyl, 8,8-bis-carboxy-octyl, 9,9-bis-carboxy-nonyl, 10,10-bis-carboxy-decyl, bis-(methoxycarbonyl)-methyl, 2,2-bis-(methoxycarbonyl)-ethyl, 3,3-bis-(methoxycarbonyl)-propyl, 4,4-bis-(methoxycarbonyl)-butyl, 5,5-bis-(methoxycarbonyl)-pentyl, 6,6-bis-(methoxycarbonyl)-hexyl, 7,7-bis-(methoxycarbonyl)-heptyl, 8,8-bis-(methoxycarbonyl)-octyl, bis-(ethoxycarbonyl)-methyl, 2,2-bis-(ethoxycarbonyl)-ethyl, 3,3-bis-(ethoxycarbonyl)-propyl, 4,4-bis-(ethoxycarbonyl)-butyl or 5,5-bis-(ethoxycarbonyl)-hexyl.

A thioalkyl group, i.e., where one CH$_2$ group is replaced by —S—, is preferably straight-chain thiomethyl (—SCH$_3$), 1-thioethyl (—SCH$_2$CH$_3$), 1-thiopropyl (=—SCH$_2$CH$_2$CH$_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the CH$_2$ group adjacent to the sp$^2$ hybridized vinyl carbon atom is replaced.

A fluoroalkyl group can be perfluoroalkyl C$_i$F$_{2i+1}$, wherein i is an integer from 1 to 15, in particular CF$_3$, C$_2$F$_5$, C$_3$F$_7$, C$_4$F$_9$, C$_5$F$_{11}$, C$_6$F$_{13}$, C$_7$F$_{15}$ or C$_8$F$_{17}$, very preferably C$_6$F$_{13}$, or partially fluorinated alkyl, preferably with 1 to 15 C atoms, in particular 1,1-difluoroalkyl, all of the aforementioned being straight-chain or branched.

Preferably "fluoroalkyl" means a partially fluorinated (i.e. not perfluorinated) alkyl group.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-butyloctyl, 2-hexyldecyl, 2-octyldodecyl, 3,7-dimethyloctyl, 3,7,11-trimethyldodecyl, 2-propylpentyl, in particular 2-methylbutyl, 2-methylbutoxy, 2-methylpentoxy, 3-methyl-pentoxy, 2-ethyl-hexoxy, 2-butyloctoxyo, 2-hexyldecoxy, 2-octyldodecoxy, 3,7-dimethyloctoxy, 3,7,11-trimethyldodecoxy, 1-methylhexoxy, 2-octyloxy, 2-oxa-3-methylbutyl, 3-oxa-4-methyl-pentyl, 4-methylhexyl, 2-hexyl, 2-octyl, 2-nonyl, 2-decyl, 2-dodecyl, 6-methoxyoctoxy, 6-methyloctoxy, 6-methyloctanoyloxy, 5-methylheptyloxy-carbonyl, 2-methylbutyryloxy, 3-methylvaleroyloxy, 4-methylhexanoyloxy, 2-chloro-propionyloxy, 2-chloro-3-methylbutyryloxy, 2-chloro-4-methyl-valeryloxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl and 2-fluoromethyloctyloxy for example. Very preferred are 2-methylbutyl, 2-ethylhexyl, 2-butyloctyl, 2-hexyldecyl, 2-octyldodecyl, 3,7-dimethyloctyl, 3,7,11-trimethyldodecyl, 2-hexyl, 2-octyl, 2-octyloxy, 1,1,1-trifluoro-2-hexyl, 1,1,1-trifluoro-2-octyl and 1,1,1-trifluoro-2-octyloxy.

Preferred achiral branched groups are isopropyl, isobutyl (=methylpropyl), isopentyl (=3-methylbutyl), tert. butyl, isopropoxy, 2-methyl-propoxy and 3-methylbutoxy.

In a preferred embodiment, the substituents on an aryl or heteroaryl ring are independently of each other selected from primary, secondary or tertiary alkyl, alkoxy, oxaalkyl, thioalkyl, alkylcarbonyl or alkoxycarbonyl with 1 to 30 C atoms, wherein one or more H atoms are each optionally replaced by F, or aryl, aryloxy, heteroaryl or heteroaryloxy that is optionally alkylated, alkoxylated, alkylthiolated or esterified and has 4 to 30, preferably 5 to 20, ring atoms. Further preferred substituents are selected from the group consisting of the following formulae

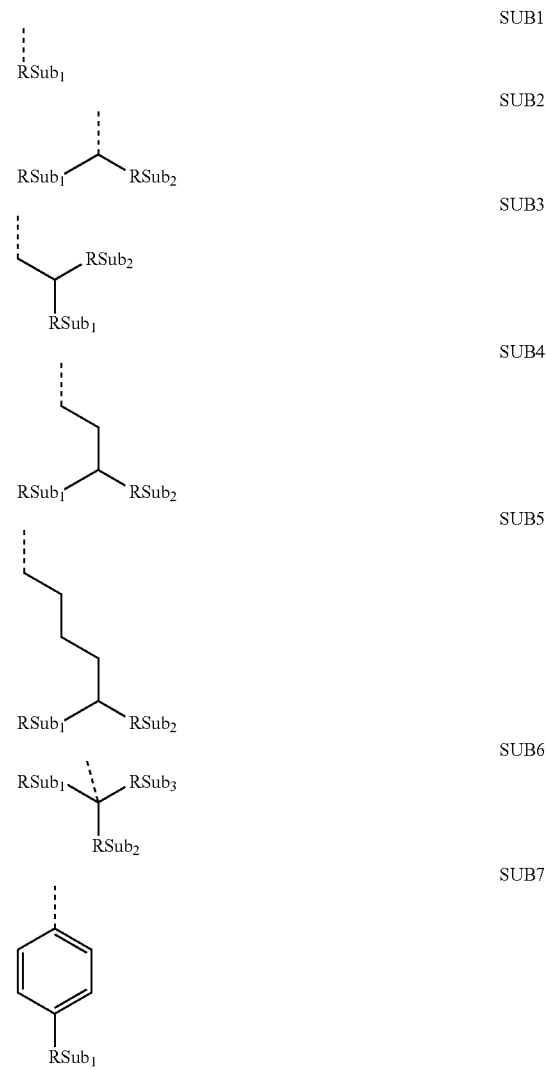

-continued

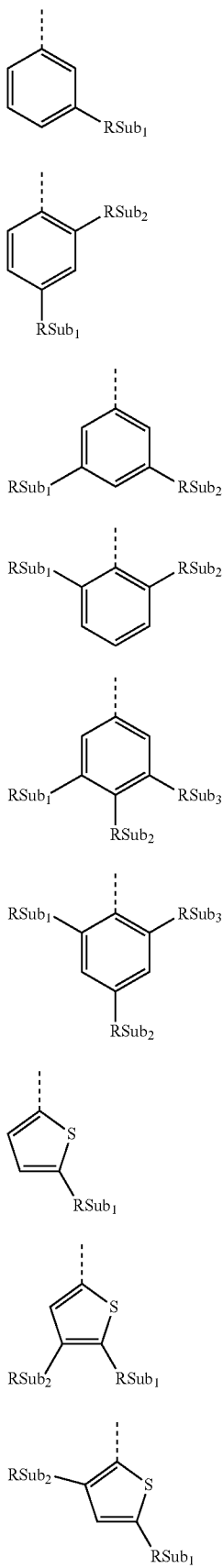

SUB8

SUB9

SUB10

SUB11

SUB12

SUB13

SUB14

SUB15

SUB16

-continued

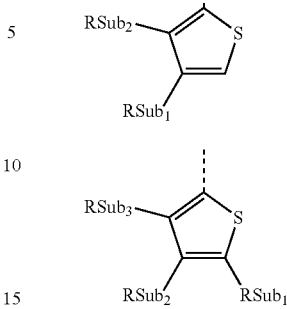

SUB17

SUB18 wherein $RSub_{1-3}$ each denote L as defined above and below and where at least, preferably all, of $RSub_{1-3}$ is alkyl, alkoxy, oxaalkyl, thioalkyl, alkylcarbonyl or alkoxycarbonyl with up to 24 C atoms, preferably up to 20 C atoms, that is optionally fluorinated, and wherein the dashed line denotes the link to the ring to which these groups are attached. Very preferred among these substituents are those wherein all $RSub_{1-3}$ subgroups are identical.

As used herein, if an aryl(oxy) or heteroaryl(oxy) group is "alkylated or alkoxylated", this means that it is substituted with one or more alkyl or alkoxy groups having from 1 to 24 C-atoms and being straight-chain or branched and wherein one or more H atoms are each optionally substituted by an F atom.

Above and below, $Y^1$ and $Y^2$ are independently of each other H, F, Cl or CN.

As used herein, —CO—, —C(=O)— and —C(O)— will be understood to mean a carbonyl group, i.e. a group having the structure

As used herein, $C=CR^1R^2$ will be understood to mean a group having the structure

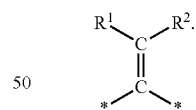

As used herein, "halogen" includes F, Cl, Br or I, preferably F, Cl or Br. A halogen atom that represents a substituent on a ring or chain is preferably F or Cl, very preferably F. A halogen atom that represents a reactive group in a monomer or an intermediate is preferably Br or I.

DETAILED DESCRIPTION

The literature regarding screen printing formulation states that screen printable inks contain polymers, fillers and non-volatile viscosity additives that when mixed together lead to high viscosity formulations.

Therefore in the formulations according to the present invention the total solid content is preferably ≤6%, very preferably ≤5% by weight. Further preferably all components of the formulation, except for the n-type (or acceptor) and p-type (or donor) OSCs, are volatile to minimise the insulation paths or the disruption of the charge transfer paths in the bulk heterojunction.

The formulation according to the present invention contains a mixture of two solvents, wherein the second solvent is preferably selected such that it dissolves both p-type polymer and the n-type small molecule in the required range of concentration, and the first solvent, which is a terpene or terpenoid, does only partially dissolve the polymer and has a high viscosity on its own. When blended the viscosity of the total formulation will increase depending on the solvent mixture.

For example 1,5-Dimethyltetralin (1,5-DMT) is a suitable second solvent with a viscosity of about 4 cp that can dissolve both the polymeric donor OSC and small molecule acceptor OSC in a concentration at least up to 3%. Terpene solvents like ß-caryophyllene or vetiver acetate, on the other hand, cannot dissolve the polymeric donor OSC fully, but when mixed with 1,5-DMT a well dissolved solution can be achieved.

The first solvent is preferably selected from the group consisting of β-caryophyllene, vetiveryl acetate, carvacrol, valencene, D-carvone, citral diethyl acetal, verbenone, nerol, menthone, citral, derivatives of the aforementioned, and any combination of the aforementioned, very preferably β-caryophyllene, vetiveryl acetate and carvacrol, most preferably β-caryophyllene.

According to the present invention, the term "derivative" includes cis- and trans isomers.

Examples of suitable and preferred first solvents are listed in Table 1.

TABLE 1

| Solvents | Boiling point (° C.) |
|---|---|
| 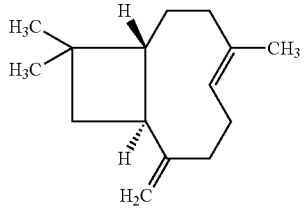<br>β-Caryophyllene, CAS: 87-44-5 | 260 |
| 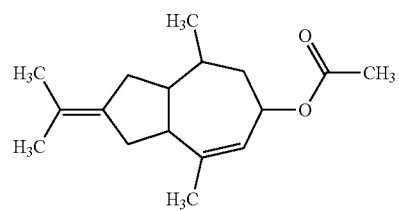 [SMILES: CC(=O)OC1C=C(C)C2CC(=C(C)C)CC2C(C)C1]<br>Vetiver acetate, CAS: 62563-80-8 / 117-98-6 | 286 |
| 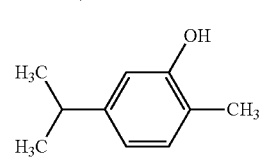<br>Carvacrol, CAS: 499-75-2 | 238 |

TABLE 1-continued

| Solvents | Boiling point (° C.) |
|---|---|
| 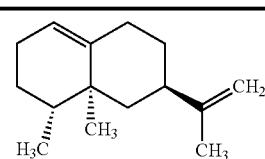<br>Valencene, CAS: 4630-07-3 | 274 |
| 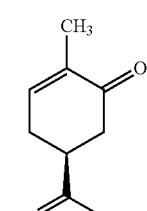<br>D-carvone (including R-carvone and S-carvone), CAS: 2244-16-8 | 225 |
| 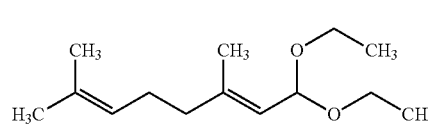<br>Citral diethyl acetal, CAS: 7549-37-3 | 271 |
| 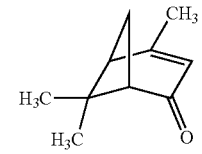<br>Verbenone, CAS: 1196-01-6 | 227 |
| 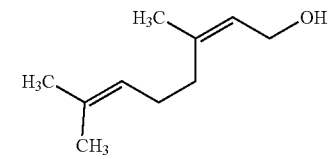<br>Nerol, CAS: 106-25-2 | 224 |
| 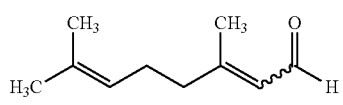<br>Citral, CAS: 5392-40-5 | 229 |

The first solvent is preferably selected from high boiling solvents, preferably having a boiling point≥150° C., very preferably ≥200° C., most preferably ≥220° C.

The second solvent is preferably selected from the group consisting of alkylated benzene, alkoxylated benzene, indane, alkylated indane, alkoxylated indane, tetralin, alkylated tetralin, naphthalene, alkylated naphthalene, anisole and alkylated anisole.

More preferably the second solvent is selected from alkylated tetralin, alkylated naphthalene or alkylated anisole, preferably tetralin that is substituted by two or more alkyl groups, naphthalene that is substituted by one or more alkyl groups or anisole that is substituted by two or more alkyl groups, the alkyl groups preferably being straight-chain or branched alkyl with 1 to 6, very preferably 1, 2 or 3, C atoms. Very preferably the first solvent is selected form the group consisting of 1,5-dimethyltetralin, 1-methylnaphthalene, 1-ethylnaphthalene, 2-ethylnaphthalene, 1,2-dimethylnaphthalene, 1,3-dimethylnaphthalene, 1,4-dimethylnaphthalene, 2,6-dimethylnaphthalene, 2,7-diisopropylnaphthalene and dimethylanisole, more preferably 1,5-dimethyltetralin, 1-methylnaphthalene and dimethylanisole, most preferably 1,5-dimethyltetralin.

The term "dimethylanisole" as used above and below includes any of 2,3-dimethylanisole, 2,4-dimethylanisole, 2,5-dimethylanisole, 2,6-dimethylanisole, 3,4-dimethylanisole and 3,5-dimethylanisole, and preferably means 2,4-dimethylanisole.

In another preferred embodiment the second solvent is selected from the group consisting of alkylated benzene, alkoxylated benzene, indane, alkylated indane, alkoxylated indane, tetralin, alkylated tetralin, naphthalene, alkylated naphthalene, anisole, alkylated anisole, and linear or cyclic ketone, wherein "alkylated" means substituted by one or more, preferably two or more straight-chain or branched alkyl groups with 1 to 6, preferably 1, 2 or 3, C atoms and "alkoxylated" means substituted by one or more, preferably two or more straight-chain or branched alkoxyl groups with 1 to 6, preferably 1, 2 or 3, C atoms.

Further preferred types of second solvents include those selected from the group consisting of aromatic and/or aliphatic ethers, aromatic alcohols, optionally substituted thiophenes, benzothiophenes, alkoxylated naphthalene, substituted benzothiazoles, alkyl benzoates, aryl benzoates.

Very preferably the second solvent is selected from the group consisting of xylene (including o-, m- and p-dimethyl benzene either as pure isomers or as isomer mixture), cymene (including o-, m- and p-methyl isopropyl benzene either as pure isomers or as isomer mixture) indane, anisole (methoxybenzene) and veratrol (o-dimethoxybenzene), dimethylanisole, tetralin, 1,5-dimethyltetralin, naphthalene, 1-methylnaphthalene, 1-ethylnaphthalene, 2-ethylnaphthalene, 1,2-dimethylnaphthalene, 1,3-dimethylnaphthalene, 1,4-dimethylnaphthalene, 2,6-dimethylnaphthalene, 2,7-diisopropylnaphthalene, cyclopentanone, cyclohexanone, most preferably from m-xylene, p-cymene, veratrol, 1,5-dimethyltetralin, 1-methylnaphthalene and indane.

Further preferred specific second solvents include those selected from the group consisting of 1,2-dihydronapthalene, decalin, diphenyl ether, cyclohexyl benzene, methyl phenyl acetate, phenyl acetate, benzyl acetate, ethyl benzoate, gamma-terpinene, benzothiophene, thiophene, 1-methoxynaphthalene, benzyl alcohol, cyclohexanol, indene, 1,4-dioxane, ethylene glycol monobutyl ether, diethyl ether, N-methylpyrrolidone, diethyl phthalate, benzyl benzoate, ethyl benzoate, acetophenone, propiophenone, 2-heptanone, cyclohexanone, benzothiazole, benzonitrile, bicyclohexyl, methyl isobutyl ketone.

These solvents can be employed individually or as a mixture of two, three or more solvents forming the second solvent.

The second solvent is preferably selected to have a lower boiling point than the first solvent, and preferably has a boiling point $\geq 100°$ C., very preferably $\geq 130°$ C., most preferably $\geq 180°$ C.

Preferably in the solvent blend consisting of the first and second solvent the concentration of the first solvent is lower than the concentration of the second solvent. In case more than one first and/or more than one second solvents are present, preferably in the solvent blend the total concentration of all first solvents is lower than the total concentration of all second solvents.

In the formulation according to the present invention, the concentration of the first solvent is preferably from 1 to 40%, very preferably from 2 to 30%, most preferably from 3 to 25%. The concentration of the second solvent is preferably from 50 to 98%, very preferably from 50 to 90%, most preferably from 60 to 85%. Further preferred are formulations of the present invention containing any combination of the aforementioned concentration ranges of the first and second solvent.

In the formulation according to the present invention, the concentration of the p-type OSC is preferably from 0.5 to 8%, very preferably from 1 to 5%. The concentration of the n-type OSC is preferably from 0.5 to 8%, very preferably from 1 to 5%. Further preferred are formulations of the present invention containing any combination of the aforementioned concentration ranges of the p-type and n-type OSC.

In the formulation according to the present invention, the total concentration of all semiconductors is preferably from 1 to 10%, very preferably from 2 to 6%.

In the formulation according to the present invention, the total concentration of all solids is preferably $\leq 10\%$, very preferably $\leq 6\%$, most preferably $\leq 5\%$.

In addition to the p-type and n-type OSCs and the first and second solvents, the formulation according to the present invention may also comprise one or more additives selected from surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

Preferably the additives are selected from liquid and volatile additives. For example, in a preferred embodiment the formulation comprises one or more liquid and volatile siloxanes, such as octamethyltrisiloxane (m.p. −82° C., b.p. 153° C.), for the purpose of reducing the surface tension of the ink, thereby enabling better wetting of the substrate and improving the printing quality.

The concentration of the additives in the formulation is preferably 0.1 to 8%, more preferably 0.5 to 5%.

Preferably the formulation according to the present invention does, except for the n-type and p-type OSC, only contain volatile organic compounds (VOCs).

Preferably the formulation according to the present invention does, except for the n-type and p-type OSC, not contain any solid components.

The viscosity of the formulation according to the present invention is preferably $\geq 50$ cp, very preferably $\geq 100$ cp.

In the formulation according to the present invention the ratio of the n-type and the p-type OSC is preferably from 5:1 to 1:5 by weight, more preferably from 3:1 to 1:3 by weight, most preferably 2:1 to 1:2 by weight.

The p-type OSC is preferably selected from conjugated polymers, very preferably from conjugated polymers having a molecular weight $M_n > 5000$ g/mol, very preferably $\geq 10,000$ g/mol.

A preferred p-type OSC is poly-3-alkylthiophene wherein "alkyl" denotes $C_{1-12}$ alkyl, very preferably poly-3-hexylthiophene (P3HT).

Another preferred p-type OSC is a conjugated polymer (hereinafter also shortly referred to as "p-type polymer") comprising at least one electron donating unit ("donor unit") D and at least one electron accepting unit ("acceptor unit")

A, and optionally at least one spacer unit Sp separating a donor unit from an acceptor unit, wherein each donor and acceptor units is directly connected to another donor or acceptor unit or to a spacer unit, and wherein preferably the spacer units, if present, are located between the donor and acceptor units such that a donor unit and an acceptor unit are not directly connected to each other, and wherein all of the donor, acceptor and spacer units are each independently selected from arylene or heteroarylene that has from 5 to 20 ring atoms, is mono- or polycyclic, optionally contains fused rings, are is unsubstituted or substituted by one or more identical or different groups L or $R^1$, wherein $R^1$ is H, F, Cl, CN, or straight-chain, branched or cyclic alkyl with 1 to 30, preferably 1 to 20, C atoms, in which one or more $CH_2$ groups are each optionally replaced by —O—, —S—, —C(=O)—, —C(=S)—, —C(=O)—O—, —O—C(=O)—, —$NR^0$—, —$SiR^0R^{00}$—, —$CF_2$—, —$CR^0$=$CR^{00}$—, —$CY^1$=$CY^2$— or —C≡C— in such a manner that O and/or S atoms are not linked directly to one another, and in which one or more H atoms are each optionally replaced by F, Cl, Br, I or CN, or aryl, heteroaryl, arylalkyl, heteroarylalkyl, aryloxy or heteroaryloxy, wherein each of the aforementioned cyclic groups has 5 to 20 ring atoms, is mono- or polycyclic, optionally contains fused rings, and is unsubstituted or substituted by one or more identical or different groups L, L is F, Cl, —$NO_2$, —CN, —NC, —NCO, —NCS, —OCN, —SCN, $R^0$, $OR^0$, $SR^0$, —C(=O)$X^0$, —C(=O)$R^0$, —C(=O)—$OR^0$, —O—C(=O)—$R^0$, —$NH_2$, —$NHR^0$, —$NR^0R^{00}$, —C(=O)$NHR^0$, —C(=O)$NR^0R^{00}$, —$SO_3R^0$, —$SO_2R^0$, —OH, —$CF_3$, —$SF_5$, or optionally substituted silyl, or carbyl or hydrocarbyl with 1 to 30, preferably 1 to 20 C atoms that is optionally substituted and optionally comprises one or more hetero atoms, preferably F, —CN, $R^0$, —$OR^0$, —$SR^0$, —C(=O)—$R^0$, —C(=O)—$OR^0$, —O—C(=O)—$R^0$, —O—C(=O)—$OR^0$, —C(=O)—$NHR^0$, or —C(=O)—$NR^0R^{00}$, $R^0$, $R^{00}$ denote H or straight-chain or branched alkyl with 1 to 20, preferably 1 to 12, C atoms that is optionally fluorinated, $X^0$ is halogen, preferably F or C.

In a preferred embodiment the conjugated polymer comprises one or more units D selected from the group consisting of the formulae D1-D151 and their mirror images

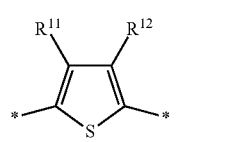
(D1)

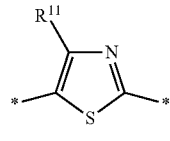
(D2)

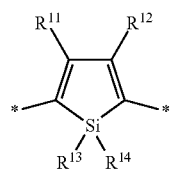
(D3)

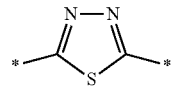
(D4)

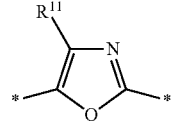
(D5)

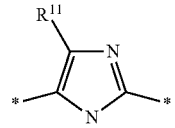
(D6)

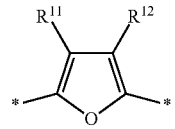
(D7)

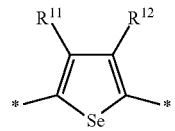
(D8)

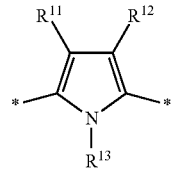
(D9)

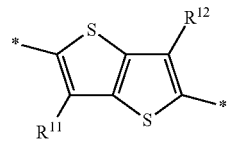
(D10)

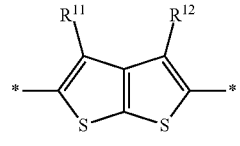
(D11)

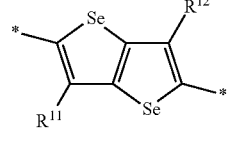
(D12)

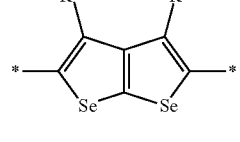
(D13)

(D14)

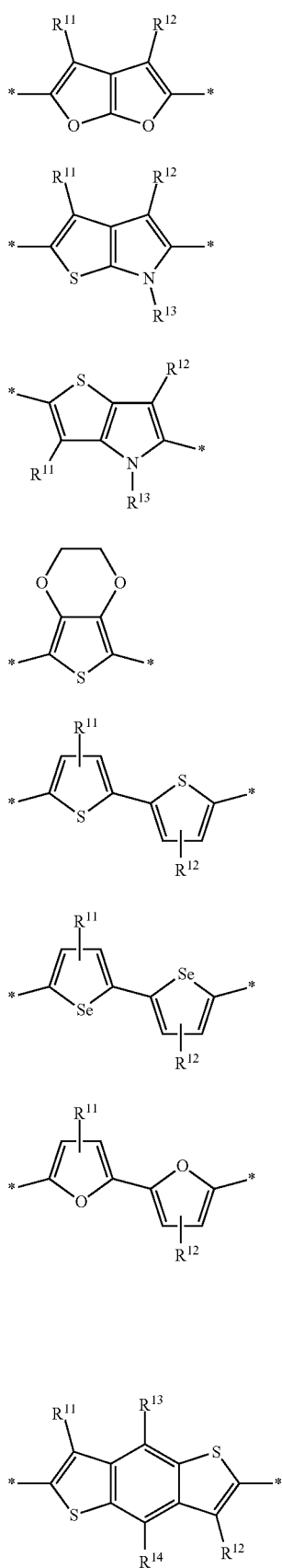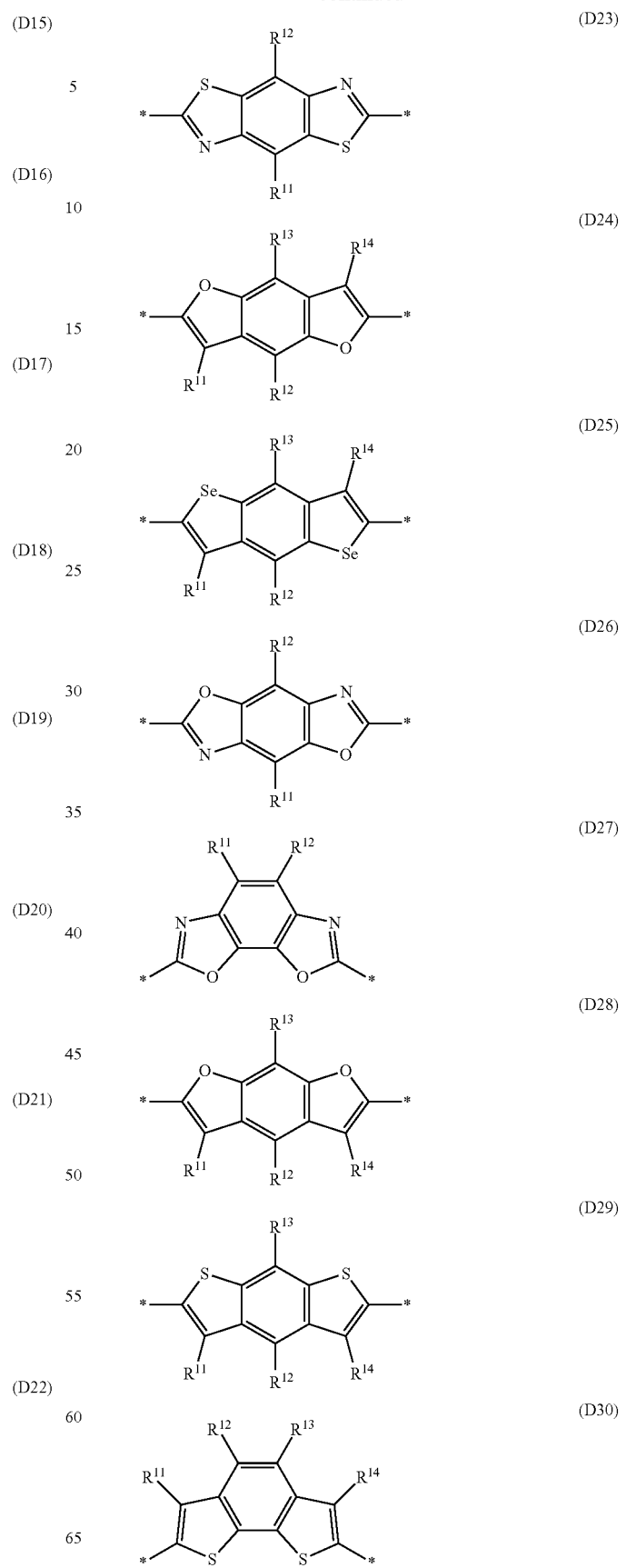

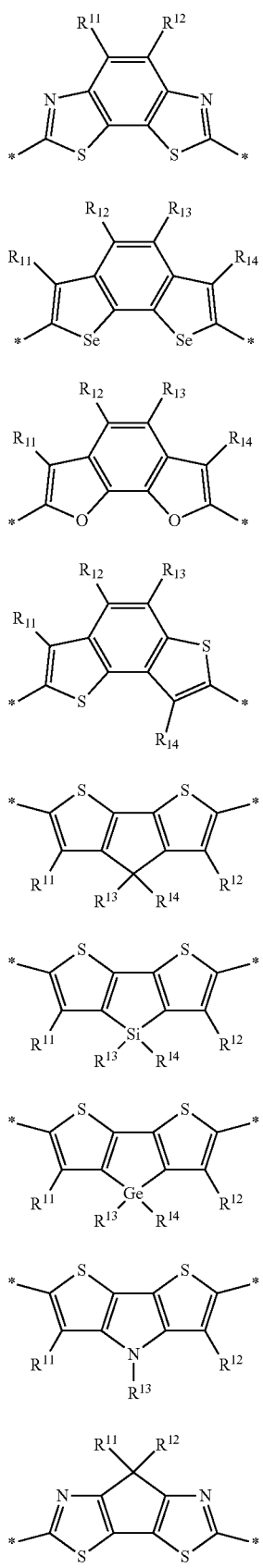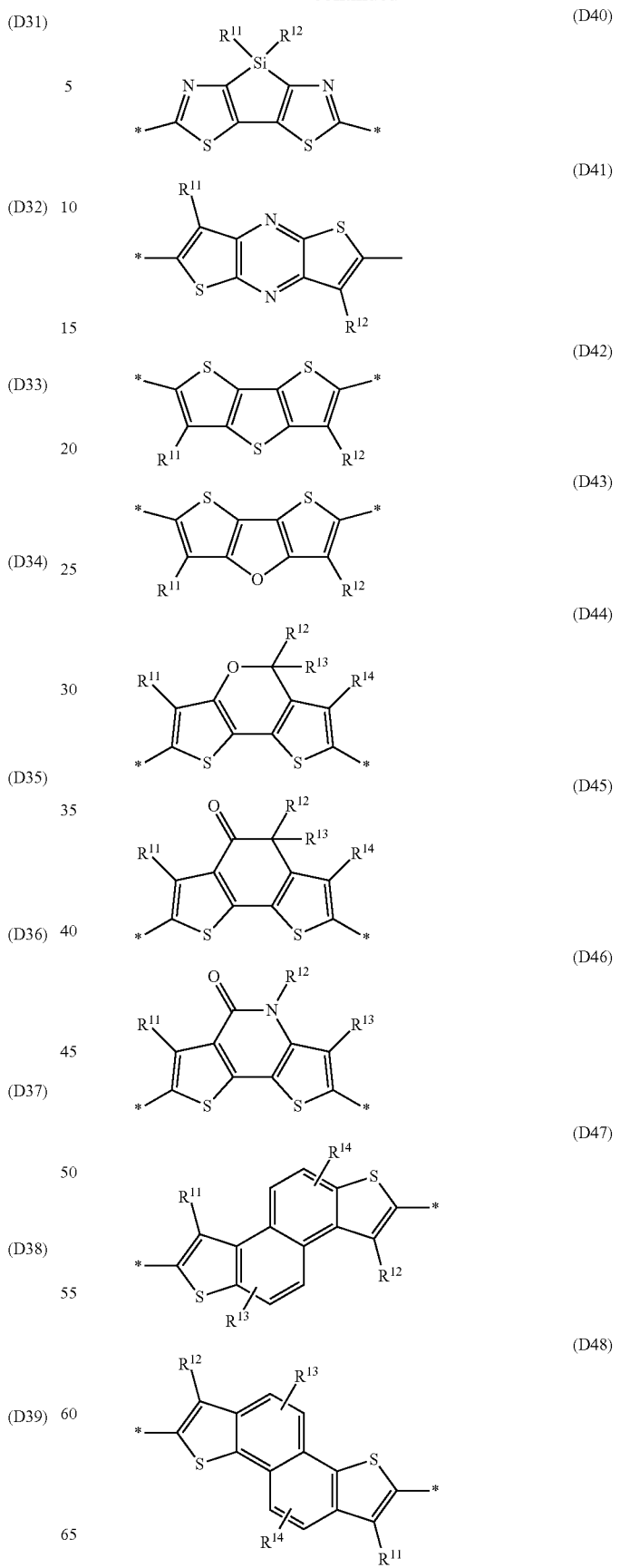

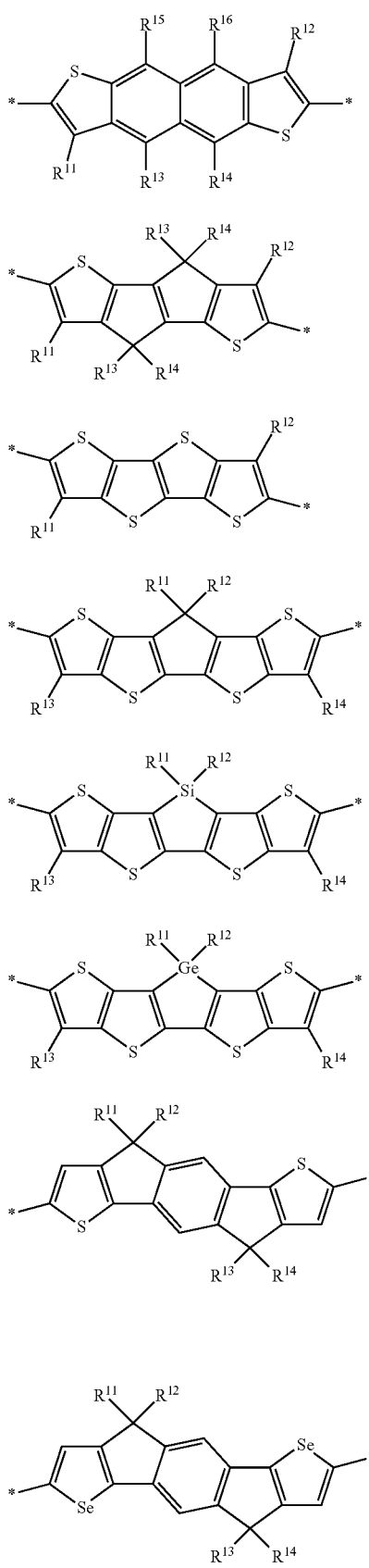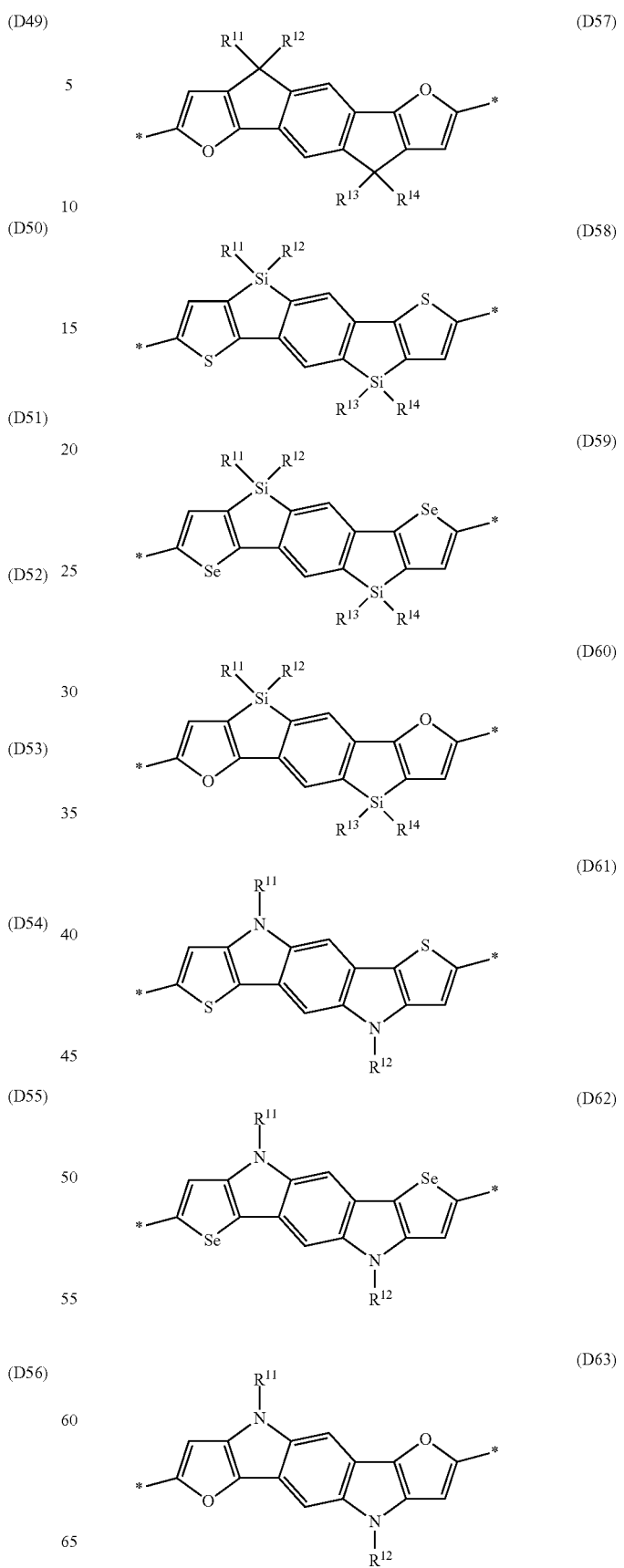

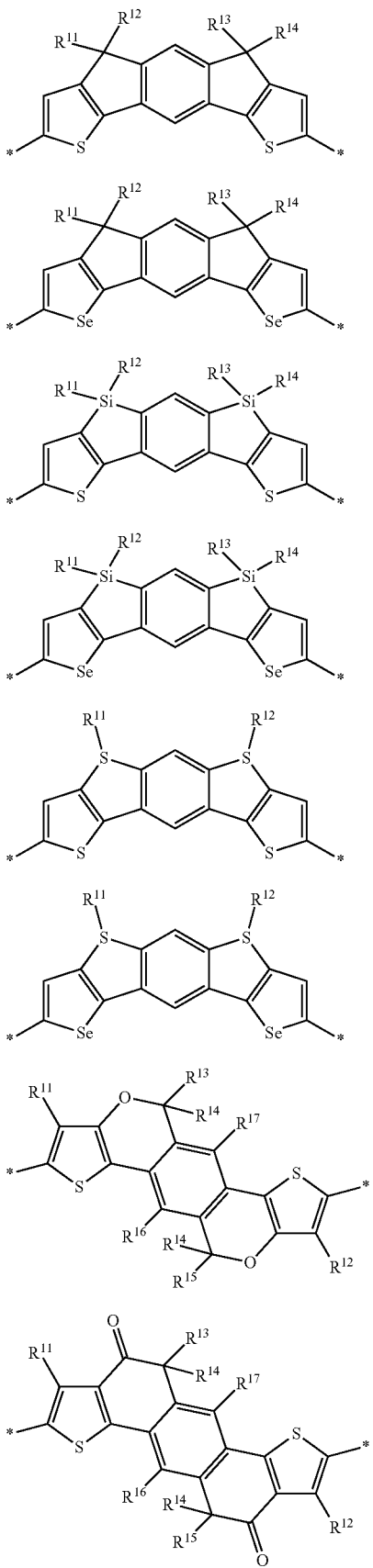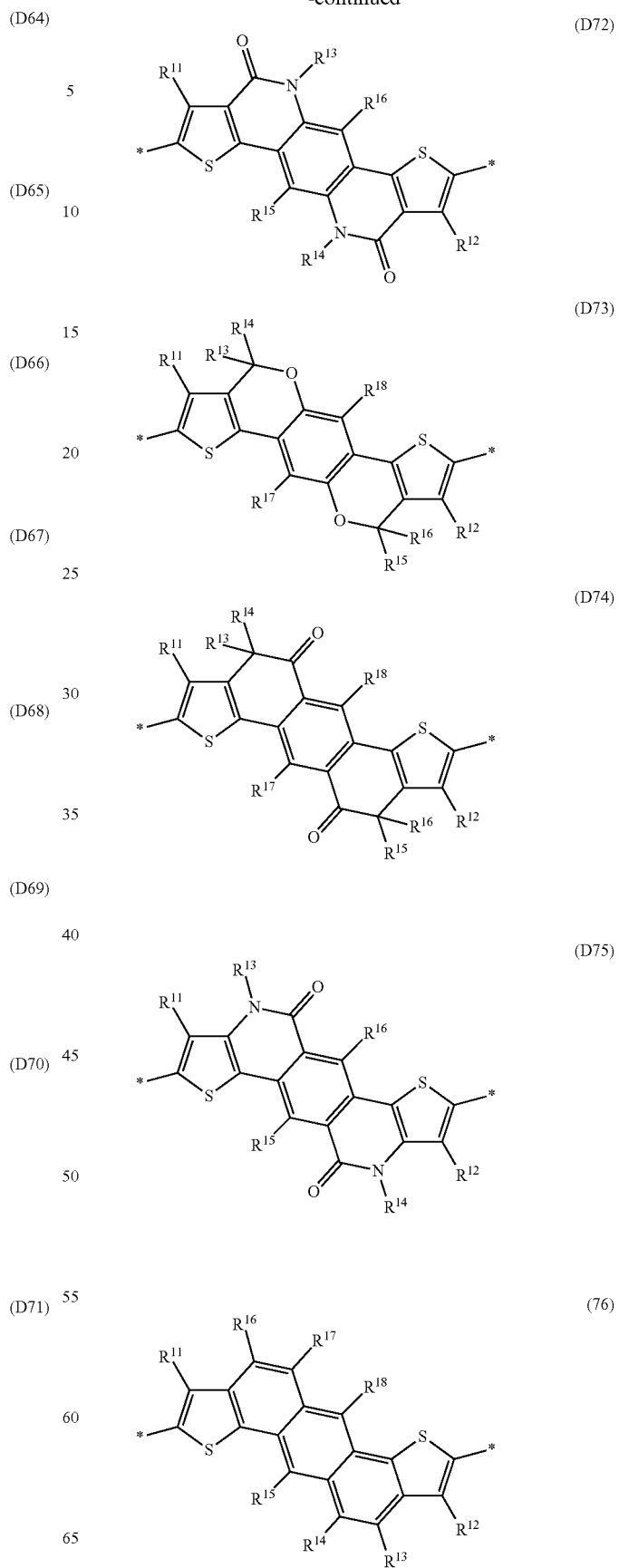

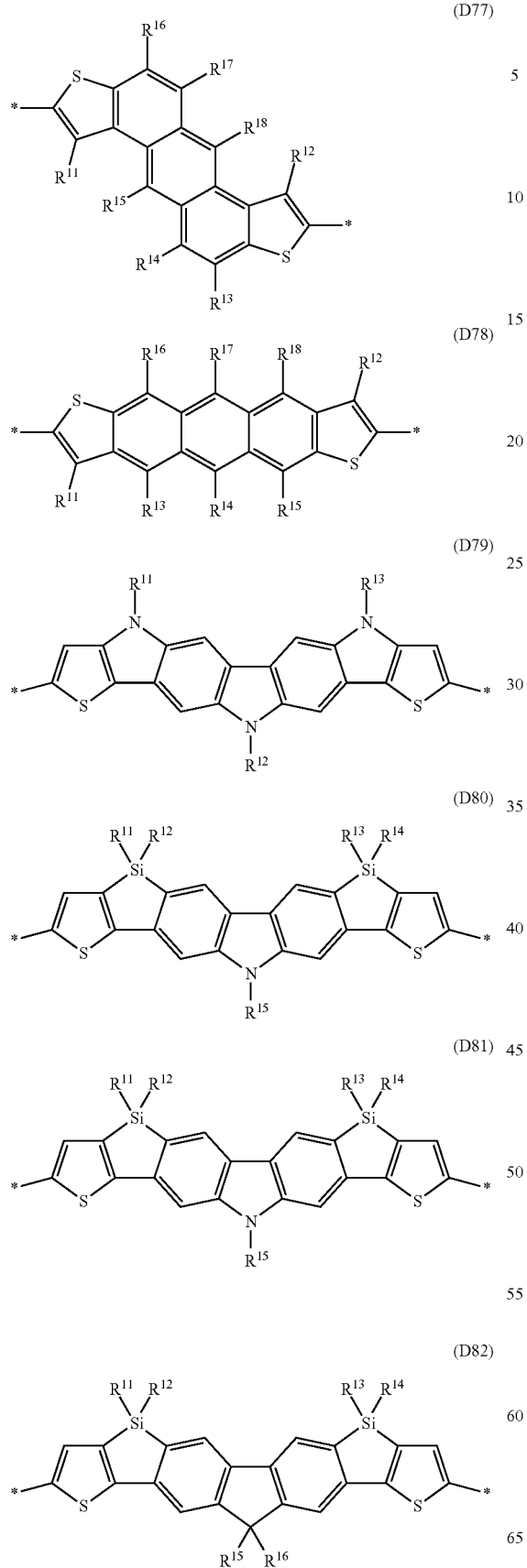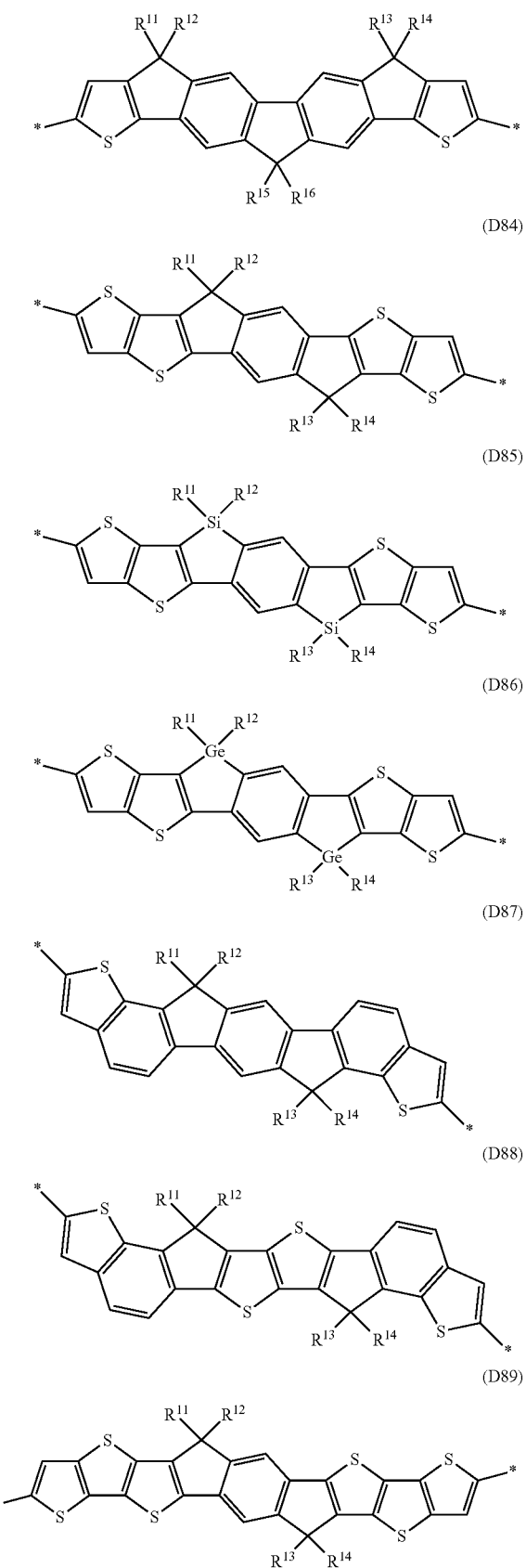

(D90) 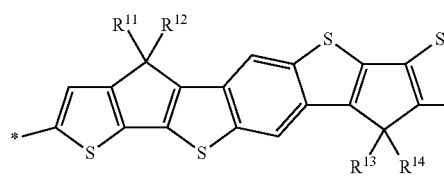
(D91) 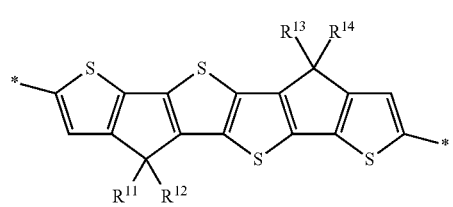
(D92) 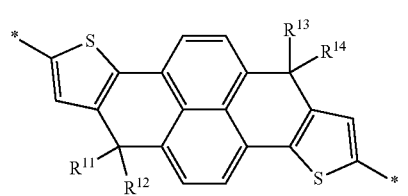
(D93) 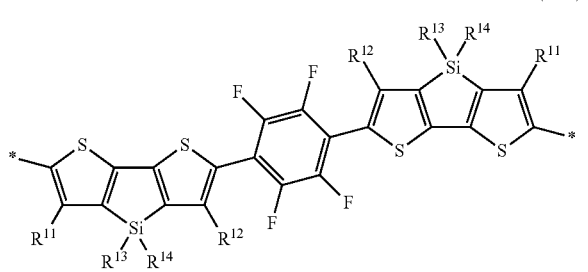
(D94) 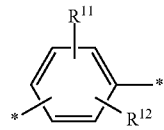
(D95) 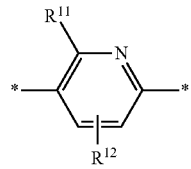
(D96) 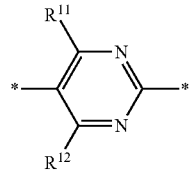
(D97) 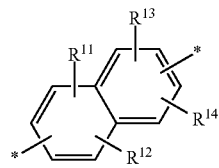
(D98) 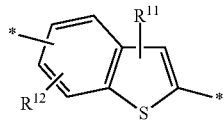
(D99) 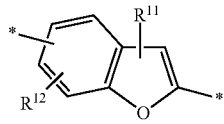
(D100) 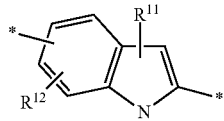
(D101) 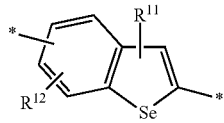
(D102) 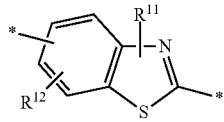
(D103) 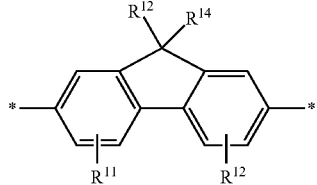
(D104) 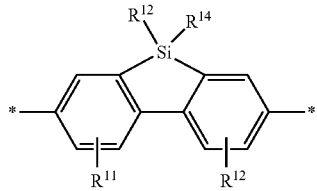
(D105) 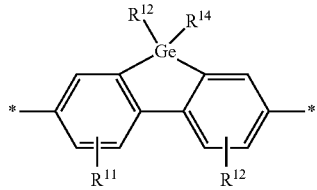
(D106) 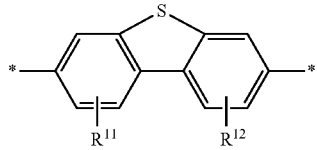

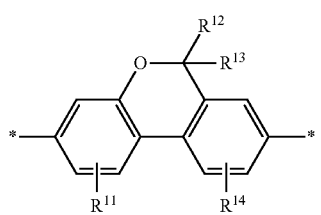
(D107)
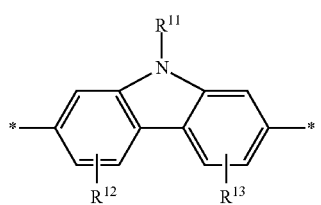
(D108)
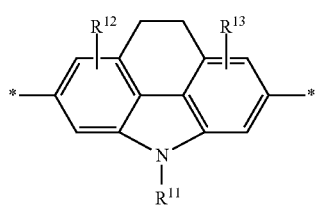
(D109)
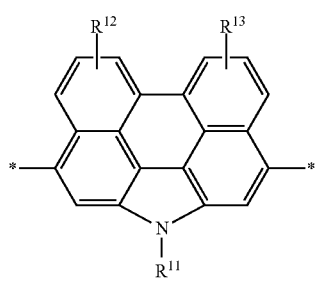
(D110)
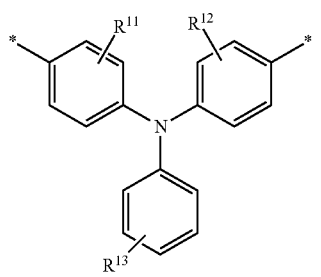
(D111)
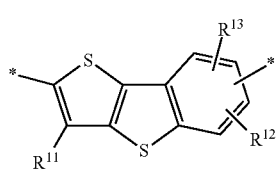
(D112)
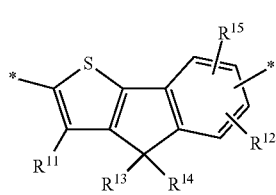
(D113)
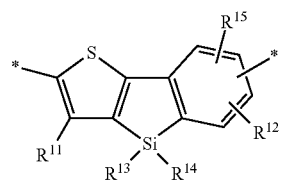
(D114)
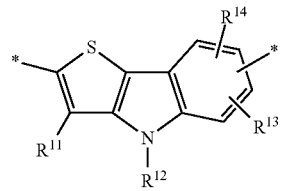
(D115)
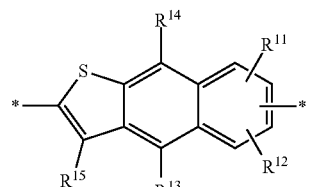
(D116)
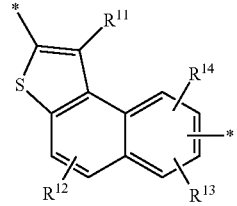
(D117)
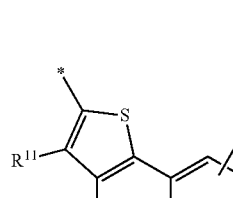
(D118)
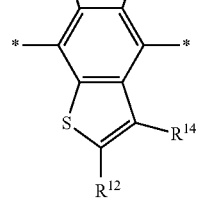
(D119)

(D120) 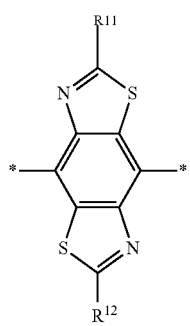
(D121) 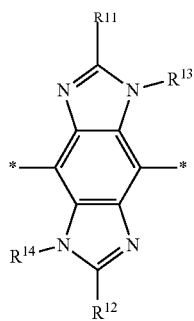
(D122) 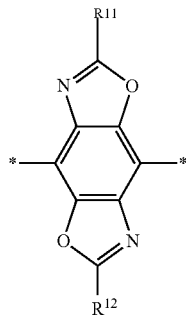
(D123) 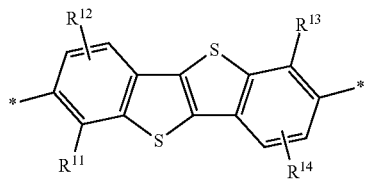
(D124) 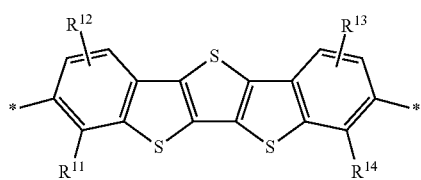
(D125) 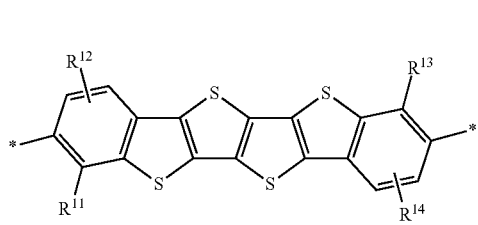
(D126) 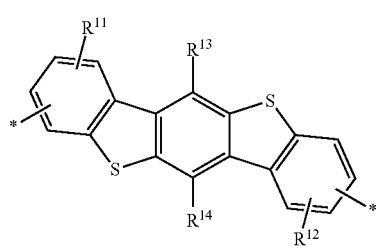
(D127) 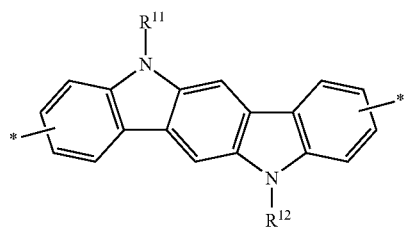
(D128) 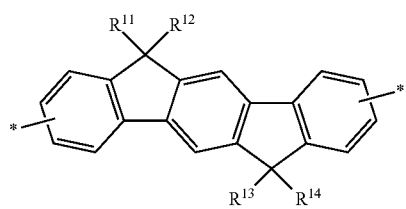
(D129) 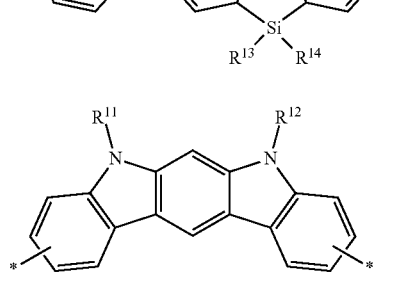
(D130) 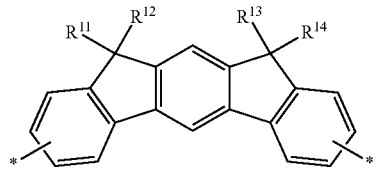
(D131) 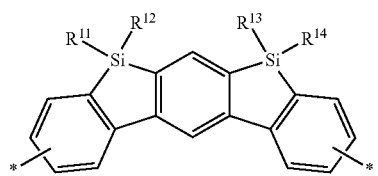
(D132)

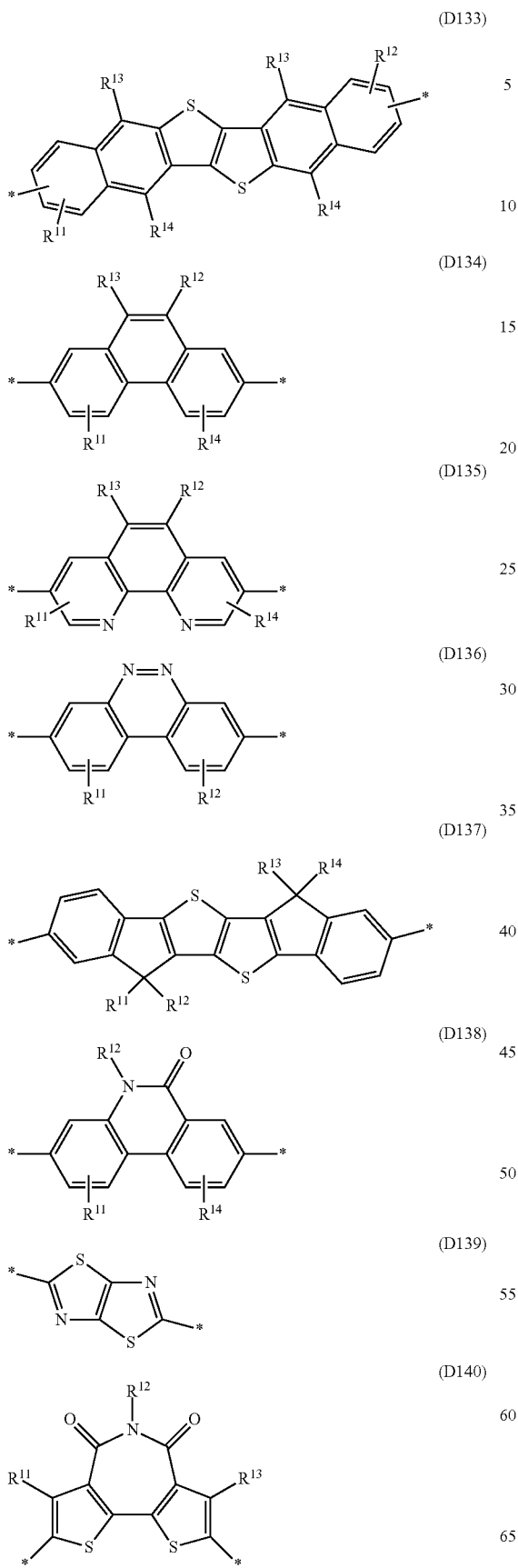
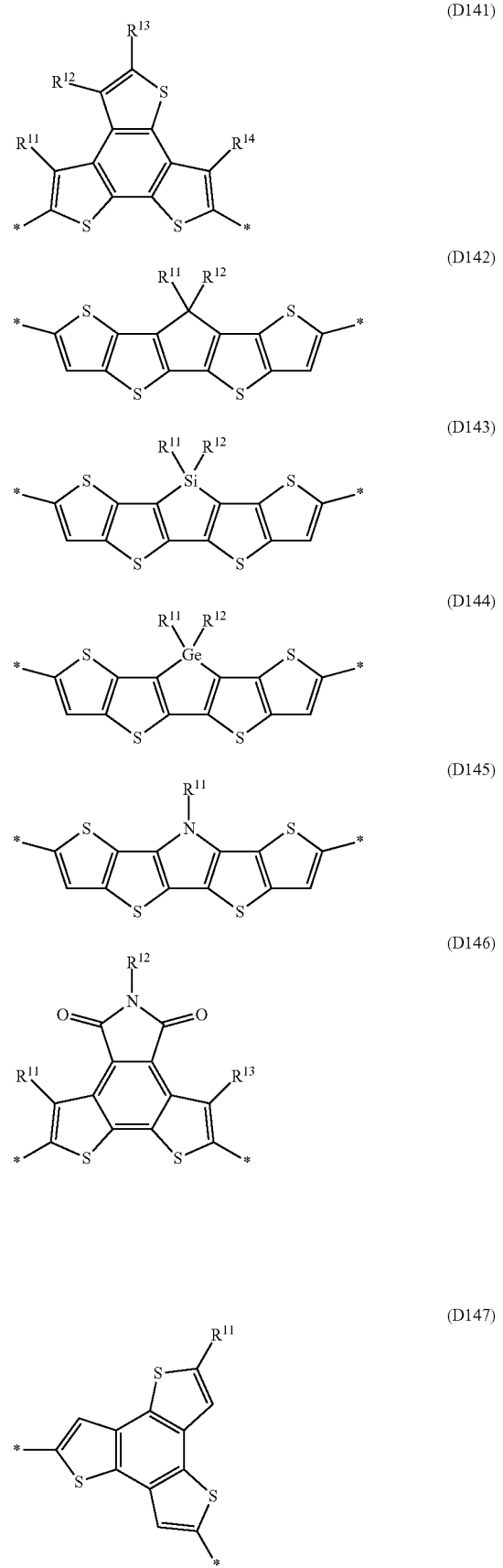

(D148)
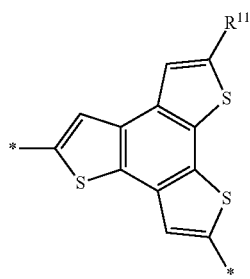

(D149)
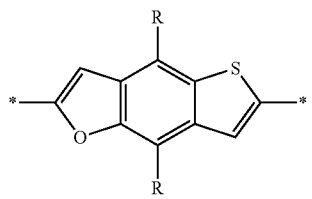

(D150)
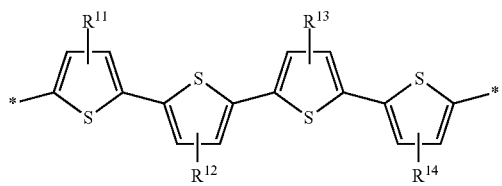

(D151)
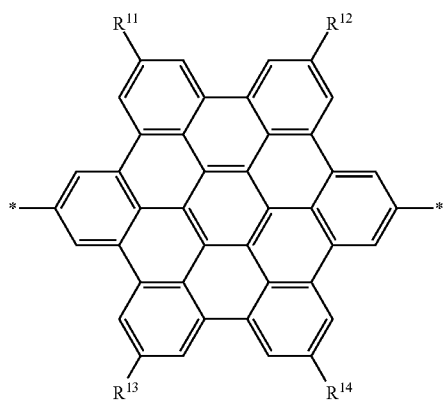

wherein $R^{11}$, $R^{12}$, $R^{13}$, $R^{14}$, $R^{15}$, $R^{16}$, $R^{17}$ and $R^{18}$ independently of each other have one of the meanings of $R^1$, and wherein preferably at least one of $R^{11-18}$ is different from H and in formula D150 preferably $R^{12}$ and $R^{13}$ are F and $R^{11}$ and $R^{14}$ are H or $C_1$-$C_{30}$ alkyl.

Preferred units D are selected from formulae D1, D7, D10, D11, D19, D22, D29, D30, D35, D36, D37, D44, D55, D84, D87, D88, D89, D93, D94, D106, D111, D139, D140, D141, D146 or D150 wherein preferably at least one of $R^{11-18}$ is different from H.

In another preferred embodiment the conjugated polymer comprises one or more units A selected from the group consisting of the formulae A1-A103 and their mirror images (A1)
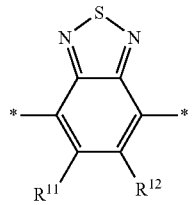

(A2)
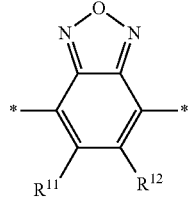

(A3)
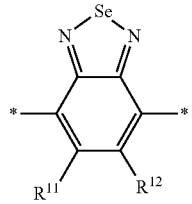

(A4)
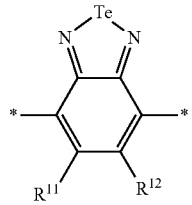

(A5)
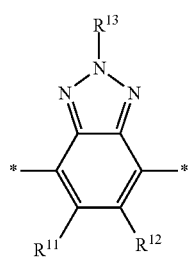

(A6)
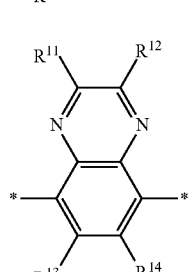

(A7)
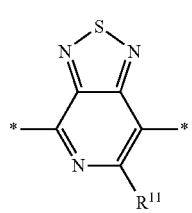

-continued
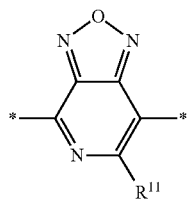 (A8)
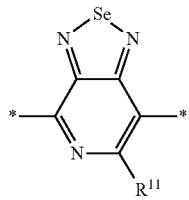 (A9)
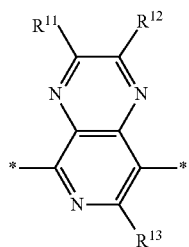 (A10)
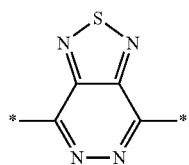 (A11)
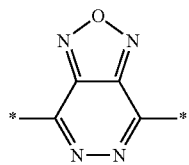 (A12)
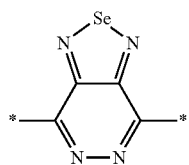 (A13)
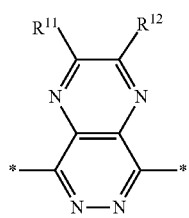 (A14)
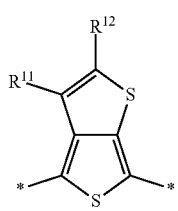 (A15)
-continued
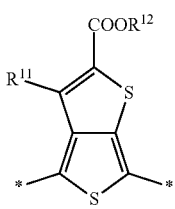 (A16)
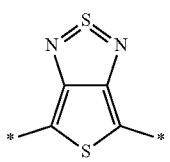 (A17)
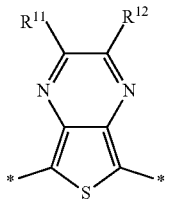 (A18)
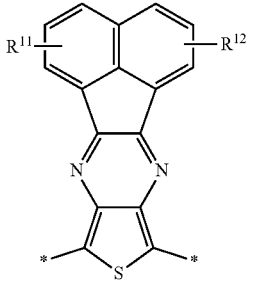 (A19)
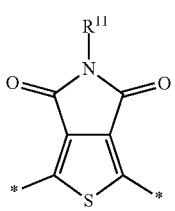 (A20)
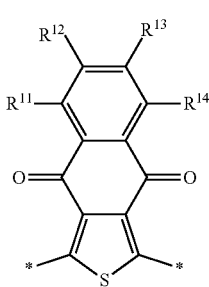 (A21)

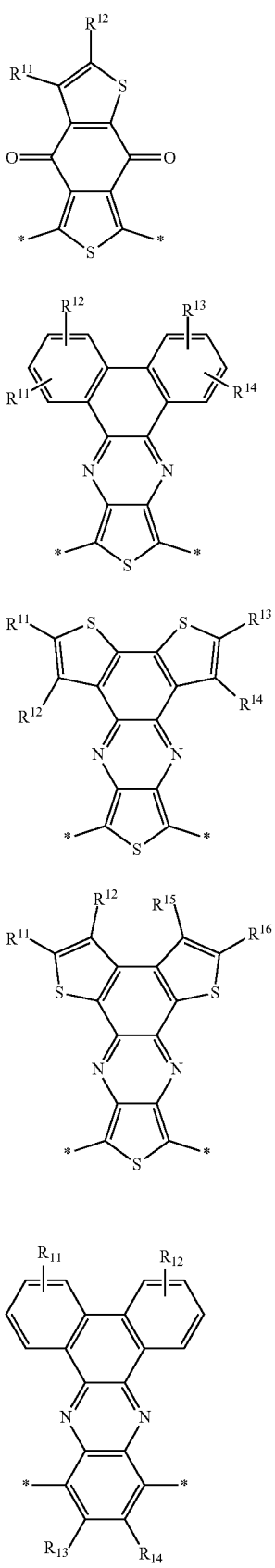
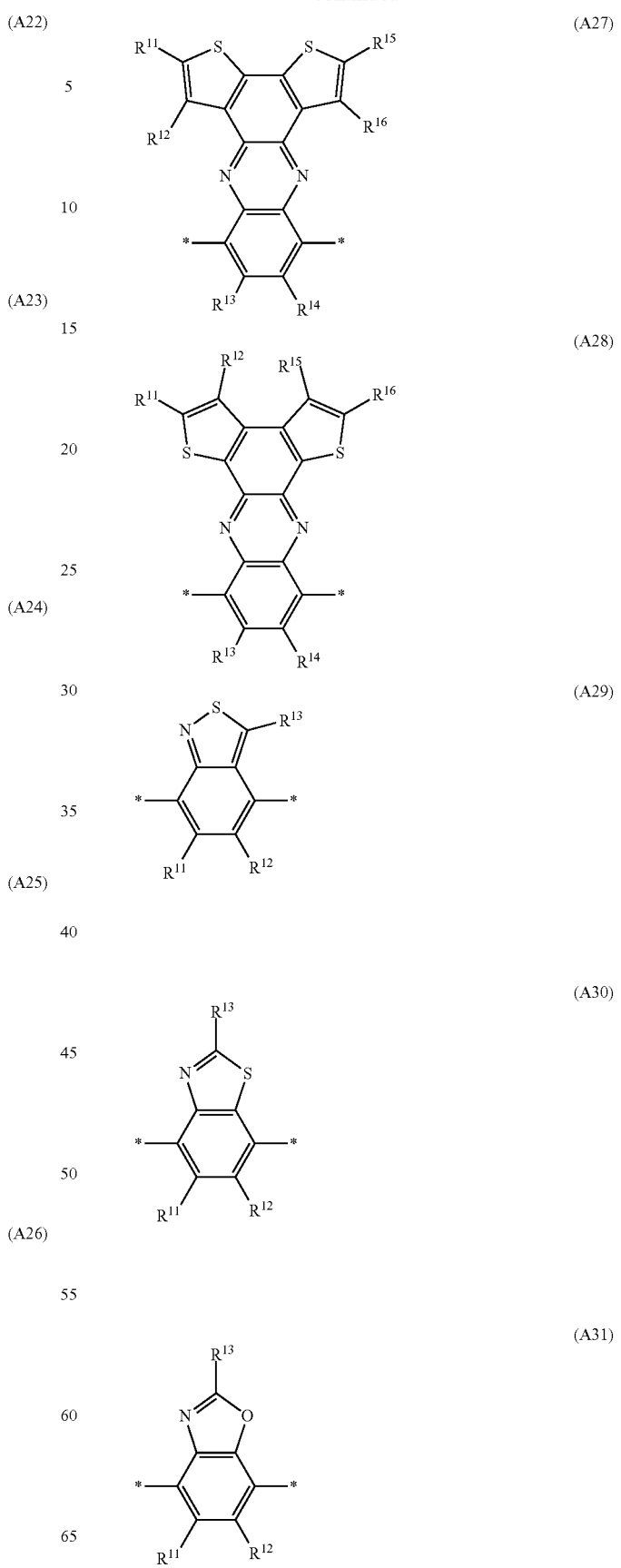

-continued
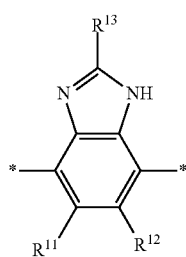 (A32)
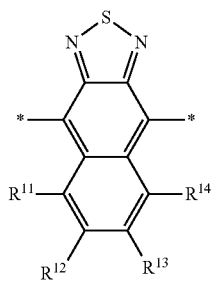 (A33)
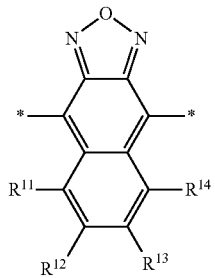 (A34)
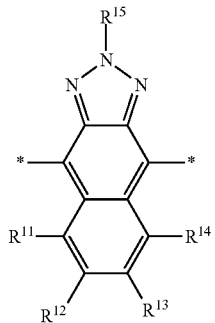 (A35)
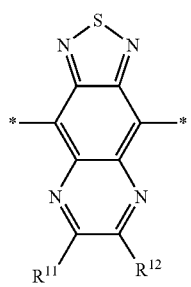 (A36)
-continued
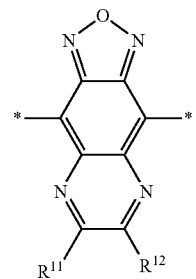 (A37)
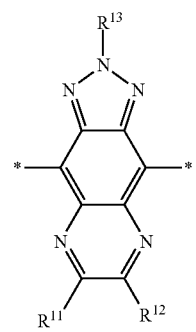 (A38)
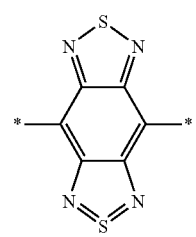 (A39)
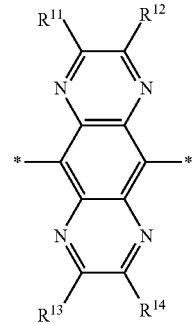 (A40)
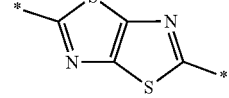 (A41)
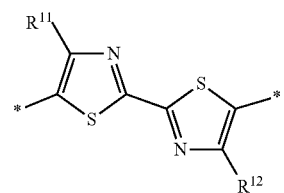 (A42)
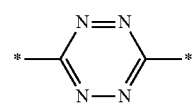 (A43)

-continued
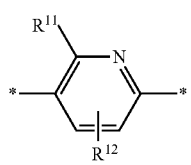
(A44)
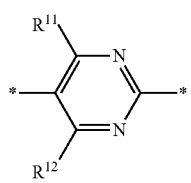
(A45)
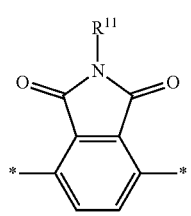
(A46)
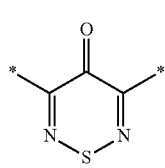
(A47)
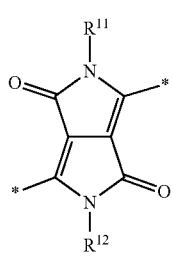
(A48)
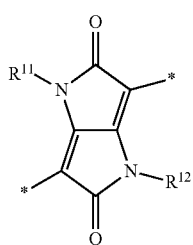
(A49)
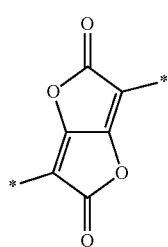
(A50)
-continued
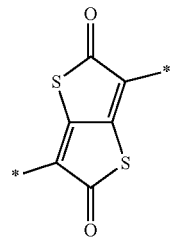
(A51)
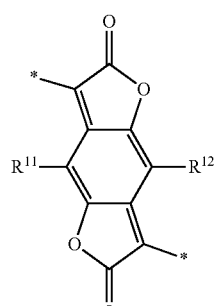
(A52)
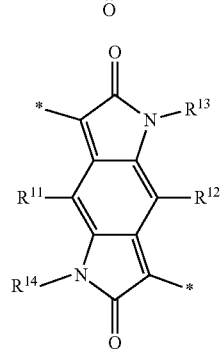
(A53)
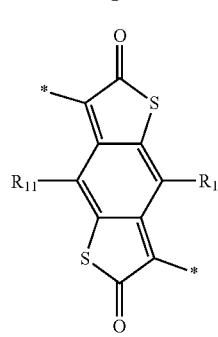
(A54)
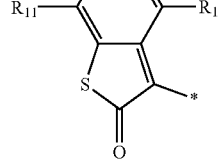
(A55)
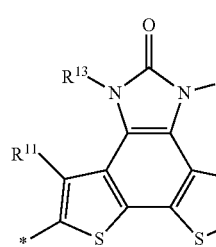
(A56)

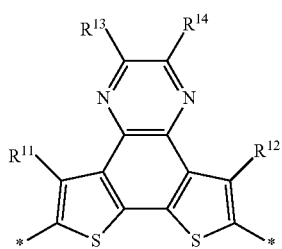 (A57)
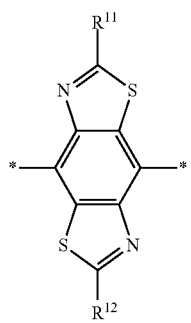 (A58)
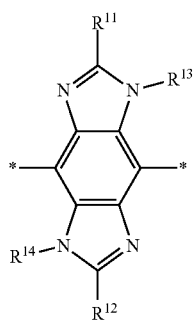 (A59)
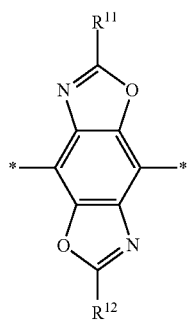 (A60)
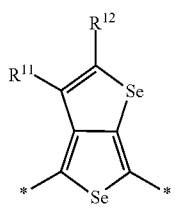 (A61)
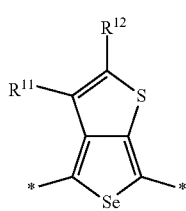 (A62)
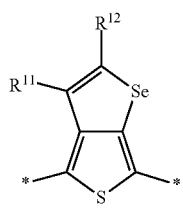 (A63)
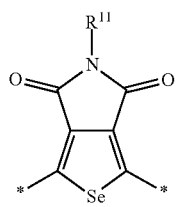 (A64)
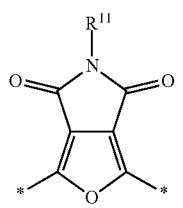 (A65)
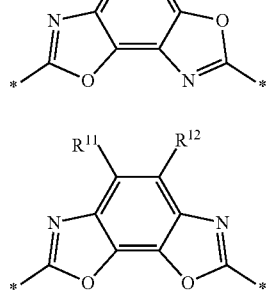 (A66)
(A67)
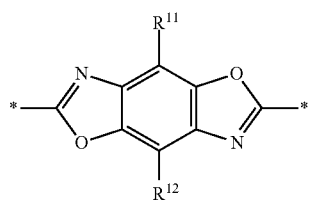 (A68)
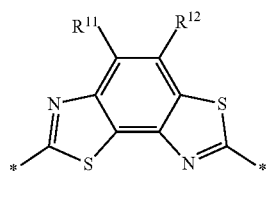 (A69)
(A70)

-continued
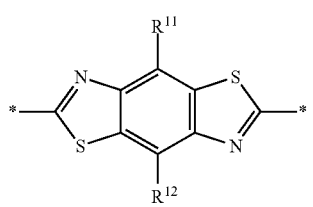
(A71)
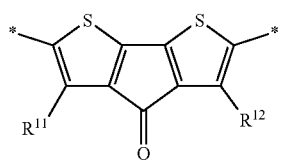
(A72)
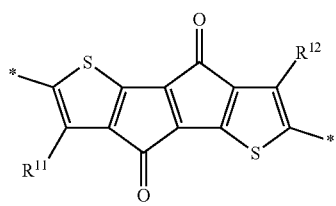
(A73)
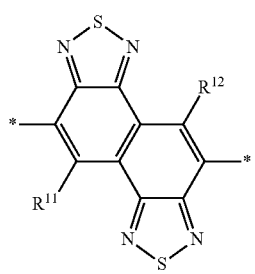
(A74)
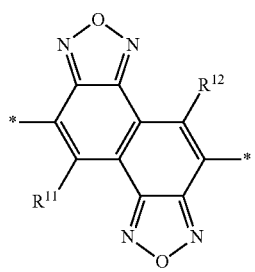
(A75)
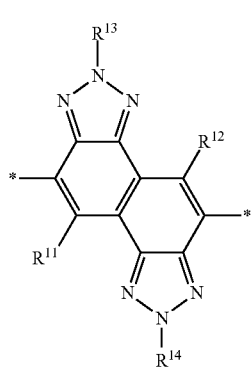
(A76)
-continued
(A77)
(A78)
(A79)
(A80)
(A81)
(A82)

-continued
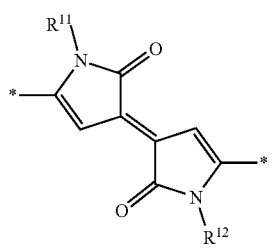
(A83)
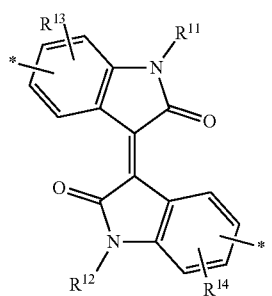
(A84)
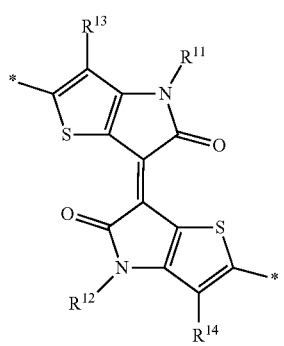
(A85)
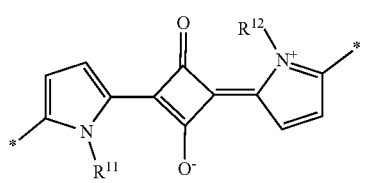
(A86)
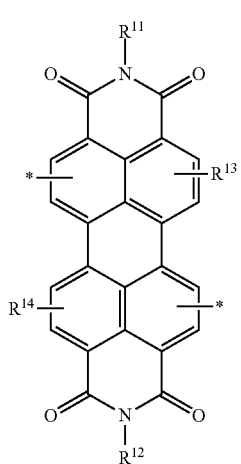
(A87)
-continued
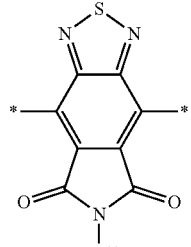
(A88)
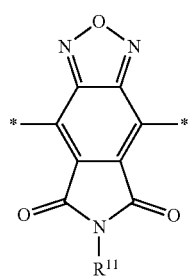
(A89)
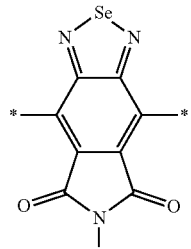
(A90)
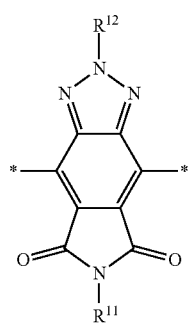
(A91)
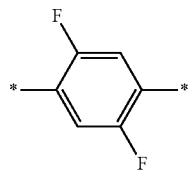
(A92)
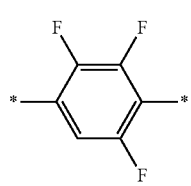
(A93)

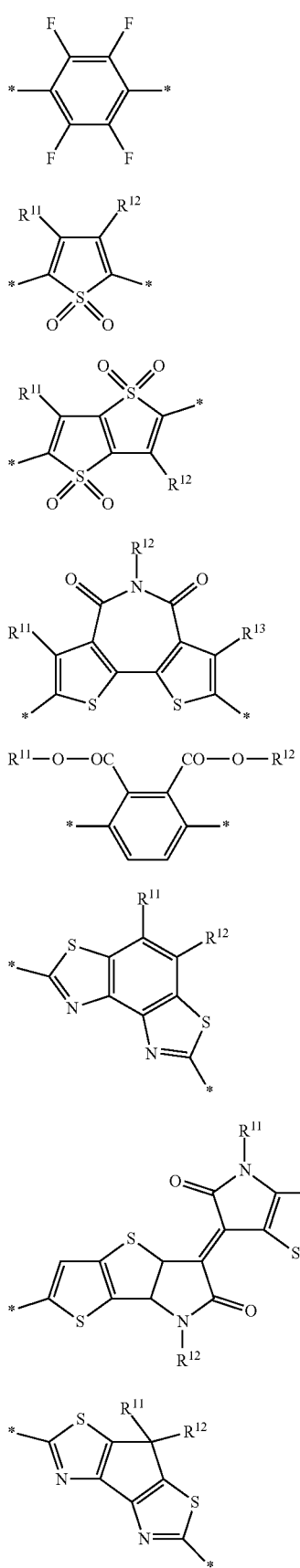

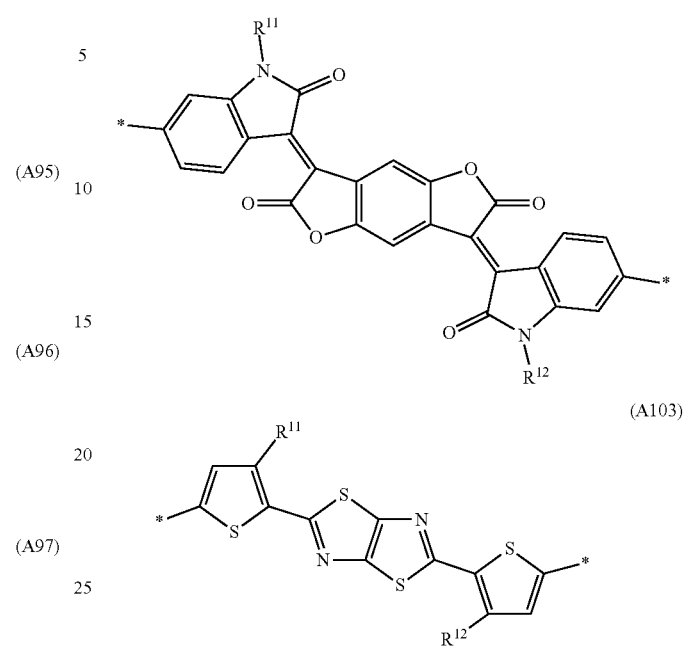

wherein $R^{11}$, $R^{12}$, $R^{13}$, $R^{14}$, $R^{15}$ and $R^{16}$ independently of each other have one of the meanings of $R^1$.

Preferred units A are selected from formulae A1, A6, A7, A15, A16, A20, A36, A49, A74, A78, A84, A88, A92, A94, A98, A100 and A103 wherein preferably at least one of $R^{11-16}$ is different from H.

In a further preferred embodiment, the n-type polymer comprises one or more units Sp which are selected from the group consisting of the formulae Sp1-Sp18 and their mirror images

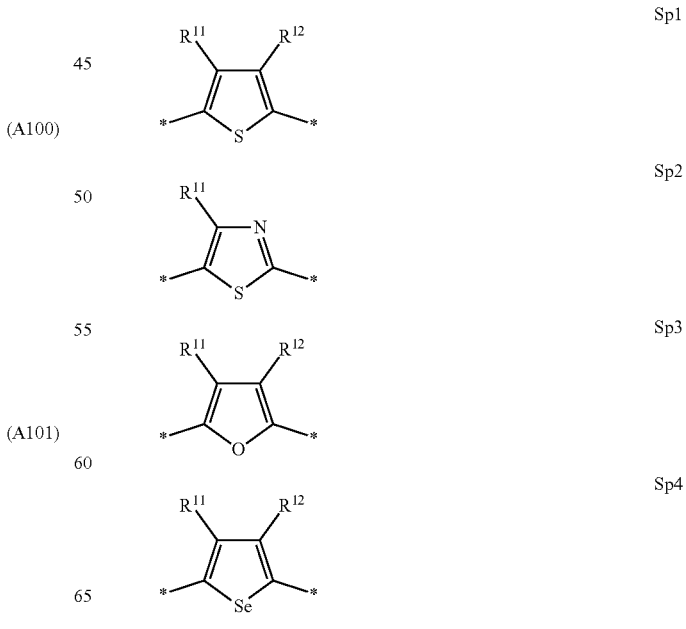

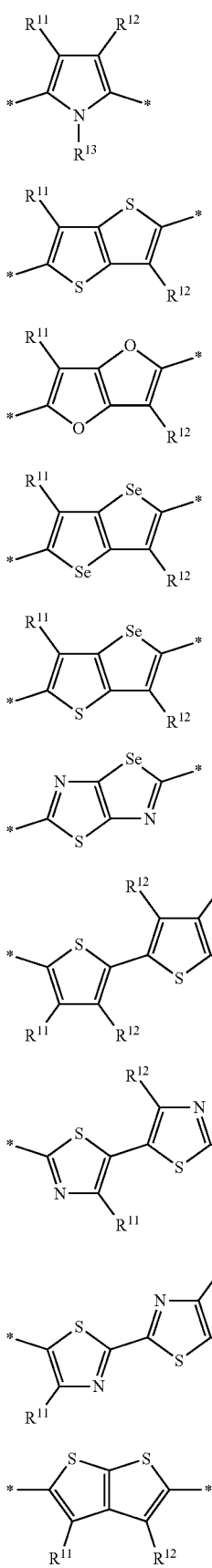

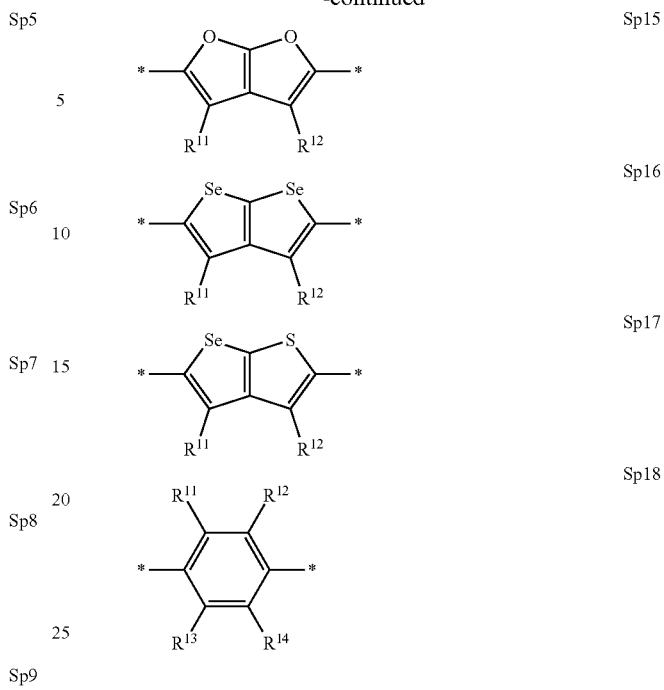

wherein $R^{11}$, $R^{12}$, $R^{13}$, $R^{14}$ independently of each other have one of the meanings of $R^1$.

In the formulae Sp1 to Sp17 preferably $R^{11}$ and $R^{12}$ are H. In formula Sp18 preferably $R^{11-14}$ are H or F.

Very preferred units Sp are selected from formulae Sp1, Sp2, Sp6, Sp10, Sp11, Sp12, Sp13 and Sp14, wherein preferably one of $R^{11}$ and $R^{12}$ is H or both $R^{11}$ and $R^{12}$ are H.

In another preferred embodiment, the conjugated polymer further comprises one or more units selected from —$CY^1$=$CY^2$— and —C≡C—, wherein $Y^1$ and $Y^2$ are independently of each other H, F, Cl or CN.

Preferred conjugated polymers comprise, very preferably consist of, one or more units selected from the following formulae

| | |
|---|---|
| -(D-Sp)- | U1 |
| -(A-Sp)- | U2 |
| -(Sp-D-Sp)- | U3 |
| -(Sp-A-Sp)- | U4 |
| -(A-D)- | U5 |
| -(D)- | U6 |
| -(Sp-D-Sp-D)- | U7 |
| -(A)- | U8 |
| -(Sp-A-Sp-A)- | U9 | wherein A, D and Sp are as defined above.

Very preferred conjugated polymers are selected of formula Pi-Pviii

| | |
|---|---|
| -[(D-Sp)$_x$-(A-Sp)$_y$]$_n$- | Pi |
| -[(A-D)$_x$-(A-Sp)$_y$]$_n$- | Pii |
| -[(D)$_x$-(Sp-A-Sp)$_y$]$_n$- | Piii |

-[D-Sp-A-Sp]$_n$-  Piv

-[D-A]$_n$-  Pv

-[D-Sp-A-Sp]$_n$  Pvi

-[D$^1$-A-D$^2$-A]$_n$  Pvii

-[D-A$^1$-D-A$^2$]$_n$  Pviii wherein A, D and Sp are as defined above, A and D can each, in case of multiple occurrence, also have different meanings, D$^1$ and D$^2$ have one of the meanings given for D and are different from each other, A$^1$ and A$^2$ have one of the meanings given for A and are different from each other, x and y denote the molar fractions of the corresponding units, x and y are each,
independently of one another, a non-integer>0 and <1, with x+y=1, and n is an integer>1.

Further preferred are conjugated polymers, repeating units of formula U1-U9 contained therein and polymers of formulae Pi-Pviii wherein a) the donor units D are selected from the group consisting of the formulae D1-D151, very preferably of the formulae D1, D7, D10, D11, D19, D22, D29, D30, D35, D36, D37, D44, D55, D84, D87, D88, D89, D93, D94, D106, D111, D139, D140, D141, D146 and D150, b) the acceptor units A are selected from the group consisting of the formulae A1-A103, very preferably of the formulae A1, A6, A7, A15, A16, A20, A36, A49, A74, A78, A84, A88, A92, A94, A98, A102 and A103,
and c) the spacer units Sp are selected from the group consisting of the formulae Sp1-Sp18, very preferably of the formulae Sp1, Sp2, Sp6, Sp10, Sp11, Sp12, Sp13 and Sp14.

Very preferred conjugated polymers are selected from the following formulae

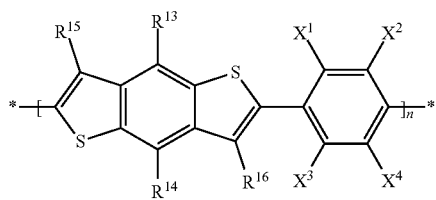
P5
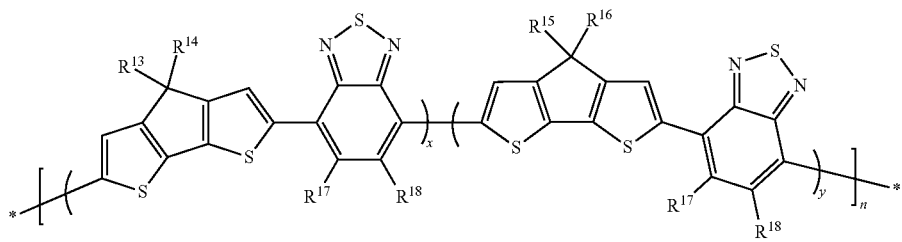
P6
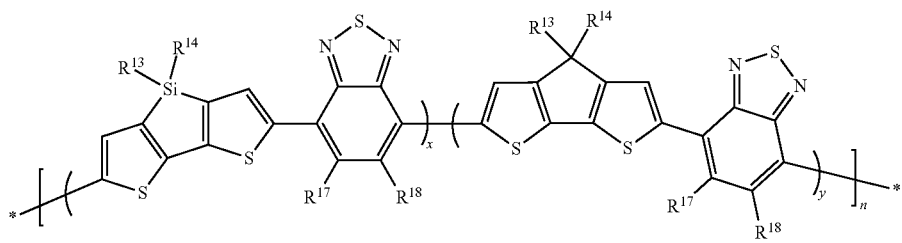
P7
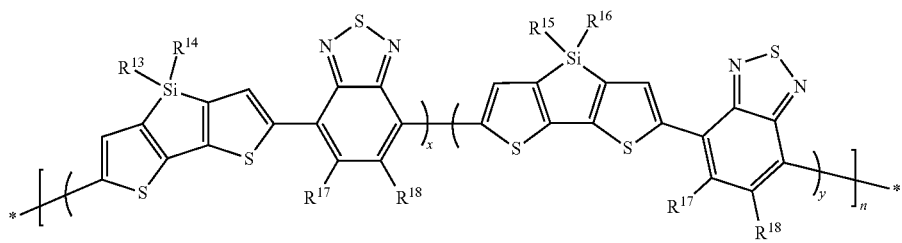
P8
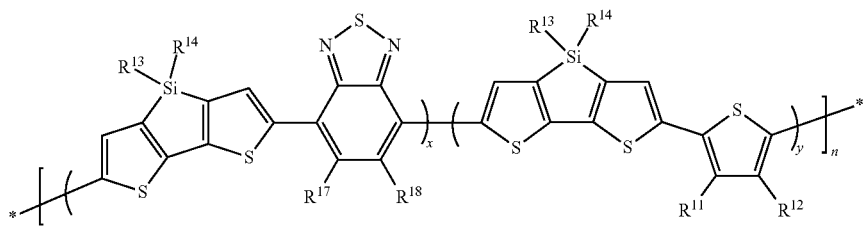
P9
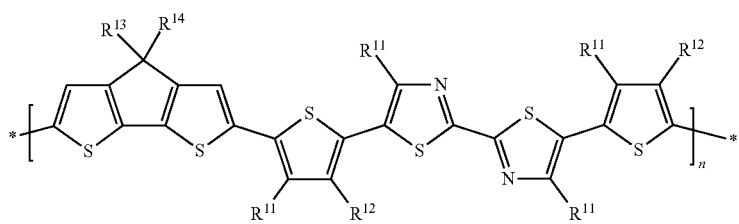
P10
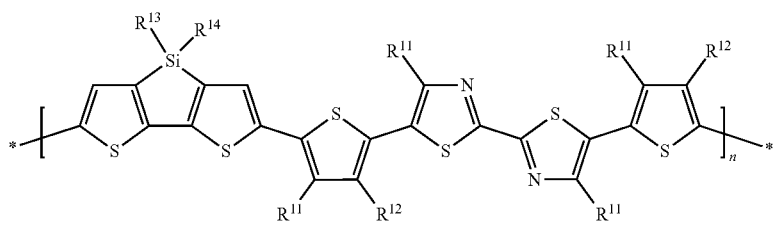
P11

-continued
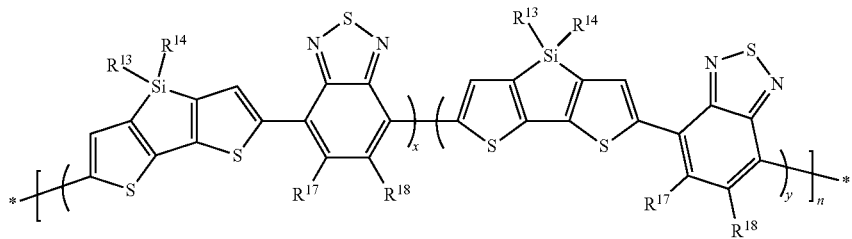
P12
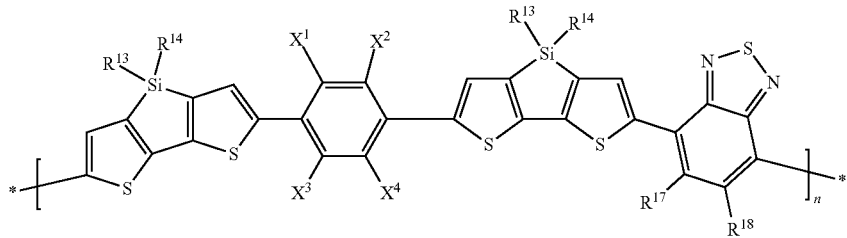
P13
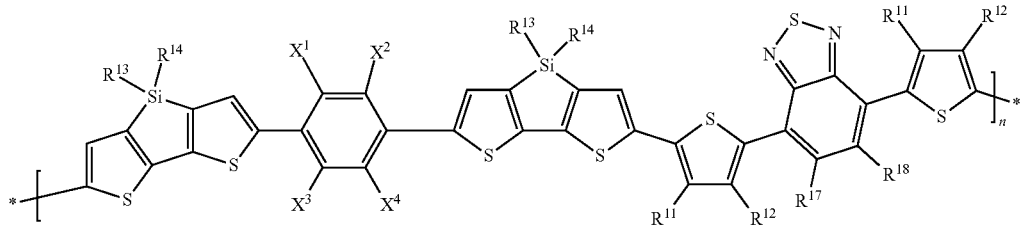
P14
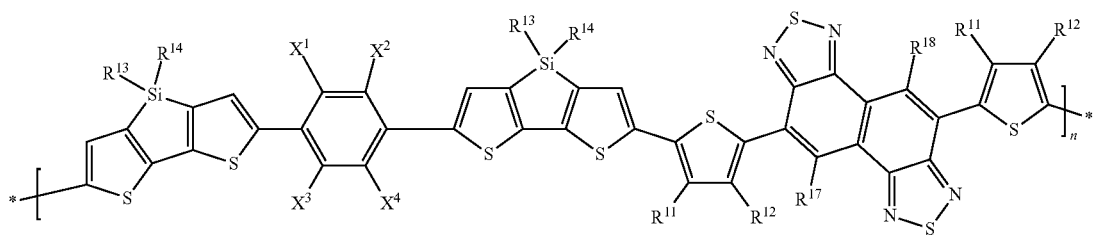
P15
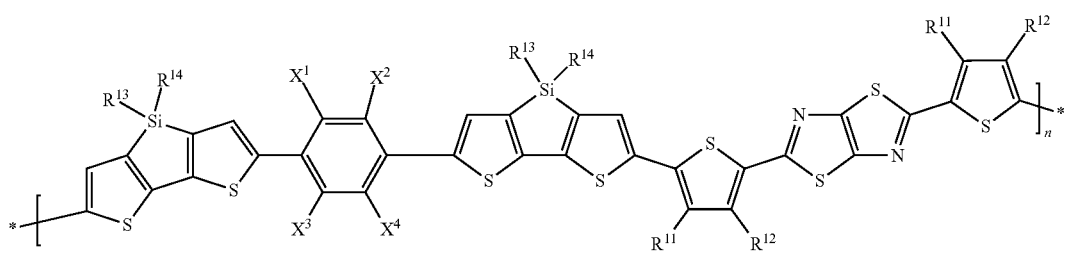
P16
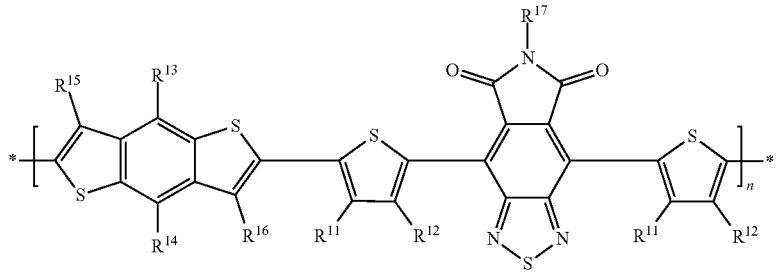
P17

-continued
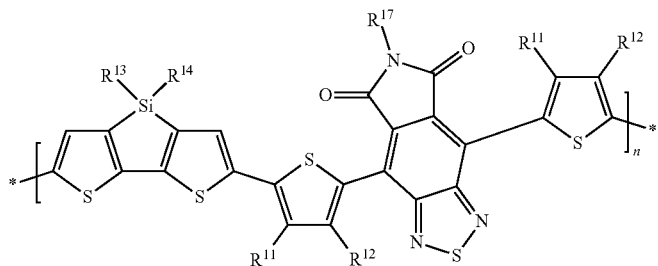
P18
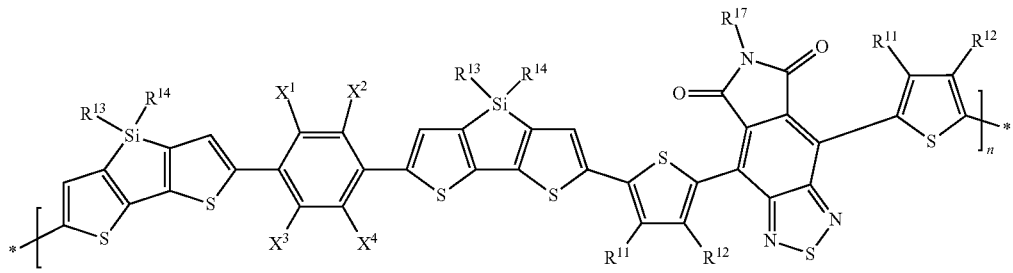
P19
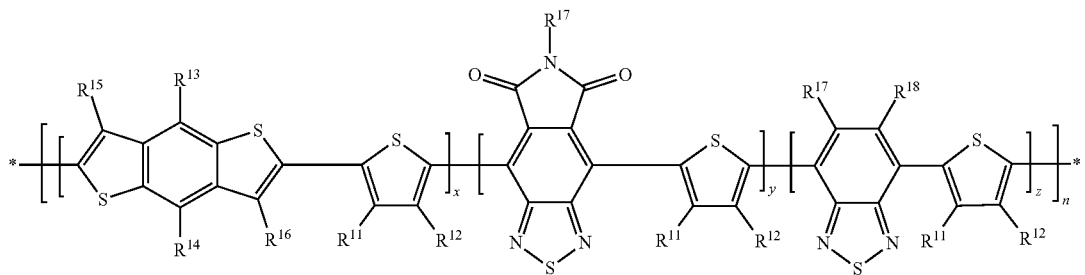
P20
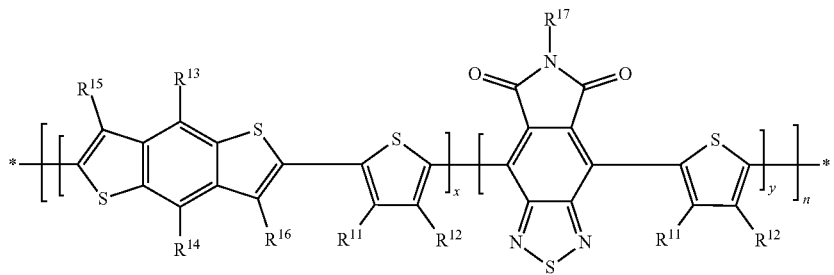
P21
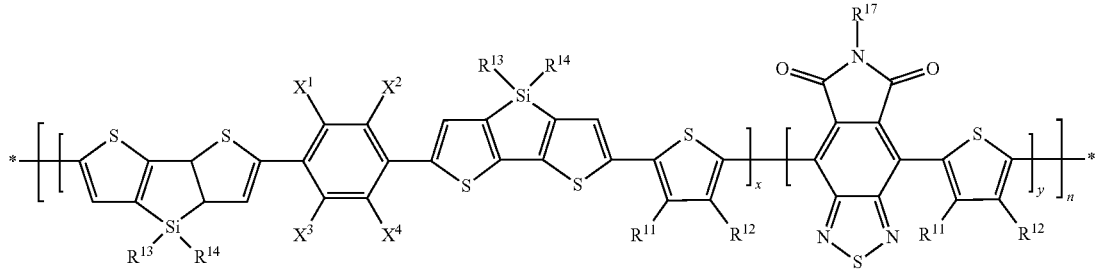
P22

-continued
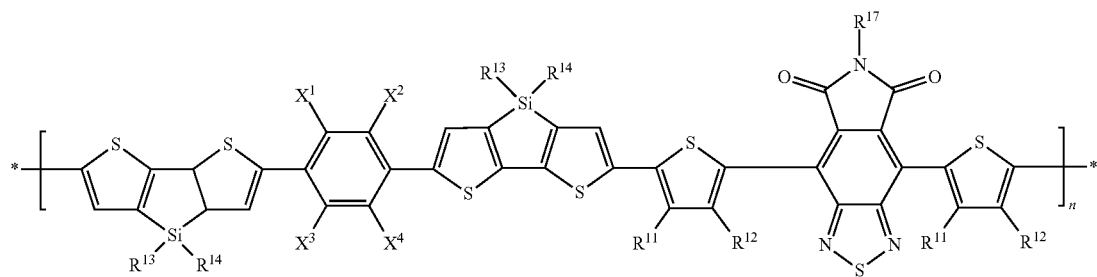
P23
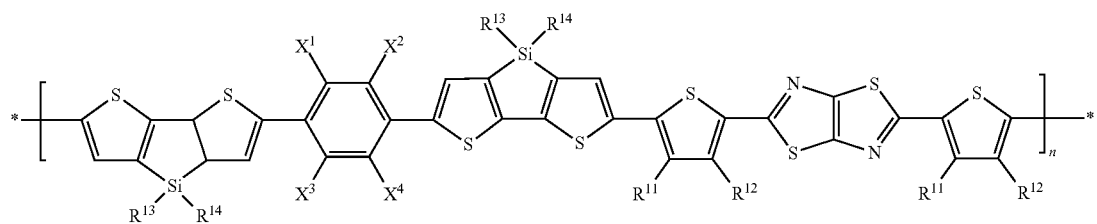
P24
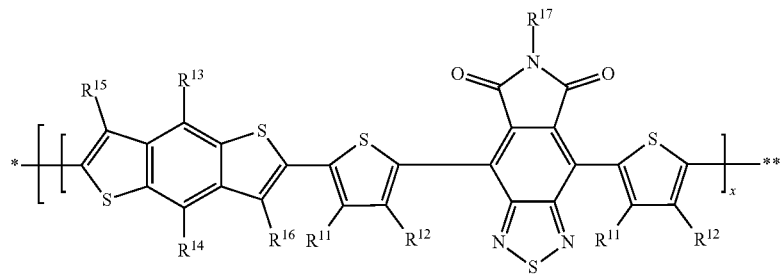
P25
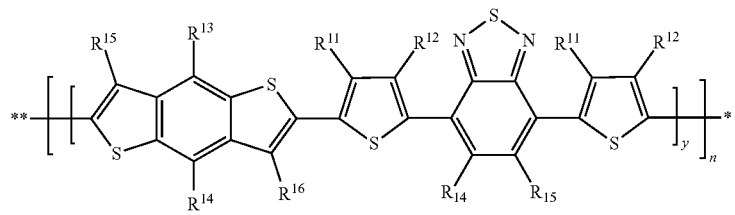
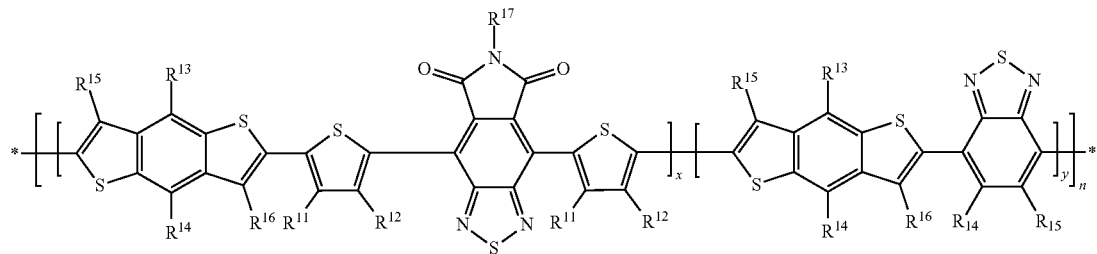
P26
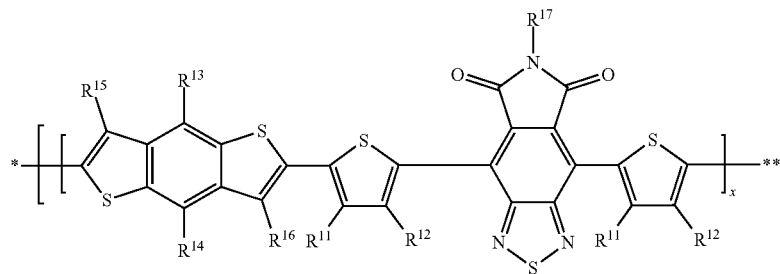
P27

-continued
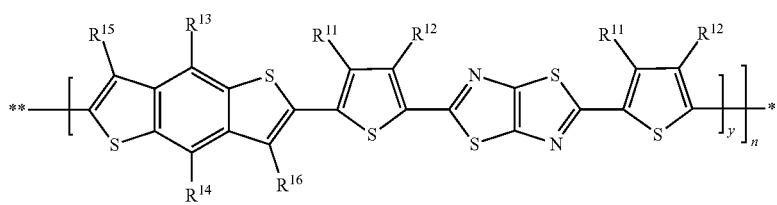
P28
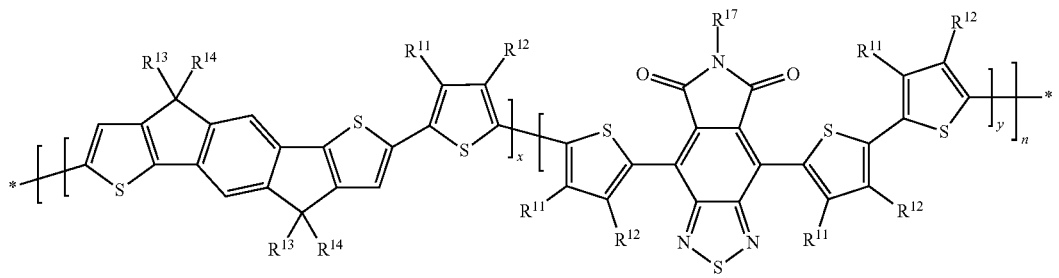
P29
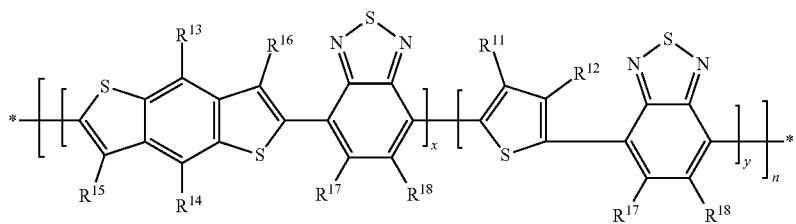
P30
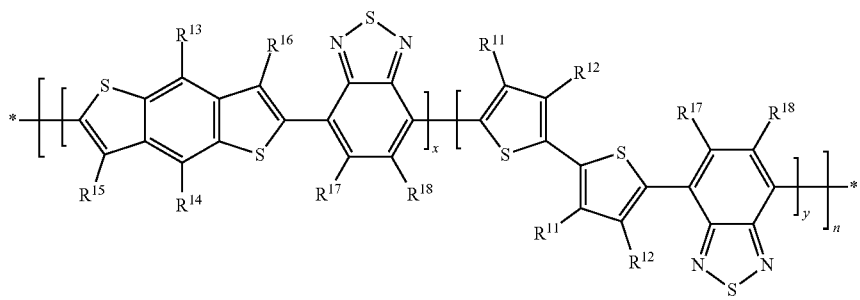
P31
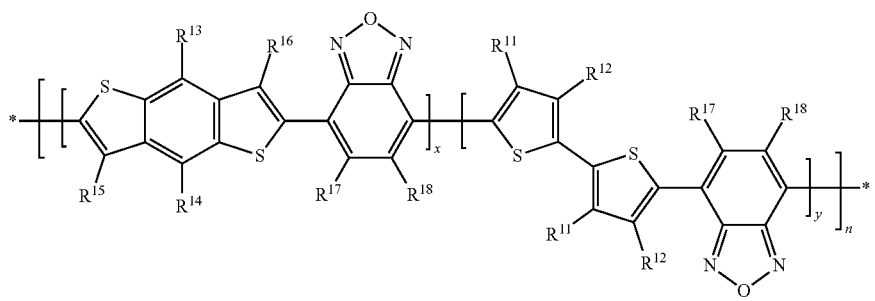
P32
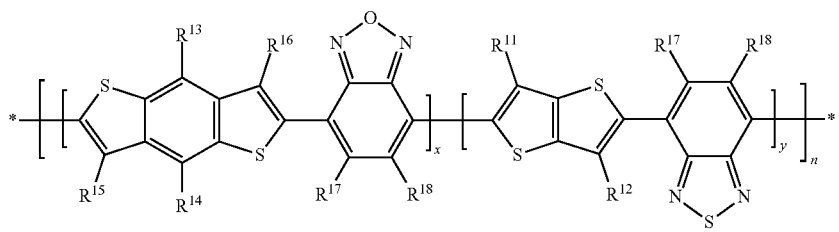

-continued
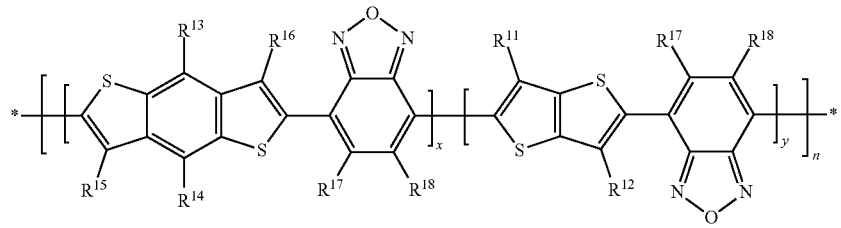
P33
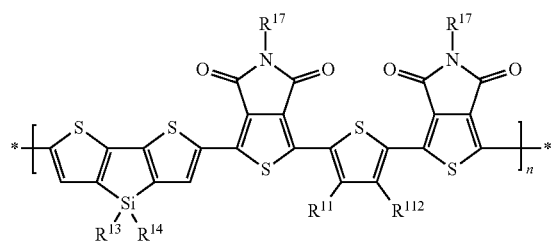
P34
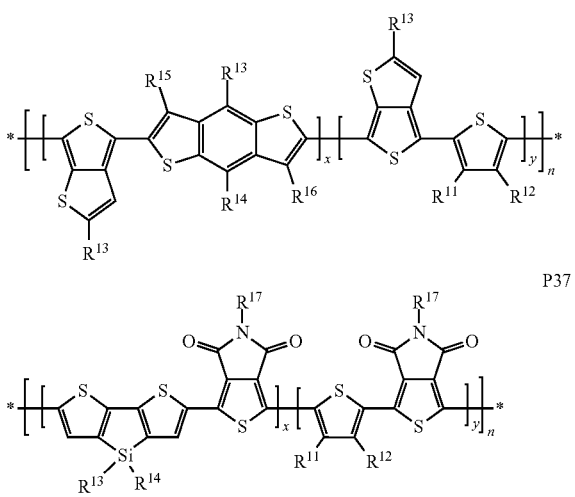
P35
P37
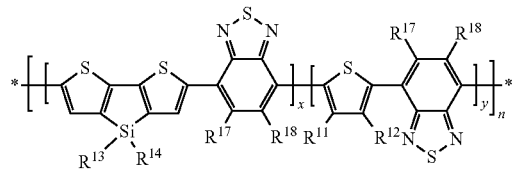
P36
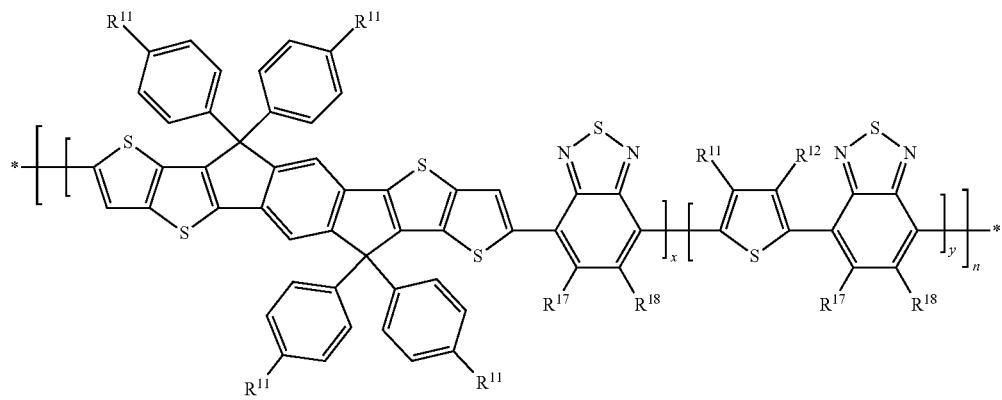
P38
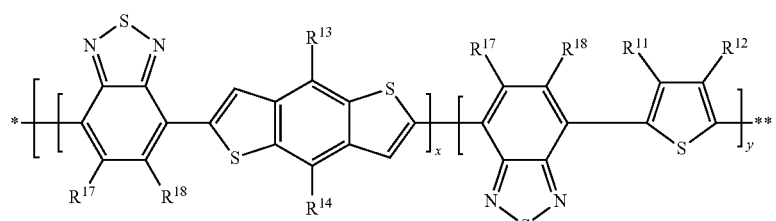
P39
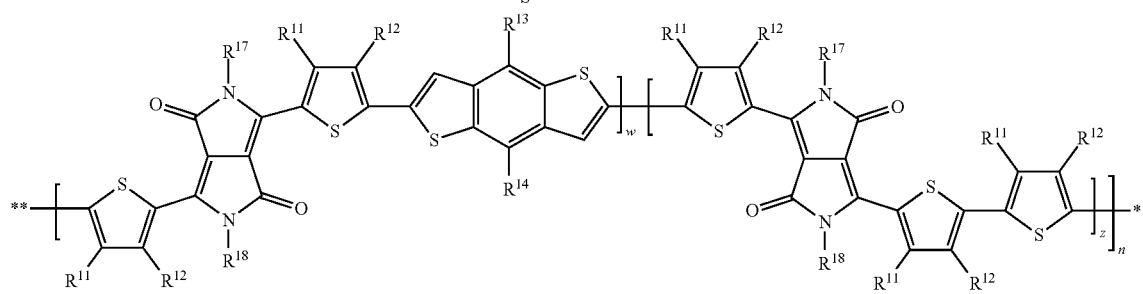

-continued
P40
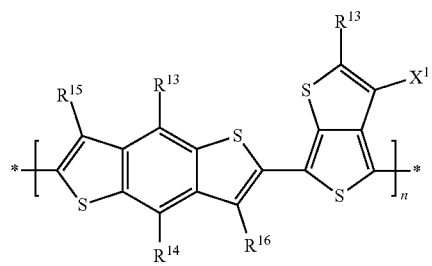
P41
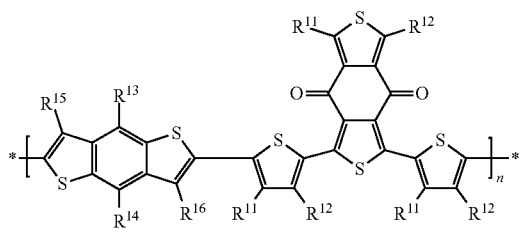
P42
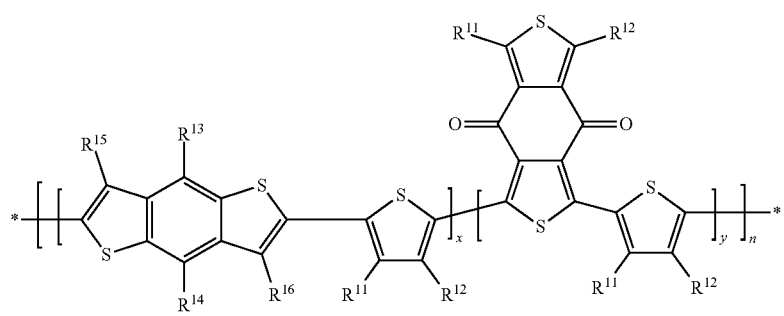
P43
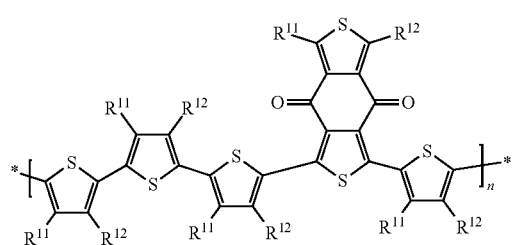
P44
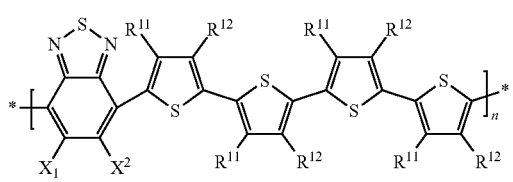
P45
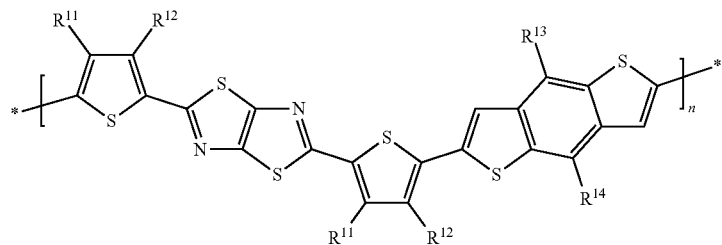
P46
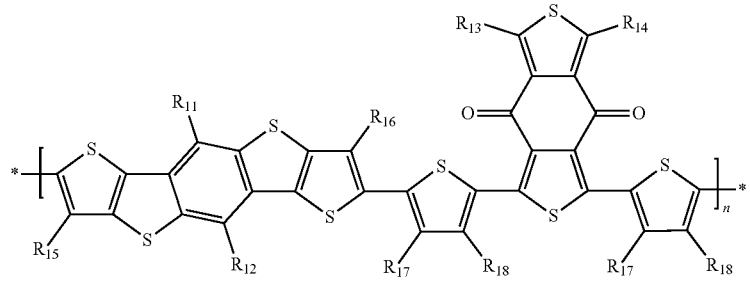
P47
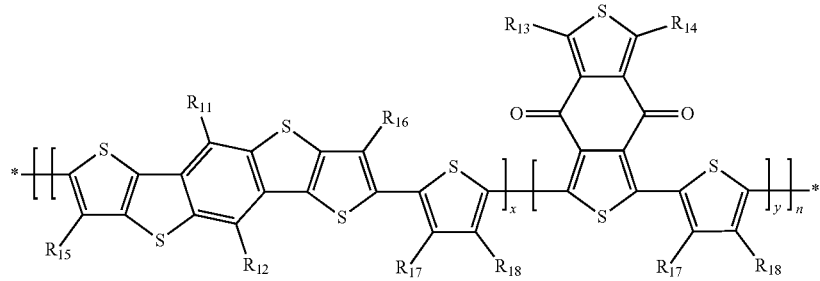

-continued
P48
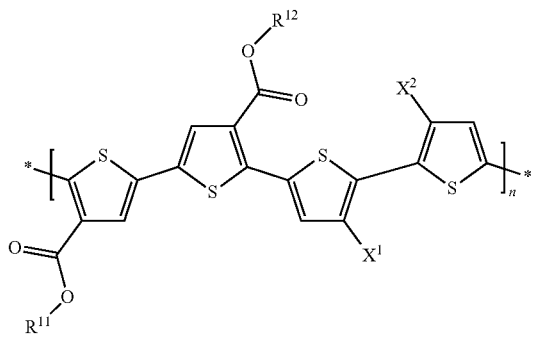
P49
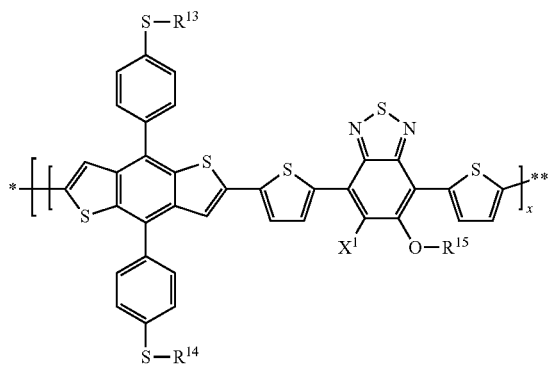
P50
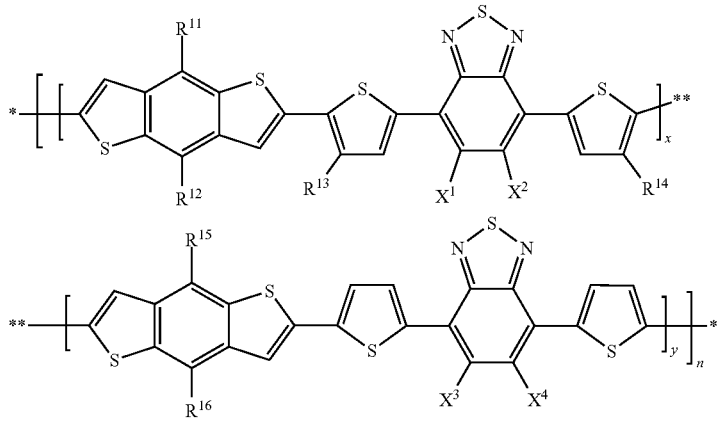
P51
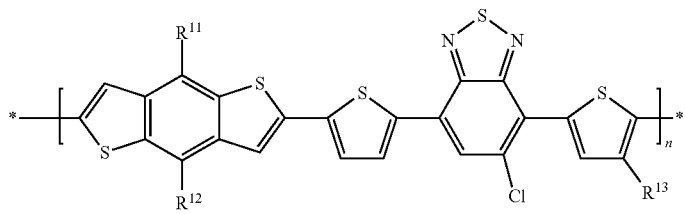
P52
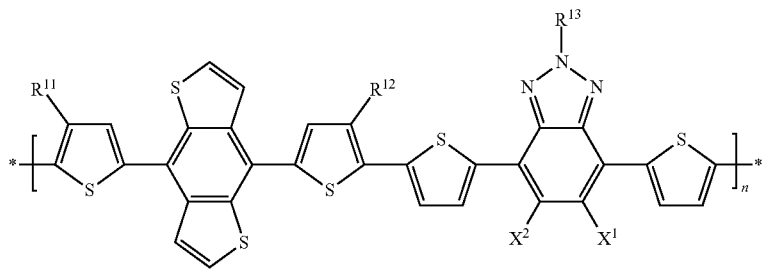

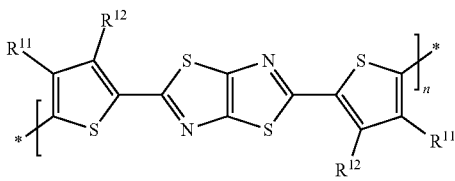

P53

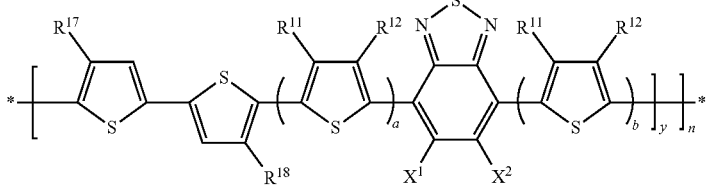

P54 wherein $R^{11-18}$, x, y and n are as defined above, w and z have one of the meanings given for y, x+y+w+z=1, $R^{19}$ has one of the meanings given for $R^{11}$, and $X^1$, $X^2$, $X^3$ and $X^4$ denote H, F or Cl.

Very preferred are polymers of formula P1. Further preferred are polymers of formula P1 wherein $R^{11}$, $R^{12}$, $R^{15}$, and $R^{16}$ are H, $R^{13}$ and $R^{14}$ denote alkyl, alkoxy or alkyloxycarbonyl, preferably alkoxycarbonyl, with 1 to 30, preferably 10 to 24 C atoms, and $R^{17}$ and $R^{18}$ denote alkyl or alkoxy, preferably alkoxy, with 1 to 20, preferably 10 to 20 C atoms.

Further preferred are polymers comprising one of the formulae P1-P54 as one or more repeating unit.

In the polymers of formula Pi-viii and P1-P54 which are composed of two building blocks [ ]$_x$ and [ ]$_y$, x and y are preferably from 0.1 to 0.9, very preferably from 0.25 to 0.75, most preferably from 0.4 to 0.6.

In the polymers of formula Pi-viii which are composed of three building blocks [ ]$_x$, [ ]$_y$, and [ ]z, x, y and z are preferably from 0.1 to 0.8, very preferably from 0.2 to 0.6, most preferably from 0.25 to 0.4.

In the formulae P1-P54 preferably one or more of $X^1$, $X^2$, $X^3$ and $X^4$ denote F, very preferably all of $X^1$, $X^2$, $X^3$ and $X^4$ denote F or $X^1$ and $X^2$ denote H and $X^3$ and $X^4$ denote F.

In the formulae P1-P54 preferably $R^{11}$ and $R^{12}$ are H. Further preferably $R^{11}$ and $R^{12}$, when being different from H, denote straight-chain or branched alkyl with 1 to 30, preferably 1 to 20, C atoms that is optionally fluorinated.

In the formulae P1-P54, preferably $R^{15}$ and $R^{16}$ are H, and $R^{13}$ and $R^{14}$ are different from H.

In formula P54 preferably $R^{17}$ and $R^{18}$ are F. Further preferably in formula P54 one or both of $R^{11}$ and $R^{12}$ are C1-C30 alkyl.

In the formulae P1-P54, preferably $R^{13}$, $R^{14}$, $R^{15}$ and $R^{16}$, when being different from H, are each independently selected from the following groups:
the group consisting of straight-chain or branched alkyl, alkoxy or sulfanylalkyl with 1 to 30, preferably 1 to 20, C atoms that is optionally fluorinated,
the group consisting of straight-chain or branched alkylcarbonyl or alkylcarbonyloxy with 2 to 30, preferably 2 to 20, C atoms, that is optionally fluorinated.

In the formulae P1-P54, preferably $R^{17}$ and $R^{18}$, when being different from H, are each independently selected from the following groups:
the group consisting of straight-chain or branched alkyl, alkoxy or sulfanylalkyl with 1 to 30, preferably 1 to 20, C atoms that is optionally fluorinated,
the group consisting of straight-chain or branched alkylcarbonyl or alkylcarbonyloxy with 2 to 30, preferably 2 to 20, C atoms, that is optionally fluorinated.
the group consisting of F and Cl.

In the conjugated polymers as described above and below, the total number of repeating units n is preferably from 2 to 10,000, very preferably from 5 to 10,000. The total number of repeating units n is preferably ≥5, very preferably ≥10, most preferably ≥50, and preferably ≤500, very preferably ≤1,000, most preferably ≤2,000, including any combination of the aforementioned lower and upper limits of n.

The conjugated polymers include homopolymers and copolymers, like statistical or random copolymers, alternating copolymers and block copolymers, as well as combinations thereof.

Further preferred are conjugated polymers selected of formula PT $$R^{31}\text{-chain-}R^{32} \qquad\qquad \text{PT}$$

wherein "chain" denotes a polymer chain selected of formula Pi-Pviii or P1-P53, and $R^{31}$ and $R^{32}$ have independently of each other one of the meanings of $R^{11}$ as defined above, or denote, independently of each other, H, F, Br, Cl, I, —CH$_2$Cl, —CHO, —CR'=CR''$_2$, —SiR'R''R''', —SiR'X'X'', —SiR'R''X', —SnR'R''R''', —BR'R'', —B(OR') (OR''), —B(OH)$_2$, —O—SO$_2$—R', —C≡CH, —C≡C—SiR'$_3$, —ZnX' or an endcap group, X' and X'' denote halogen, R', R'' and R''' have independently of each other one of the meanings of $R^0$ given in formula 1, and preferably denote alkyl with 1 to 12 C atoms, and two of R', R'' and R''' may also form a cyclosilyl, cyclostannyl, cycloborane or cycloboronate group with 2 to 20 C atoms together with the respective hetero atom to which they are attached.

Preferred endcap groups $R^{31}$ and $R^{32}$ are H, $C_{1-20}$ alkyl, or optionally substituted $C_{6-12}$ aryl or $C_{2-10}$ heteroaryl, very preferably H, phenyl or thiophene.

In a preferred embodiment of the present invention the substituents $R^1$ and $R^{11-18}$, when being different from H, are selected from F, Cl, CN, or from straight-chain or branched alkyl, alkoxy, sulfanylalkyl, sulfonylalkyl, alkylcarbonyl, alkoxycarbonyl and alkylcarbonyloxy, each of which has 1 to 20 C atoms and is unsubstituted or substituted by one or more F atoms, most preferably from F, Cl or formulae SUB1-SUB6 above.

In another preferred embodiment of the present invention $R^1$ and $R^{11-18}$, when being different from H, are selected from mono- or polycyclic aryl or heteroaryl, each of which is optionally substituted with one or more groups L as defined in formula I and has 5 to 20 ring atoms, and wherein two or more rings may be fused to each other or connected with each other by a covalent bond, very preferably phenyl that is optionally substituted, preferably in 4-position, 2,4-positions, 2,4,6-positions or 3,5-positions, or thiophene that is optionally substituted, preferably in 5-position, 4,5-positions or 3,5-positions, with alkyl, alkoxy or thioalkyl having 1 to 16 C atoms, most preferably from formulae SUB7-SUB18 above.

Preferred aryl and heteroaryl groups $R^{1-18}$, when being different from H, are each independently selected from the following formulae

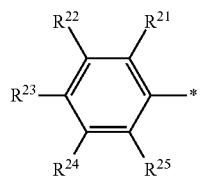
S1

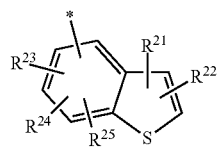
S2

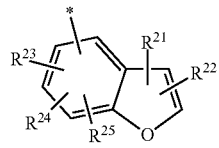
S3

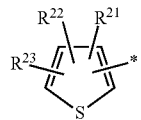
S4

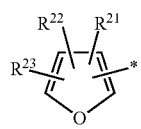
S5

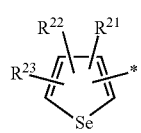
S6

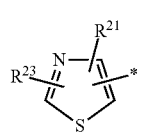
S7

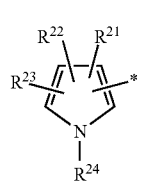
S8

-continued

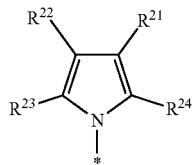
S9

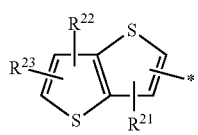
S10

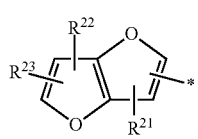
S11

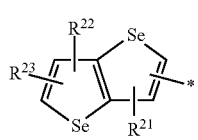
S12

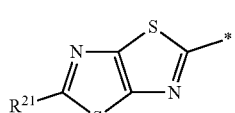
S13

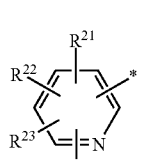
S14

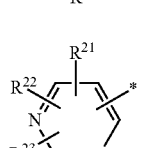
S15

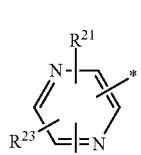
S16

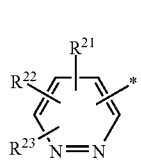
S17

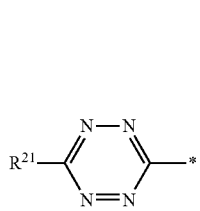
S18

-continued

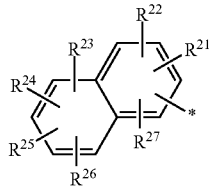

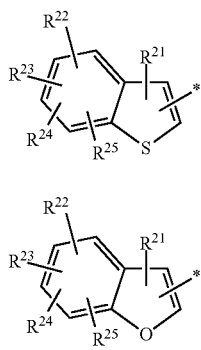

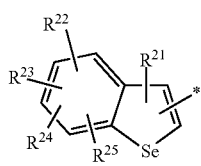

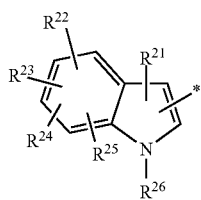

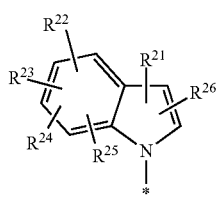

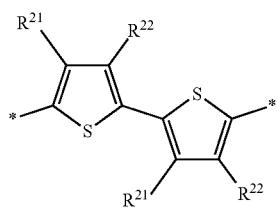

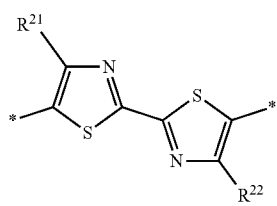

-continued

S19

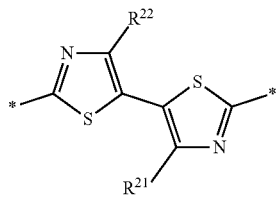

S20

S21

S22

S23

S24

S25

S26

S27 wherein $R^{21-27}$, independently of each other, and on each occurrence identically or differently, denote H, F, Cl, CN, or straight-chain, branched or cyclic alkyl with 1 to 30, preferably 1 to 20, C atoms, in which one or more $CH_2$ groups are each optionally replaced by —O—, —S—, —C(=O)—, —C(=S)—, —C(=O)—O—, —O—C(=O)—, —$NR^0$—, —$SiR^0R^{00}$—, —$CF_2$—, —$CR^0$=$CR^{00}$—, —$CY^1$=$CY^2$— or —C≡C— in such a manner that O and/or S atoms are not linked directly to one another, and in which one or more H atoms are each optionally replaced by F, Cl, Br, I or CN.

Very preferred aryl and heteroaryl groups $R^{1-18}$, when being different from H, are each independently selected from formulae S1, S4, S5, S7 and S10.

Very preferred aryl and heteroaryl groups $R^{1-18}$ are each independently selected from phenyl that is substituted, preferably in 4-position, or in 2,4-positions, or in 2,4,6-positions or in 3,5-positions, with alkyl or alkoxy having 1 to 20 C atoms, preferably 1 to 16 C atoms, very preferably 4-alkylphenyl wherein alkyl is C1-16 alkyl, most preferably 4-methylphenyl, 4-hexylphenyl, 4-octylphenyl or 4-dodecylphenyl, or 4-alkoxyphenyl wherein alkoxy is C1-16 alkoxy, most preferably 4-hexyloxyphenyl, 4-octyloxyphenyl or 4-dodecyloxyphenyl or 2,4-dialkylphenyl wherein alkyl is C1-16 alkyl, most preferably 2,4-dihexylphenyl or 2,4-dioctylphenyl or 2,4-dialkoxyphenyl wherein alkoxy is C1-16 alkoxy, most preferably 2,4-dihexyloxyphenyl or 2,4-dioctyloxyphenyl or 3,5-dialkylphenyl wherein alkyl is C1-16 alkyl, most preferably 3,5-dihexylphenyl or 3,5-dioctylphenyl or 3,5-dialkoxyphenyl wherein alkoxy is C1-16 alkoxy, most preferably 3,5-dihexyloxyphenyl or 3,5-dioctyloxyphenyl, or 2,4,6-trialkylphenyl wherein alkyl is C1-16 alkyl, most preferably 2,4,6-trihexylphenyl or 2,4,6-trioctylphenyl or 2,4,6-trialkoxyphenyl wherein alkoxy is C1-16 alkoxy, most preferably 2,4,6-trihexyloxyphenyl or 2,4,6-trioctyloxyphenyl or 4-thioalkylphenyl wherein thioalkyl is C1-16 thioalkyl, most preferably 4-thiohexylphenyl, 4-thiooctylphenyl or 4-thiododecylphenyl, or 2,4-dithioalkylphenyl wherein thioalkyl is C1-16 thioalkyl, most preferably 2,4-dithiohexylphenyl or 2,4-dithiooctylphenyl, or 3,5-dithioalkylphenyl wherein thioalkyl is C1-16 thioalkyl, most preferably 3,5-dithiohexylphenyl or 3,5-dithiooctylphenyl, or 2,4,6-trithioalkylphenyl wherein thioalkyl is C1-16 thioalkyl, most preferably 2,4,6-trithiohexylphenyl or 2,4,6-trithiooctylphenyl, or from thiophene that is optionally substituted, preferably in 5-position, 4,5-positions or 3,5-positions, with alkyl, alkoxy or thioalkyl having 1 to 16 C atoms.

Most preferred aryl and heteroaryl groups $R^{1-18}$ are each independently selected from formulae SUB7-SUB16 as defined above.

The conjugated polymers can be synthesized according to or in analogy to methods that are known to the skilled person and are described in the literature. Other methods of preparation can be taken from the examples.

The polymers of the present invention can be prepared from the corresponding monomers, for example by polymerising or co-polymerising one or more of such monomers in an aryl-aryl coupling reaction Preferred aryl-aryl coupling methods used in the synthesis methods as described above and below are Yamamoto coupling, Kumada coupling, Negishi coupling, Suzuki coupling, Stille coupling, Sonogashira coupling, Heck coupling, C—H activation coupling, Ullmann coupling or Buchwald coupling. Especially preferred are Suzuki coupling, Negishi coupling, Stille coupling and Yamamoto coupling. Suzuki coupling is described for example in WO 00/53656 A1. Negishi coupling is described for example in *J. Chem. Soc., Chem. Commun.*, 1977, 683-684. Yamamoto coupling is described in for example in T. Yamamoto et al., *Prog. Polym. Sci.*, 1993, 17, 1153-1205, or WO 2004/022626 A1. Stille coupling is described for example in Z. Bao et al., *J. Am. Chem. Soc.*, 1995, 117, 12426-12435 and C—H activation is described for example in M. Leclerc et al, *Angew. Chem. Int. Ed.*, 2012, 51, 2068-2071. For example, when using Yamamoto coupling, educts having two reactive halide groups are preferably used. When using Suzuki coupling, educts having two reactive boronic acid or boronic acid ester groups or two reactive halide groups are preferably used. When using Stille coupling, educts having two reactive stannane groups or two reactive halide groups are preferably used. When using Negishi coupling, educts having two reactive organozinc groups or two reactive halide groups are preferably used.

Preferred catalysts, especially for Suzuki, Negishi or Stille coupling, are selected from Pd(0) complexes or Pd(II) salts. Preferred Pd(0) complexes are those bearing at least one phosphine ligand such as Pd(Ph$_3$P)$_4$. Another preferred phosphine ligand is tris(ortho-tolyl)phosphine, i.e. Pd(o-Tol$_3$P)$_4$. Preferred Pd(II) salts include palladium acetate, i.e. Pd(OAc)$_2$. Alternatively the Pd(0) complex can be prepared by mixing a Pd(0) dibenzylideneacetone complex, for example tris(dibenzylideneacetone)dipalladium(0), bis(dibenzylideneacetone)palladium(0), or Pd(II) salts e.g. palladium acetate, with a phosphine ligand, for example triphenylphosphine, tris(ortho-tolyl)phosphine or tri(tert-butyl) phosphine. Suzuki coupling is performed in the presence of a base, for example sodium carbonate, potassium carbonate, cesium carbonate, lithium hydroxide, potassium phosphate or an organic base such as tetraethylammonium carbonate or tetraethylammonium hydroxide. Yamamoto coupling employs a Ni(0) complex, for example bis(1,5-cyclooctadienyl) nickel(0).

As alternatives to halogens as described above, leaving groups of formula —O—SO$_2$Z$^0$ can be used wherein Z$^0$ is an alkyl or aryl group, preferably C$_{1-10}$ alkyl or C$_{6-12}$ aryl. Particular examples of such leaving groups are tosylate, mesylate and triflate.

In the formulations according to the present invention the n-type OSC is preferably a small molecule.

In a preferred embodiment the n-type OSC is a fullerene or substituted fullerene.

The fullerene is for example an indene-C$_{60}$-fullerene bisadduct like ICBA, or a (6,6)-phenyl-butyric acid methyl ester derivatized methano C$_{60}$ fullerene, also known as "PCBM-C$_{60}$" or "C$_{60}$PCBM", as disclosed for example in G. Yu, J. Gao, J. C. Hummelen, F. Wudl, A. J. Heeger, Science 1995, Vol. 270, p. 1789 ff and having the structure shown below, or structural analogous compounds with e.g. a C$_{61}$ fullerene group, a C$_{70}$ fullerene group, or a C$_{71}$ fullerene group, or an organic polymer (see for example Coakley, K. M. and McGehee, M. D. *Chem. Mater.* 2004, 16, 4533).

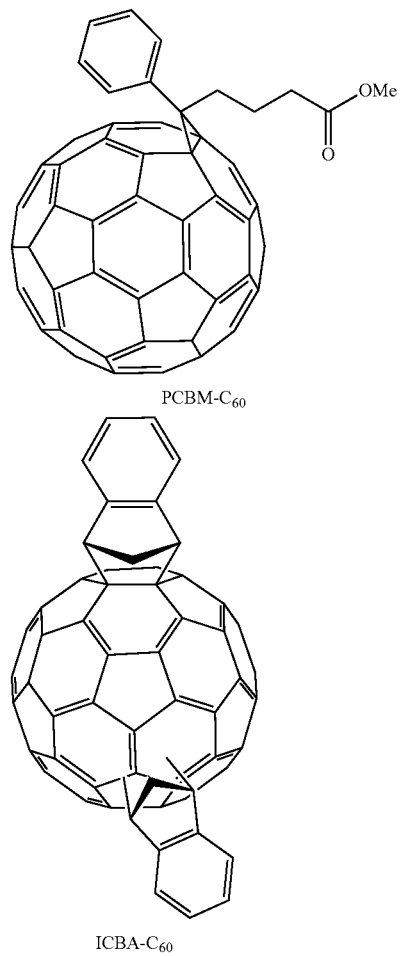

PCBM-C$_{60}$

ICBA-C$_{60}$

Preferably the polymer according to the present invention is blended with an n-type OSC such as a fullerene or substituted fullerene of formula Full-I to form the active layer in an OPV or OPD device,

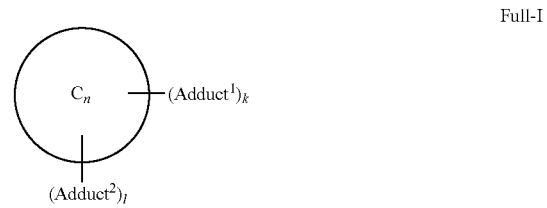

Full-I wherein
C$_n$ denotes a fullerene composed of n carbon atoms, optionally with one or more atoms trapped inside,
Adduct$^1$ is a primary adduct appended to the fullerene C$_n$ with any connectivity,
Adduct$^2$ is a secondary adduct, or a combination of secondary adducts, appended to the fullerene C$_n$ with any connectivity,
k is an integer$\geq$1,
and
l is 0, an integer$\geq$1, or a non-integer>0.

In the formula Full-I and its subformulae, k preferably denotes 1, 2, 3 or, 4, very preferably 1 or 2.

The fullerene $C_n$ in formula Full-I and its subformulae may be composed of any number n of carbon atoms Preferably, in the compounds of formula XII and its subformulae the number of carbon atoms n of which the fullerene $C_n$ is composed is 60, 70, 76, 78, 82, 84, 90, 94 or 96, very preferably 60 or 70.

The fullerene $C_n$ in formula Full-I and its subformulae is preferably selected from carbon based fullerenes, endohedral fullerenes, or mixtures thereof, very preferably from carbon based fullerenes.

Suitable and preferred carbon based fullerenes include, without limitation, $(C_{60\text{-}Ih})[5,6]$fullerene, $(C_{70\text{-}D5h})[5,6]$fullerene, $(C_{76\text{-}D2}*)[5,6]$fullerene, $(C_{84\text{-}D2}*)[5,6]$fullerene, $(C_{84\text{-}D2d})[5,6]$fullerene, or a mixture of two or more of the aforementioned carbon based fullerenes.

The endohedral fullerenes are preferably metallofullerenes. Suitable and preferred metallofullerenes include, without limitation, La@$C_{60}$, La@$C_{82}$, Y@$C_{82}$, $Sc_3N$@$C_{80}$, $Y_3N$@$C_{80}$, $Sc_3C_2$@$C_{80}$ or a mixture of two or more of the aforementioned metallofullerenes.

Preferably the fullerene $C_n$ is substituted at a [6,6] and/or [5,6] bond, preferably substituted on at least one [6,6] bond.

Primary and secondary adducts, named "Adduct1" and "Adduct 2" in formula Full-I and its subformulae, are each preferably selected from the following formulae

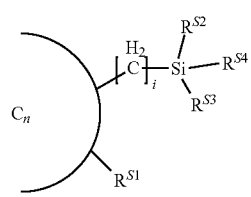

S-1

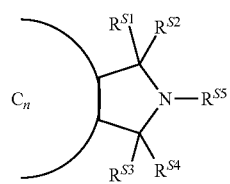

S-2

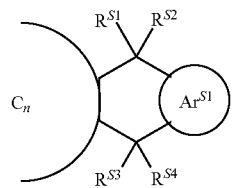

S-3

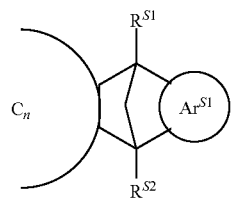

S-4

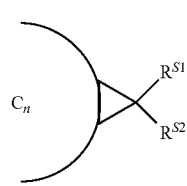

S-4

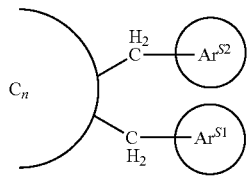

S-5

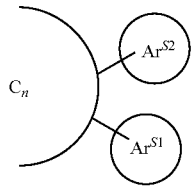

S-6

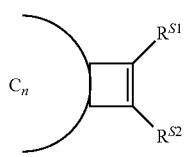

S-7

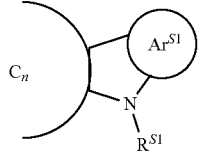

S-8

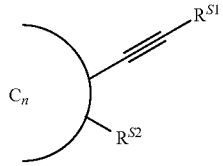

S-9

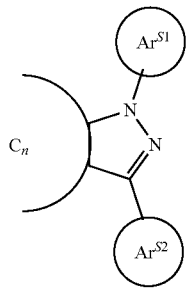

S-10

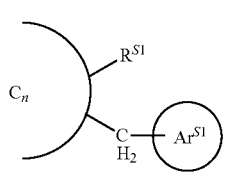

S-11

-continued

S-12

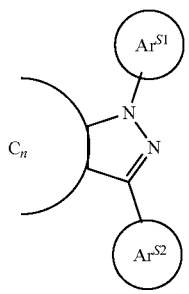

S-13

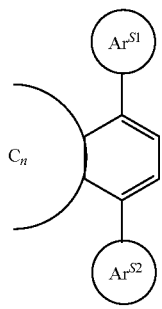

S-14

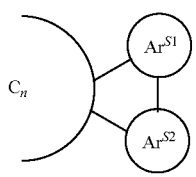

wherein $Ar^{S1}$, $Ar^{S2}$ denote, independently of each other, an aryl or heteroaryl group with 5 to 20, preferably 5 to 15, ring atoms, which is mono- or polycyclic, and which is optionally substituted by one or more identical or different substituents having one of the meanings of L as defined above and below, $R^{S1}$, $R^{S2}$, $R^{S3}$, $R^{S4}$ and $R^{S5}$ independently of each other denote H, CN or have one of the meanings of L as defined above and below, and i is an integer from 1 to 20, preferably from 1 to 12.

Preferred compounds of formula Full-I are selected from the following subformulae:

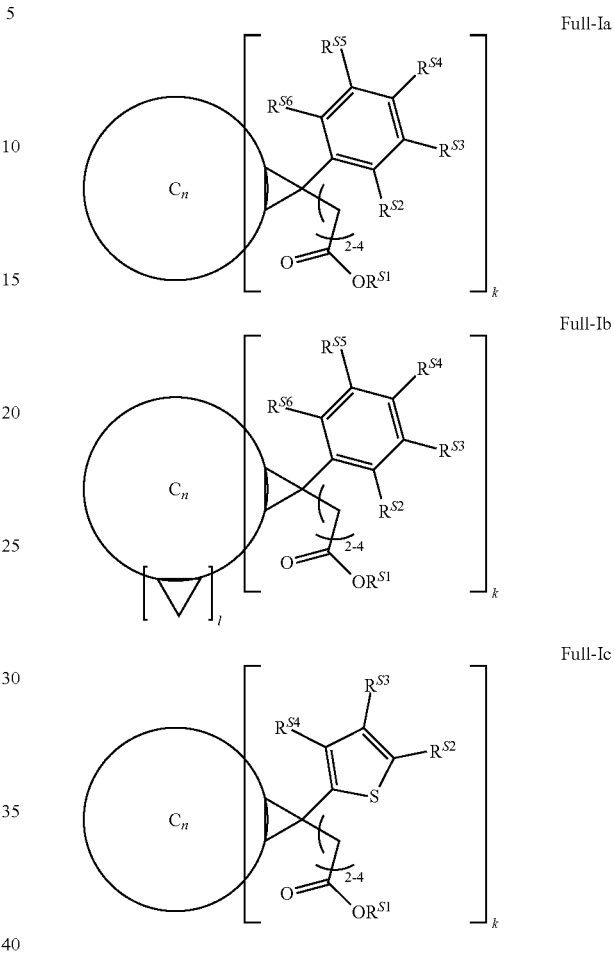

Full-Ia

Full-Ib

Full-Ic

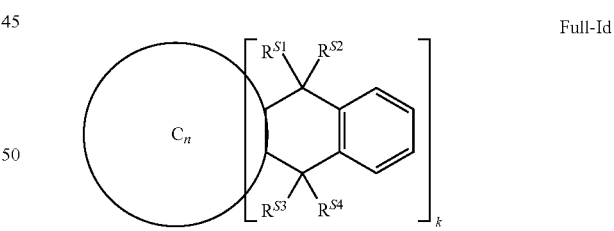

Full-Id

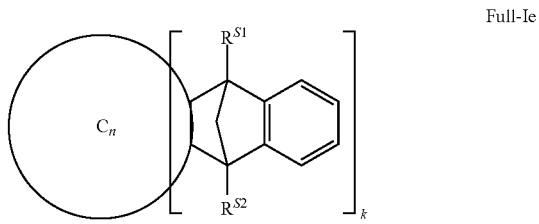

Full-Ie

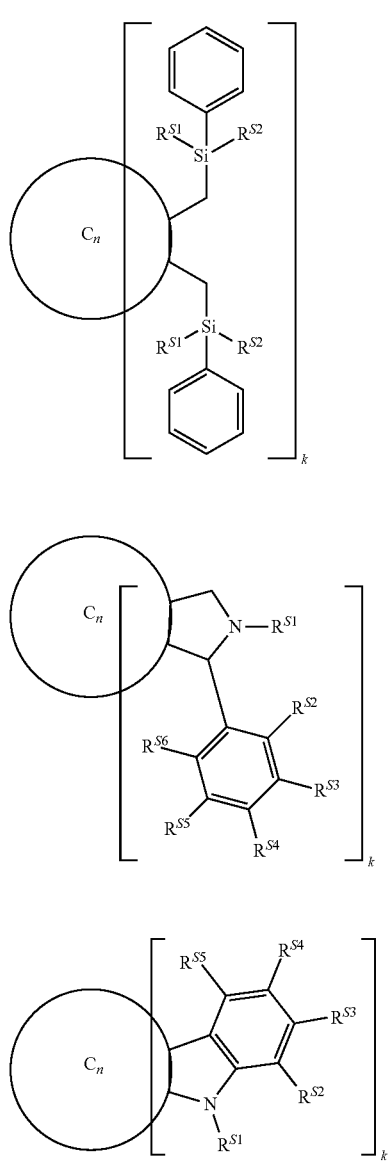

wherein

Full-If R$^{S1}$, R$^{S2}$, R$^{S3}$, R$^{S4}$ R$^{S5}$ and R$^{S6}$ independently of each other denote H or have one of the meanings of R$^S$ as defined above and below.

Preferably the fullerene is PCBM-C60, PCBM-C70, PCBC6-C60 (a derivative of PCBM-C60 wherein the methylester group is replaced by a hexylester group), bis-PCBM-C60, bis-PCBM-C70, ICMA-c60 (1',4'-dihydro-naphtho[2',3':1,2][5,6]fullerene-C60), ICBA, oQDM-C60 (1',4'-dihydro-naphtho[2',3':1,9][5,6]fullerene-C60-lh), or bis-oQDM-C60, very preferably PCBM-C60, PCBM-C70 or PCBC6-C60, most preferably PCBM-C60.

In another preferred embodiment the n-type OSC is a non-fullerene acceptor (NFA) small molecule (i.e. a compound which does not contain a fullerene moiety).

In a preferred embodiment the n-type OSC is a compound comprising a polycyclic core and one or two terminal groups attached thereto which are electron withdrawing relative to the central polycyclic core, and optionally further comprising one or more aromatic or heteroaromatic spacer groups which are located between the polycyclic core and the terminal groups and which can be electron withdrawing or electron donating relative to the polycyclic core.

Full-Ig

As a result these compounds have an acceptor-donor-acceptor (A-D-A) structure, wherein the polycyclic core acts as donor and the terminal groups, optionally together with the spacer groups, act as acceptor.

Suitable and preferred NFA small molecules for use as n-type OSC in this preferred embodiment are for example those disclosed in Y. Lin et al., *Adv. Mater.*, 2015, 27, 1170; H. Lin et al., *Adv. Mater.*, 2015, 27, 7299; N. Qiu et al., *Adv. Mater.*, 2017, 29, 1604964; CN104557968 A and CN105315298 A, furthermore those disclosed in WO 2018/007479 A1.

Full-Ih

In another preferred embodiment the n-type OSC is an NFA small molecule which is selected from naphthalene carboximide or perylene carboximide derivatives.

Preferred naphthalene or perylene carboximide derivatives for use as n-type OSC compounds are described for example in *Adv. Sci.* 2016, 3, 1600117, *Adv. Mater.* 2016, 28, 8546-8551, *J. Am. Chem. Soc.*, 2016, 138, 7248-7251 and *J. Mater. Chem. A*, 2016, 4, 17604.

Preferred n-type OSCs of this preferred embodiment are selected from the following formulae

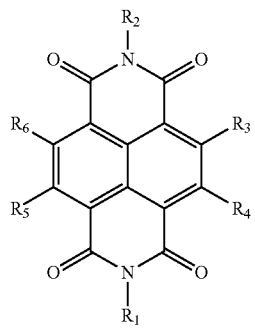

NDI1

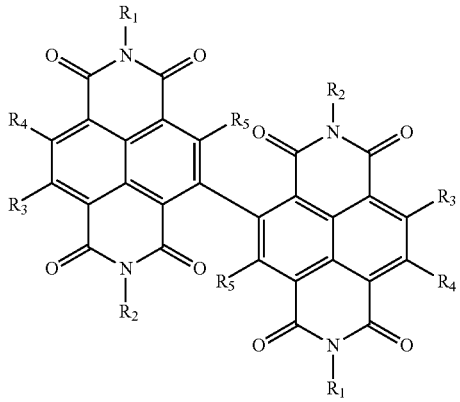

NDI2

NDI3
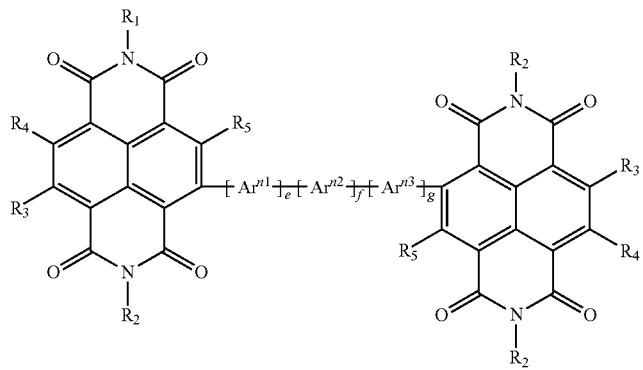
NDI4
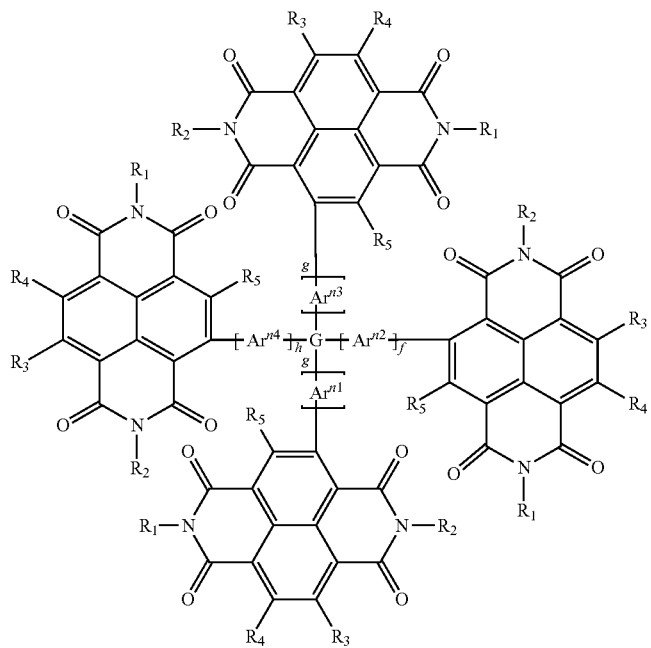
PDI1
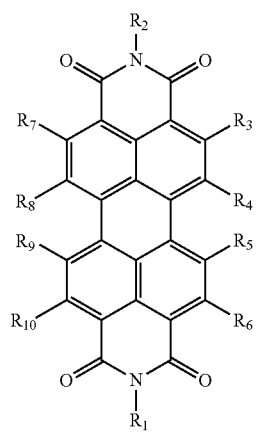
PDI2
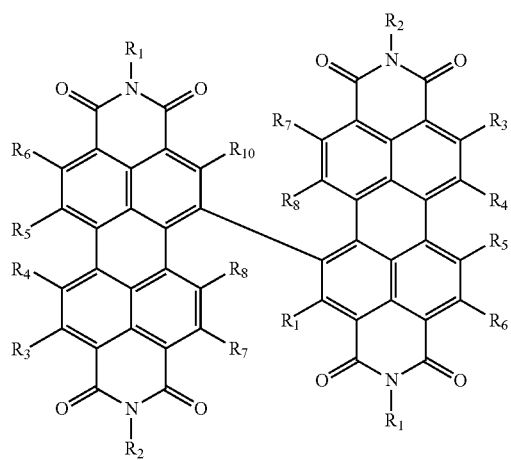

-continued
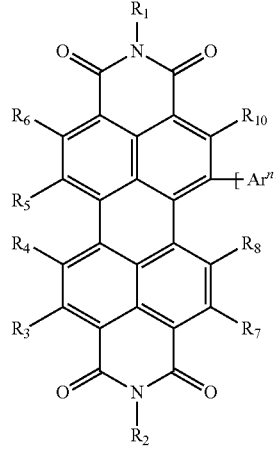 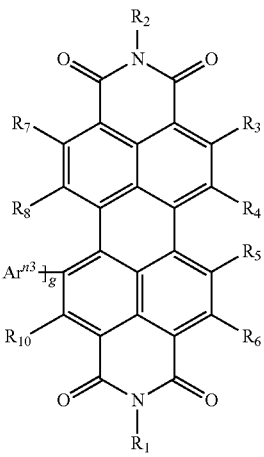
PDI3
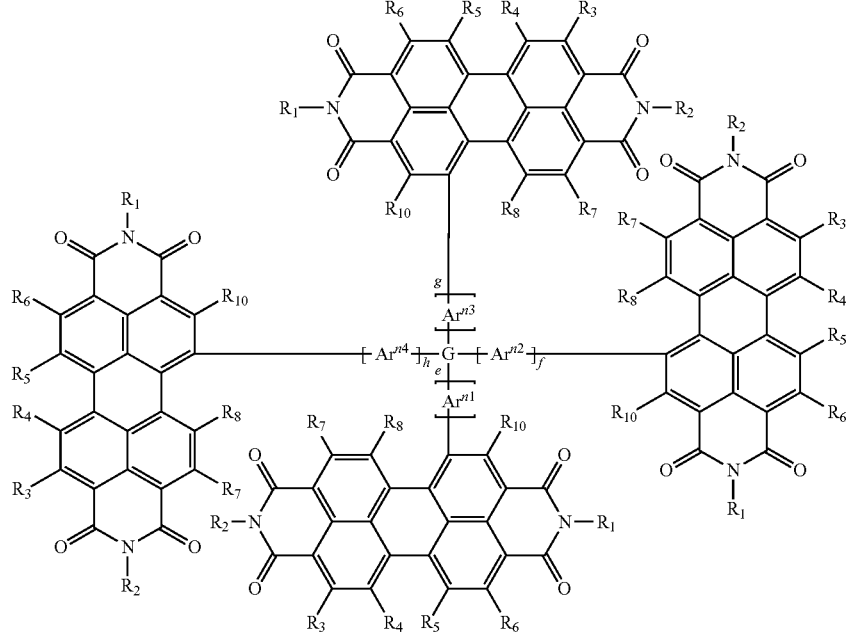
PDI4

-continued
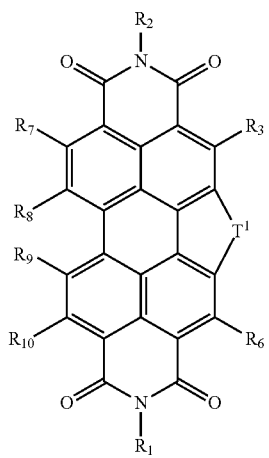
PDI5
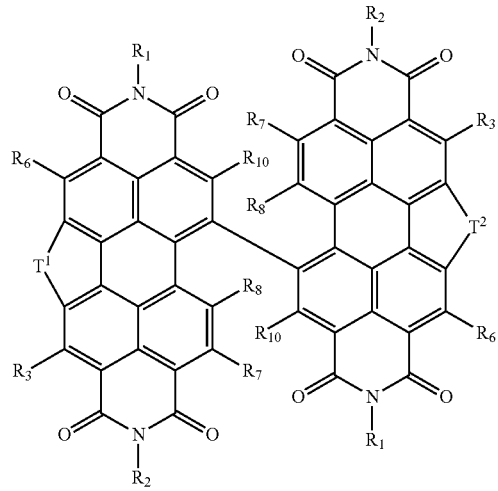
PDI6
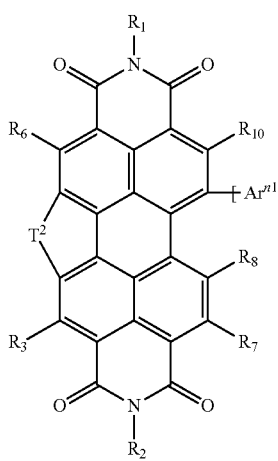
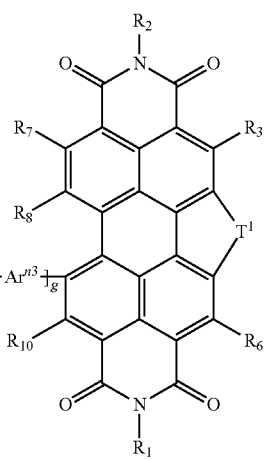
PDI7

-continued

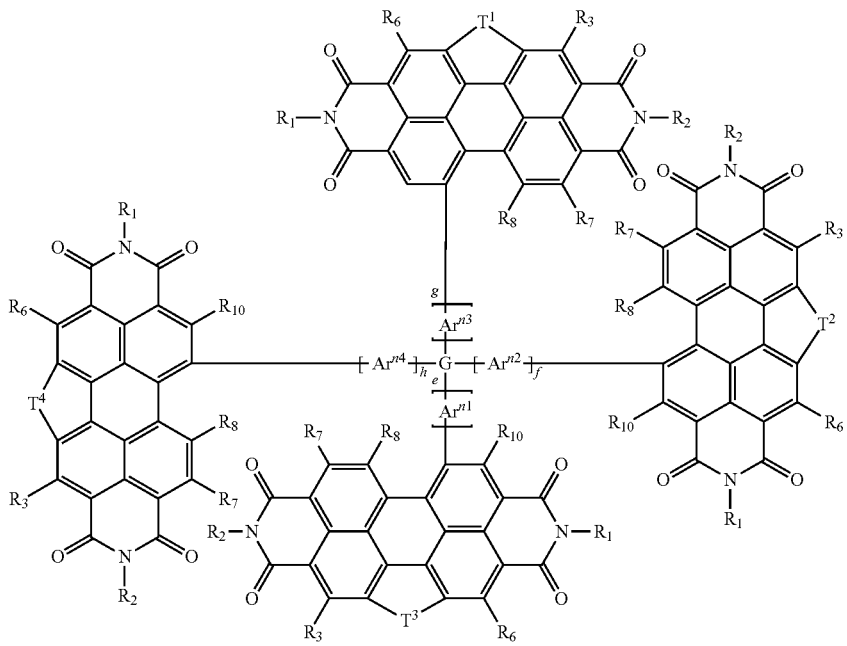

PDI8

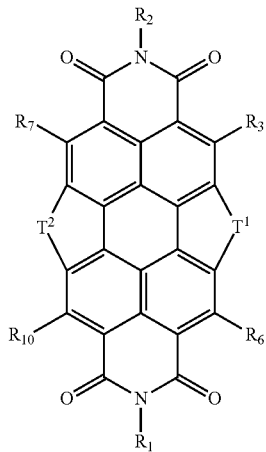

PDI9 wherein the individual radicals, independently of each other and on each occurrence identically or differently, have the following meanings $R^{1-10}$ $Z^1$, H, F, Cl, or straight-chain, branched or cyclic alkyl with 1 to 30, preferably 1 to 20, C atoms, in which one or more $CH_2$ groups are optionally replaced by —O—, —S—, —C(=O)—, —C(=S)—, —C(=O)—O—, —O—C(=O)—, —$NR^o$—, —$SiR^oR^{oo}$—, —$CF_2$—, —$CR^o$=$CR^{oo}$—, —$CY^1$=$CY^2$— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, does optionally contain fused rings, and is unsubstituted or substituted by one or more identical or different groups L, $Z^1$ an electron withdrawing group, preferably having one of the preferred meanings as given above for formula T, very preferably CN, $Y^1$, $Y^2$ H, F, Cl or CN, L F, Cl, —$NO_2$, —CN, —NC, —NCO, —NCS, —OCN, —SCN, $R^o$, $OR^o$, $SR^o$, —C(=O)$X^o$, —C(=O)$R^o$, —C(=O)—$OR^o$, —O—C(=O)—$R^o$, —$NH_2$, —$NHR^o$, —$NR^oR^{oo}$, —C(=O)$NHR^o$, —C(=O)$NR^oR^{oo}$, —$SO_3R^o$, —$SO_2R^o$, —OH, —$NO_2$, —$CF_3$, —$SF_5$, or optionally substituted silyl, or carbyl or hydrocarbyl with 1 to 30, preferably 1 to 20 C atoms that is optionally substituted and optionally comprises one or more hetero atoms, preferably F, —CN, $R^o$, —$OR^o$, —$SR^o$, —C(=O)—$R^o$, —C(=O)—$OR^o$, —O—C(=O)—$R^o$, —O—C(=O)—$OR^o$, —C(=O)—$NHR^o$, or —C(=O)—$NR^oR^{oo}$, $T^{1-4}$ —O—, —S—, —C(=O)—, —C(=S)—, —CR°R°°—, —SiR°R°°—, —NR°—, —CR°=CR°°— or —C≡C—, G C, Si, Ge, C=C or a four-valent aryl or heteroaryl group that has from 5 to 20 ring atoms, is mono- or polycyclic, optionally contains fused rings, and is unsubstituted or substituted by one or more identical or different groups R¹ or L, $Ar^{n1-n4}$ independently of each other, and on each occurrence identically or differently arylene or heteroarylene that has from 5 to 20 ring atoms, is mono- or polycyclic, optionally contains fused rings, and is unsubstituted or substituted by one or more identical or different groups R¹ or L, or $CY^1=CY^2$ or —C≡C—, e, f, g, h 0 or an integer from 1 to 10.

Another preferred embodiment of the present invention relates to a formulation comprising a p-type OSC, which is preferably a conjugated polymer as described above and below, a first n-type OSC and a second n-type OSC, wherein the first and second n-type OSCs are preferably selected from fullerenes, fullerene derivatives or NFAs.

The formulation according to the present invention can be prepared by conventional methods that are described in prior art and known to the skilled person. Typically the compounds and/or polymers are mixed with each other or dissolved in suitable solvents and the solutions combined.

The present invention also provides the use of the formulation for preparing an OSC layer, preferably a photoactive OSC layer, in an electronic device.

The layer may be less than about 30 microns. For various electronic device applications, the thickness may be less than about 1 micron thick. The layer may be deposited, for example on a part of an electronic device, by any of the solution coating or printing techniques as described above and below.

The formulation according to the present invention can also be used for the preparation of patterned OSC layers in the devices as described above and below. For applications in modern microelectronics it is generally desirable to generate small structures or patterns to reduce cost (more devices/unit area), and power consumption. Patterning of thin layers comprising a compound according to the present invention can be carried out for example by photolithography, electron beam lithography or laser patterning.

For the preparation of thin layers or patterns in electronic or optoelectronic devices the formulation of the present invention may be deposited by any suitable method. Liquid coating of devices is more desirable than vacuum deposition techniques. Solution deposition methods are especially preferred, including, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing.

A preferred embodiment of the present invention relates to a method of preparing an OSC layer or an OSC pattern, preferably a photoactive OSC layer, in an electronic device, from a formulation as described above and below by printing.

Preferred printing methods are selected from ink jet printing, nozzle printing, letter-press printing, screen printing, gravure printing, roller printing, reverse-roller printing, offset lithography printing, dry offset lithography printing, flexographic printing, web printing and pad printing, very preferably from gravure printing, flexographic printing, ink-jet printing and screen printing, most preferably by screen printing.

The present invention further relates to an OSC layer or an OSC pattern, preferably a photoactive OSC layer, in an electronic device, which is prepared from a formulation or by a printing method as described above and below. The invention further relates to an OE device comprising such an OSC layer or pattern.

Preferred OE devices are OFETs, TFTs, ICs, logic circuits, capacitors, RFID tags, OLEDs, OLETs, OPEDs, OPVs, PSCs, OPDs, solar cells, laser diodes, photoconductors, photodetectors, electrophotographic devices, electrophotographic recording devices, organic memory devices, sensor devices, charge injection layers, Schottky diodes, planarizing layers, antistatic films, conducting substrates and conducting patterns.

Very preferred OE devices are OPV, PSC and OPD devices, OFETs, and OLEDs, in particular OPD, PSC and bulk heterojunction (BHJ) OPV devices. In an OFET, for example, the active semiconductor channel between the drain and source may comprise the polymer or composition of the invention. As another example, in an OLED device, the charge (hole or electron) injection or transport layer may comprise the polymer or composition of the invention.

An OPV or OPD device according to the present invention preferably further comprises a first transparent or semi-transparent electrode on a transparent or semi-transparent substrate on one side of the photoactive layer, and a second metallic or semi-transparent electrode on the other side of the photoactive layer.

Further preferably the OPV or OPD device comprises, between the photoactive layer and the first or second electrode, one or more additional buffer layers acting as hole transporting layer and/or electron blocking layer, which comprise a material such as metal oxide, like for example, ZTO, $MoO_x$, $NiO_x$, a conjugated polymer electrolyte, like for example PEDOT:PSS, a conjugated polymer, like for example polytriarylamine (PTAA), an insulating polymer, like for example nafion, polyethyleneimine or polystyrene-sulphonate, an organic compound, like for example N,N'-diphenyl-N,N'-bis(1-naphthyl)(1,1'-biphenyl)-4,4'diamine (NPB), N,N'-diphenyl-N,N'-(3-methylphenyl)-1,1'-biphenyl-4,4'-diamine (TPD), or alternatively as hole blocking layer and/or electron transporting layer, which comprise a material such as metal oxide, like for example, $ZnO_x$, $TiO_x$, a salt, like for example LiF, NaF, CsF, a conjugated polymer electrolyte, like for example poly[3-(6-trimethylammoniumhexyl)thiophene], poly(9,9-bis(2-ethylhexyl)-fluorene]-b-poly[3-(6-trimethylammoniumhexyl)thiophene], or poly [(9,9-bis(3'—(N,N-dimethylamino)propyl)-2,7-fluorene)-alt-2,7-(9,9-dioctylfluorene)] or an organic compound, like for example tris(8-quinolinolato)-aluminum(III) ($Alq_3$), 4,7-diphenyl-1,10-phenanthroline.

The OPV device can for example be of any type known from the literature (see e.g. Waldauf et al., *Appl. Phys. Lett.*, 2006, 89, 233517).

A first preferred OPV device according to the invention comprises the following layers (in the sequence from bottom to top):
optionally a substrate,
a high work function electrode, preferably comprising a metal oxide, like for example ITO, serving as anode,
an optional conducting polymer layer or hole transport layer, preferably comprising an organic polymer or polymer blend, for example of PEDOT:PSS (poly(3,4-ethylenedioxythiophene): poly(styrene-sulfonate), or TBD (N,N'-dyphenyl-N—N'-bis(3-methylphenyl)-1,1'biphenyl-4,4'-diamine) or NBD (N,N'-dyphenyl-N—N'-bis(1-napthylphenyl)-1,1'biphenyl-4,4'-diamine), a layer, also referred to as "photoactive layer", comprising a p-type and an n-type OSC, which can exist for example as a p-type/n-type bilayer or as distinct p-type and n-type layers, or as blend or p-type and n-type OSC, forming a BHJ, optionally a layer having electron transport properties, for example comprising LiF or PFN, a low work function electrode, preferably comprising a metal like for example aluminum, serving as cathode, wherein at least one of the electrodes, preferably the anode, is transparent to visible light, and wherein the photoactive layer is prepared from a formulation according to the present invention, preferably by a printing method as described above and below.

A second preferred OPV device according to the invention is an inverted OPV device and comprises the following layers (in the sequence from bottom to top):

optionally a substrate, a high work function metal or metal oxide electrode, comprising for example ITO, serving as cathode, a layer having hole blocking properties, preferably comprising an organic polymer, polymer blend, metal or metal oxide like $TiO_x$, $ZnO_x$, Ca, Mg, poly(ethyleneimine), poly(ethyleneimine) ethoxylated or poly [(9,9-bis(3'—(N,N-dimethylamino)propyl)-2,7-fluorene)-alt-2,7-(9,9-dioctylfluorene)], a photoactive layer comprising a p-type and an n-type OSC, situated between the electrodes, which can exist for example as a p-type/n-type bilayer or as distinct p-type and n-type layers, or as blend or p-type and n-type OSC, forming a BHJ, an optional conducting polymer layer or hole transport layer, preferably comprising an organic polymer or polymer blend, metal or metal oxide, for example PEDOT:PSS, nafion, a substituted triaryl amine derivative like for example TBD or NBD, or $WO_x$, $MoO_x$, $NiO_x$, Pd or Au, an electrode comprising a high work function metal like for example silver, serving as anode, wherein at least one of the electrodes, preferably the cathode, is transparent to visible light, and wherein the photoactive layer is prepared from a formulation according to the present invention, preferably by a printing method as described above and below.

In the OPV devices of the present invention the p-type and n-type OSC materials are preferably selected from the materials, like the polymer/polymer/fullerene systems, as described above.

When the photoactive layer is deposited on the substrate, it forms a BHJ that phase separates at nanoscale level. For discussion on nanoscale phase separation see Dennler et al, *Proceedings of the IEEE*, 2005, 93 (8), 1429 or Hoppe et al, *Adv. Func. Mater*, 2004, 14(10), 1005. An optional annealing step may be then necessary to optimize blend morphology and consequently OPV device performance.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Above and below, unless stated otherwise percentages are percent by weight and temperatures are given in degrees Celsius.

The invention will now be described in more detail by reference to the following examples, which are illustrative only and do not limit the scope of the invention.

Example 1

Photoactive formulation P1 according to the invention was prepared by dissolving Polymer 1 and PCBM-C60 at a ratio of 1:1 in a solvent mixture of vetiver acetate (30%) and 1,5-dimethyltetralin (DMT) (70%) at a solid content of 6%.

For comparison purpose photoactive formulation C1 was prepared by dissolving Polymer 1 and PCBM-C60 at a ratio of 1:1 in 1,5-DMT as single solvent at a solid content of 5%.

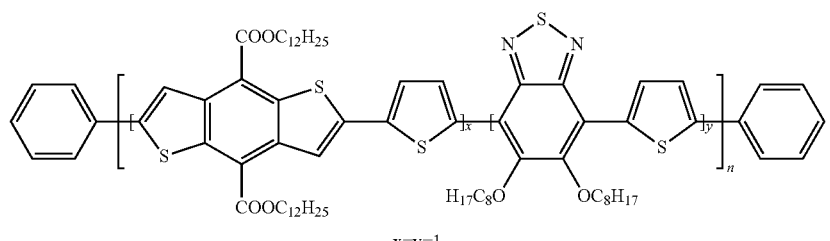

x=y=1

Polymer 1 and its preparation are disclosed in WO 2011/131280 A1.

Figure 1B:
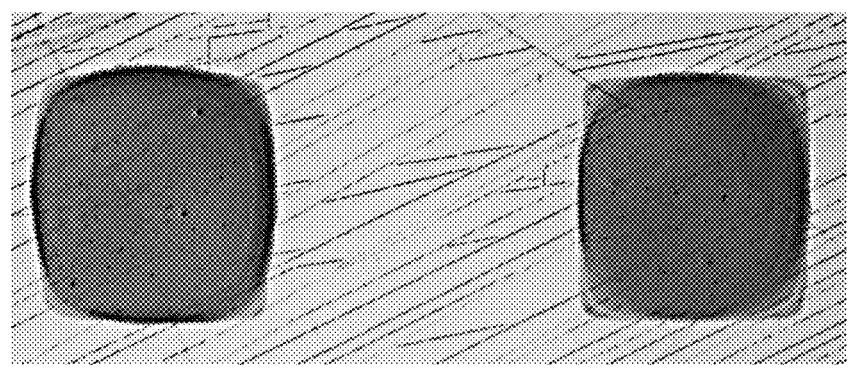
FIG. 1b shows a microscope image of squares printed with an OSC formulation according to Example 1.

FIG. 1a and FIG. 1b show microscope images of a 1×1 mm square printed through mesh screen printer with formulation C1 (1a) and formulation P1 (1b), both dried under vacuum at 1000 for 10 min.

It can be seen that the addition of the co-solvent vetiver acetate in formulation P1 according to the invention does significantly improve the quality of the film giving better edge definition and more uniform drying, compared to reference formulation C1.

Example 2

Several photoactive formulations were prepared containing Polymer 1 as donor, PCBM-C60 as acceptor, octamethyltrisiloxane (OTMS) and two solvents.

Table 1 shows the composition and viscosity of the individual photoactive formulations with ß-caryophyllene as first solvent and 1,5-DMT as second solvent.

TABLE 1

Formulation compositions (in wt. %) and Viscosity (at 500 1/s)

| No. | Polymer 1 | PCBM-C60 | β-Caryo-phyllene | 1,5-DMT | OTMS | Viscosity |
|---|---|---|---|---|---|---|
| 1 | 2 | 4 | 65.8 | 24.4 | 3.8 | 290 cp |
| 2 | 2 | 4 | 24.4 | 65.8 | 3.8 | 52 cp |
| 3 | 1.5 | 3 | 66.9 | 24.8 | 3.8 | 114 cp |
| 4 | 1.5 | 3 | 24.8 | 66.8 | 3.8 | 30 cp |

Table 2 shows the composition and viscosity of the individual photoactive formulations with carvacrol as first solvent and 1,5-DMT as second solvent.

TABLE 2

Formulation compositions (in wt. %) and Viscosity (at 500 1/s)

| No. | Polymer 1 | PCBM-C60 | Carvacrol | 1,5-DMT | OTMS | Viscosity |
|---|---|---|---|---|---|---|
| 5 | 1.86 | 3.71 | 5.57 | 84.00 | 4.87 | 34 cp |
| 6 | 1.99 | 3.98 | 7.96 | 81.10 | 4.98 | 34 cp |
| 7 | 1.87 | 3.74 | 23.80 | 65.70 | 4.91 | 80 cp |
| 8 | 3.00 | 3.00 | 36.00 | 54.00 | 4.00 | 240 cp |

From Tables 1 and 2 it can be seen that the viscosity of the formulations can be tuned to match the desired range for the printing process, especially when using ß-Caryophyllene as first solvent.

Example 3—Organic Photodetectors

Devices are fabricated onto glass substrates with six pre-patterned ITO dots of 5 mm diameter to provide the bottom electrode. The ITO substrates are cleaned using a standard process of ultrasonication in Decon90 solution (30 minutes) followed by washing with de-ionized water (×3) and ultrasonication in de-ionized water (30 minutes).

A ZnO ETL layer was deposited by blade coating or spin coating a ZnO nanoparticle dispersion onto the substrate and drying on a hotplate for 10 minutes at a temperature between 100 and 140° C. A photoactive formulation of Polymer 1 (sourced from Merck KGaA) and PCBM-C60 was prepared at a ratio of 1:2 in the respective solvents at a concentration of 20 mg/ml, and stirred for 17 hours at a temperature of between 23° C. and 60° C.

The photoactive layer was deposited using blade coating (K101 Control Coater System from RK). The stage temperature was set to between 20-60° C., the blade gap set between 2-200 µm and the speed set between 2-8 m/min targeting a final dry film thickness of 500-1000 nm. Following coating the active layer was annealed at 100° C. for 10-15 minutes.

The HTL layer was either $MoO_3$ or $WO_3$. Where the HTL was $WO_3$ nanoparticles ($WO_3$ NPs, Nanograde Ltd) it was coated by the blade coating technique, with a thickness of 50 nm. Where the HTL was $MoO_3$, it was deposited by E-beam vacuum deposition from $MoO_3$ pellets at a rate of 1 Å/s, targeting 15 nm thickness. Finally, the top silver electrode was deposited by thermal evaporation through a shadow mask, to achieve Ag thickness between 30-80 nm.

The I-V curves were measured using a Keithley 4200 system under light and dark conditions at a bias from +5 to −5 V. The light source was a 580 nm LED with power 0.5 $mW/cm^2$.

The EQE of OPD devices were characterized between 400 and 1100 nm under −2V bias, using an External Quantum Efficiency (EQE) Measurement System from LOT-QuantumDesign Europe.

Tables 3 shows the EQE values for individual OPD devices comprising a photoactive layer with a BHJ formed from some of the formulations of Example 2.

TABLE 3

| Formulation No. | EQE (at −2 V) | Dark Current (at −2 V) |
|---|---|---|
| 4 | 25% | $2 \times 10^{-7}$ |
| 7 | 35% | $2 \times 10^{-6}$ |
| 8 | 45% | $10^{-4}$ |

OPD devices are operated as light sensors, where the "off" state is indicated by the dark current and the "on" state by the light current. The sensitivity of the device is defined by the difference between the dark and the light current. The lower the dark current is that means that a wider range of light intensities can be detected. The efficiency of the device is defined by the EQE, the higher the EQE the more photons are converted into current (so loss mechanisms, such as recombination or thermal effects are reduced).

From Table 3 it can be seen that the formulations of Example 2 are suitable for the preparation of photoactive layers in OPD devices.

The invention claimed is:

1. A formulation comprising a p-type organic semiconductor (OSC) and an n-type OSC, the formulation further comprising a first solvent selected from terpenes or terpenoids and a second solvent selected from aromatic, heteroaromatic, or partially unsaturated alicyclic or heterocyclic solvents, wherein the first solvent is selected from the group consisting of β-caryophyllene, vetiveryl acetate, carvacrol, valencene, D-carvone, citral diethyl acetal, verbenone, nerol, menthone, citral, derivatives of the aforementioned, and any combination of the aforementioned, and the p-type OSC is a conjugated polymer having a molecular weight Mn>5000 g/mol.

2. The formulation according to claim 1, characterized in that the first solvent is selected from the group consisisting of β-caryophyllene, vetiveryl acetate and carvacrol.

3. The formulation according to claim 2, characterized in that the first solvent is β-caryophyllene.

4. The formulation according to claim 1, characterized in that the second solvent is selected from the group consisting of alkylated benzene, alkoxylated benzene, indane, alkylated indane, alkoxylated indane, tetralin, alkylated tetralin, naphthalene, alkylated naphthalene, anisole and alkylated anisole.

5. The formulation according to claim 4, characterized in that the second solvent is selected from the group consisting of 1,5-dimethyltetralin, 1-methylnaphthalene, 1-ethylnaphthalene, 2-ethylnaphthalene, 1,2-dimethylnaphthalene, 1,3-dimethylnaphthalene, 1,4-dimethylnaphthalene, 2,6-dimethylnaphthalene, 2,7-diisopropylnaphthalene and dimethylanisole.

6. The formulation according to claim 5, characterized in that the second solvent is selected from the group consisting of 1,5-dimethyltetralin, 1-methylnaphthalene and dimethylanisole.

7. The formulation according to claim 1, characterized in that the concentration of the first solvent is from 2 to 30%, and the concentration of the second solvent is from 50 to 90%.

8. The formulation according to claim 7, characterized in that the concentration of the p-type OSC is from 1 to 5%, and the concentration of the n-type OSC is from 1 to 5%.

9. The formulation according to claim 1, characterized in that the formulation does, except for the n-type and p-type OSC, only contain volatile organic compounds.

10. The formulation according to claim 1, characterized in that the total concentration of all solids is ≤6%.

11. The formulation according to claim 1, characterized in that the p-type OSC is a conjugated polymer having a molecular weight Mn>5000 g/mol and comprising at least one electron donating unit D and at least one electron accepting unit A, and optionally at least one spacer unit Sp separating a donor unit from an acceptor unit, wherein each donor and acceptor units is directly connected to another donor or acceptor unit or to a spacer unit, and wherein the spacer units, if present, are located between the donor and acceptor units such that a donor unit and an acceptor unit are not directly connected to each other, and wherein all of the donor, acceptor and spacer units are each independently selected from arylene or heteroarylene that has from 5 to 20 ring atoms, is mono- or polycyclic, optionally contains fused rings, and is unsubstituted or substituted by one or more identical or different groups L or $R^1$, wherein $R^1$ is H, F, Cl, CN, -Sp-$R^C$, or straight-chain, branched or cyclic alkyl with 1 to 30 C atoms, in which one or more $CH_2$ groups are each optionally replaced by —O—, —S—, —C(=O)—, —C(=S)—, —C(=O)—O—, —O—C(=O)—, —$NR^O$—, —$SiR^OR^{OO}$—, —$CF_2$—, —$CR^O=CR^{OO}$—, —$CY^1=CY^2$— or —C≡C— in such a manner that O and/or S atoms are not linked directly to one another, and in which one or more H atoms are each optionally replaced by F, Cl, Br, I or CN, or aryl, heteroaryl, arylalkyl, heteroarylalkyl, aryloxy or heteroaryloxy, wherein each of the aforementioned cyclic groups has 5 to 20 ring atoms, is mono- or polycyclic, optionally contains fused rings, and is unsubstituted or substituted by one or more identical or different groups L, L is F, Cl, —$NO_2$, —CN, —NC, —NCO, —NCS, —OCN, —SCN, $R^O$, $OR^O$, $SR^O$, —C(=O)$X^O$, —C(=O)$R^O$, —C(=O)—$OR^O$, —O—C(=O)—$R^O$, —$NH_2$, —$NHR^O$, —$NR^OR^{OO}$, —C(=O)$NHR^O$, —C(=O)$NR^OR^{OO}$, —$SO_3R^O$, —$SO_2R^O$, —OH, —$CF_3$, —$SF_5$, or optionally substituted silyl, or carbyl or hydrocarbyl with 1 to 30 C atoms that is optionally substituted and optionally comprises one or more hetero atoms, $R^O$, $R^{OO}$ denote H or straight-chain or branched alkyl with 1 to 20 C atoms that is optionally fluorinated, $X^O$ is halogen.

12. The formulation according to claim 11, characterized in that the p-type OSC is a conjugated polymer selected from the following formulae

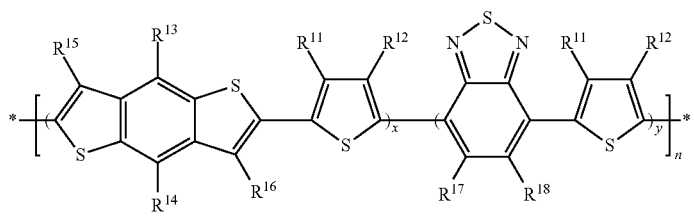

P1

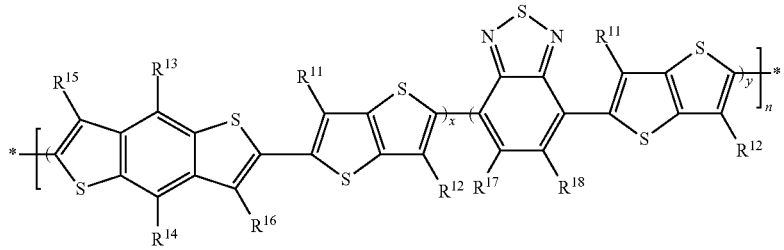

P2

-continued
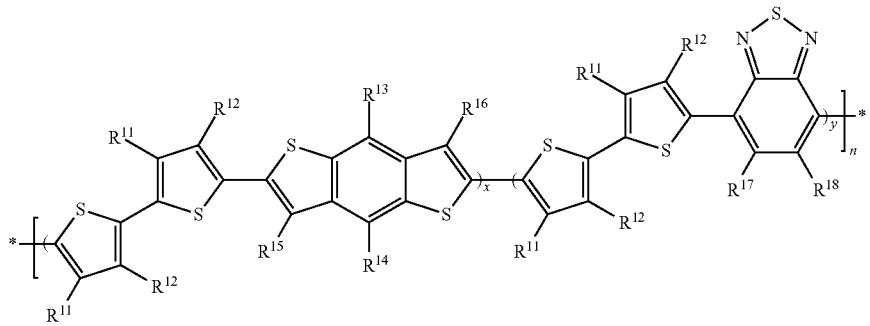
P3
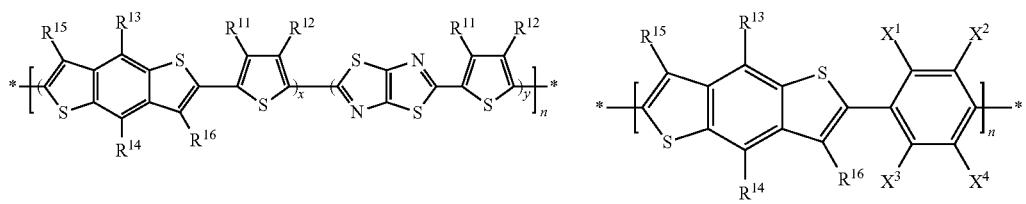
P4
P5
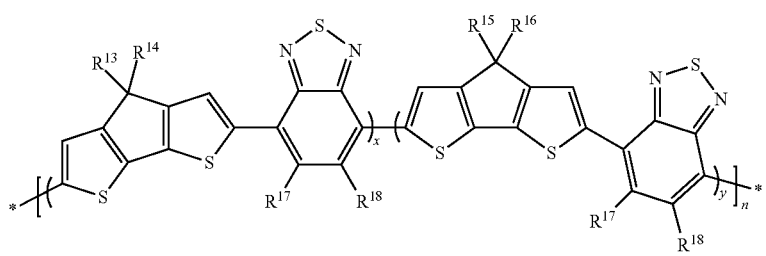
P6
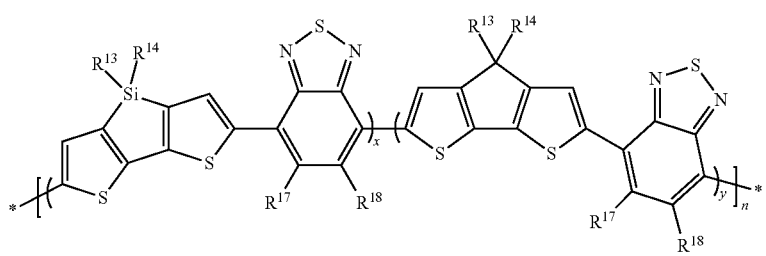
P7
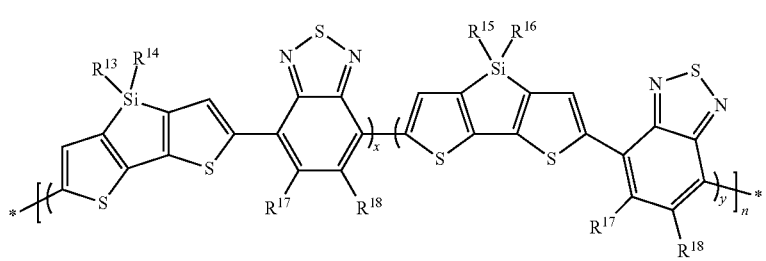
P8
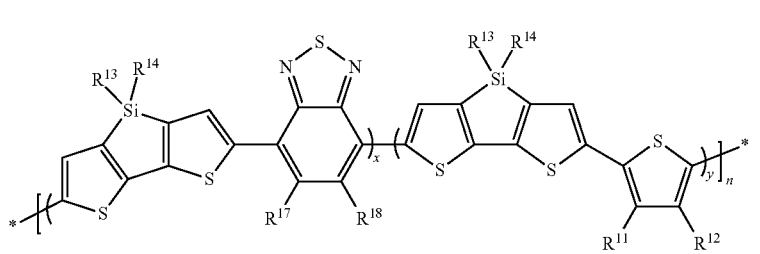
P9

-continued
P10
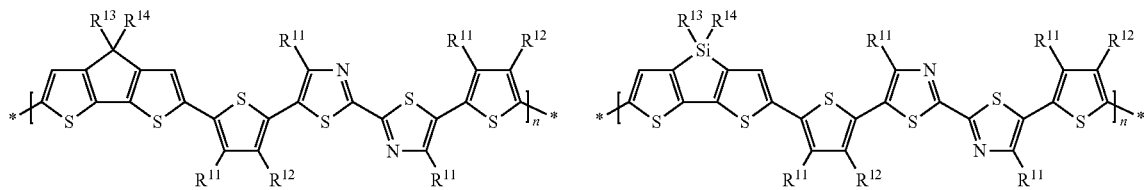
P11
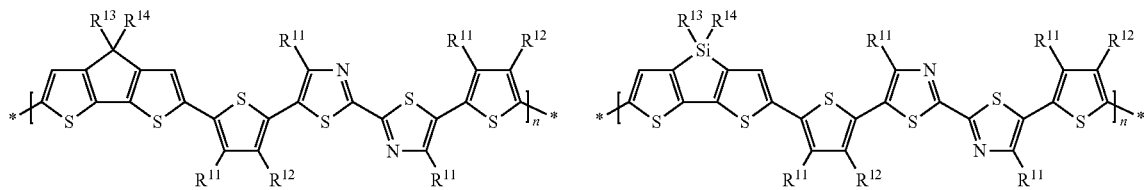
P12
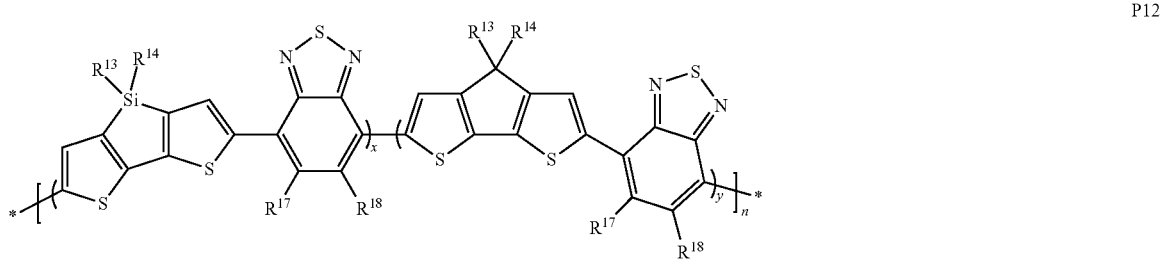
P13
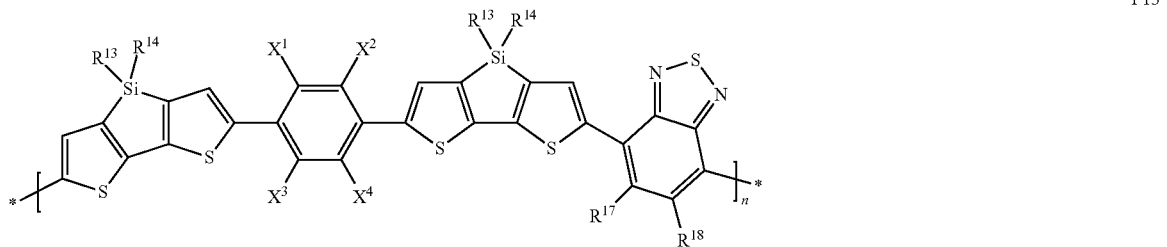
P14
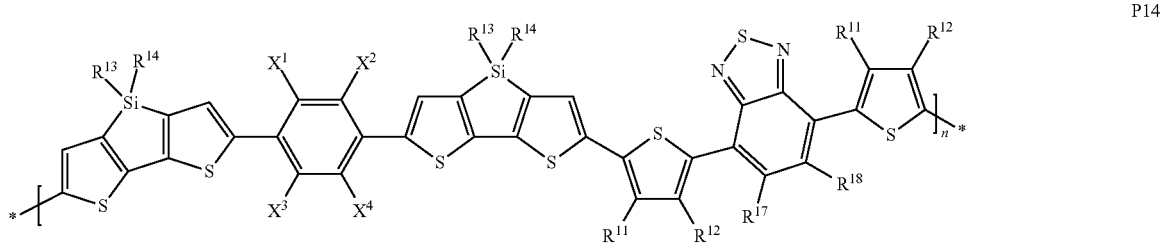
P15
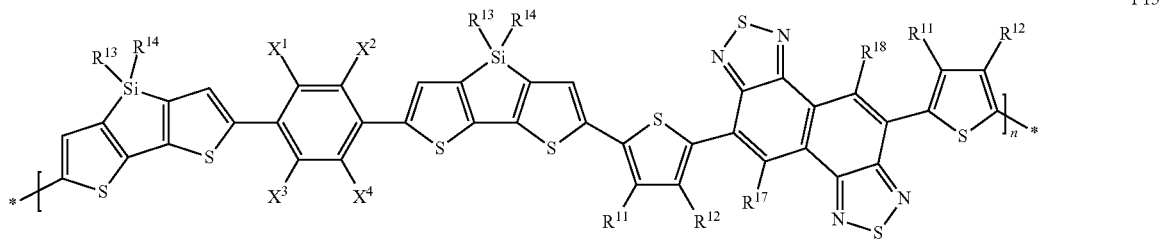
P16
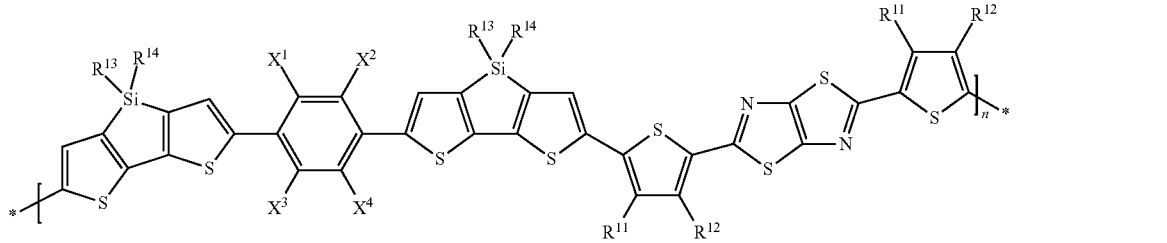

-continued
P17
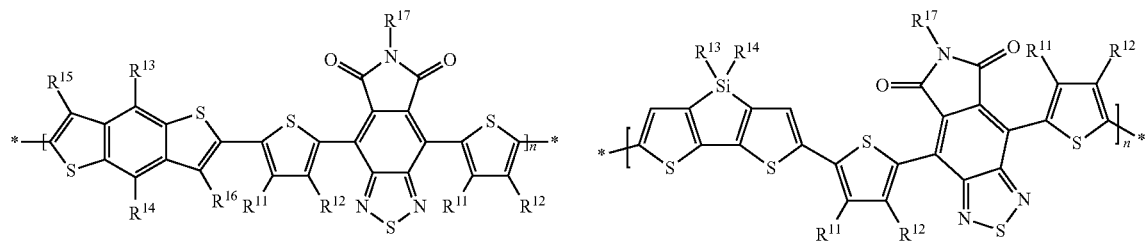
P18
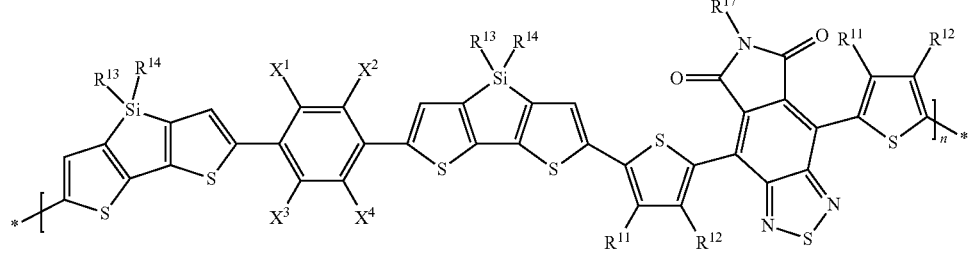
P19
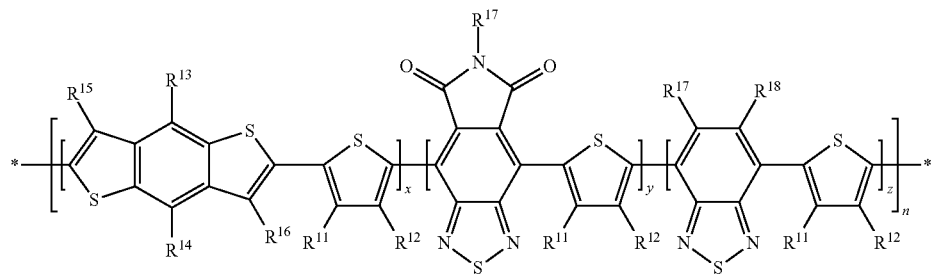
P20
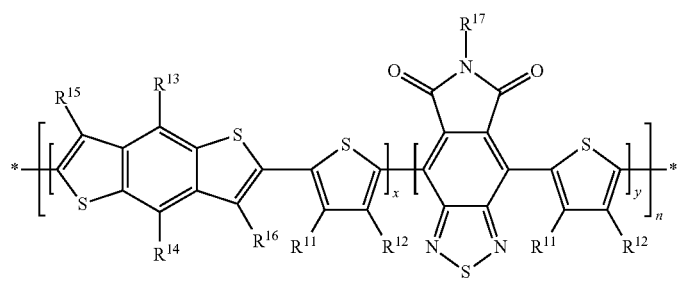
P21
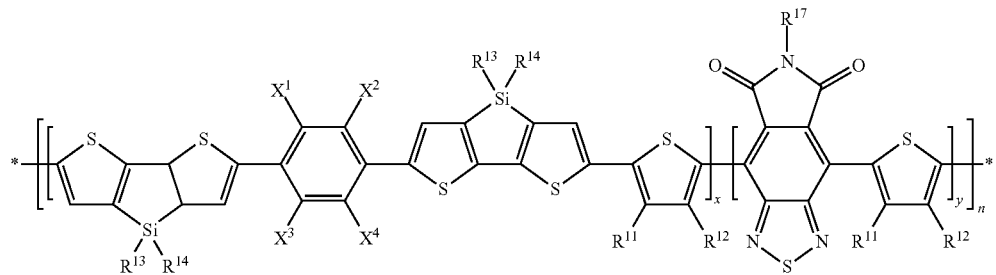
P22

-continued
P23
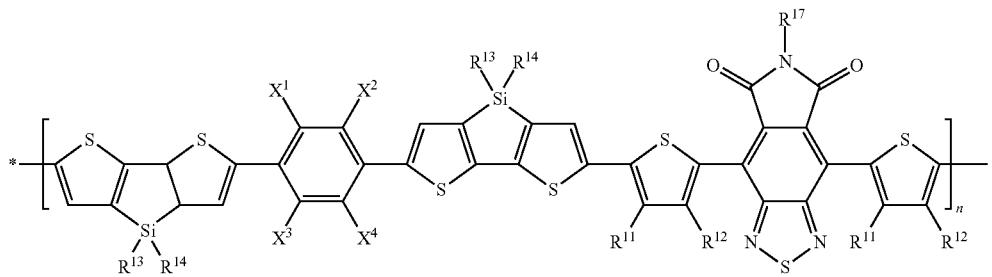
P24
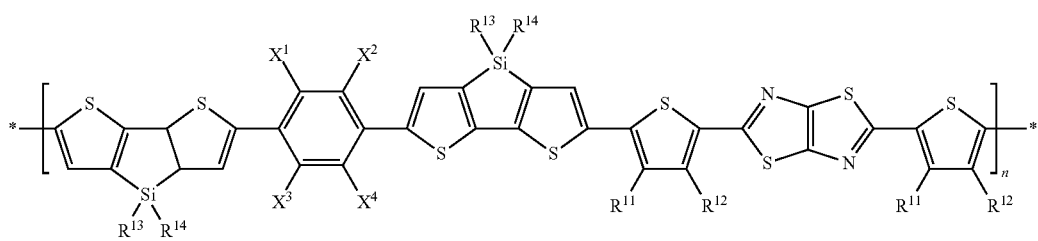
P25
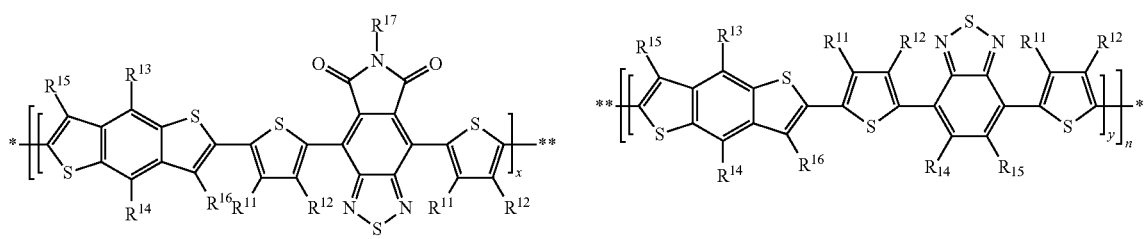
P26
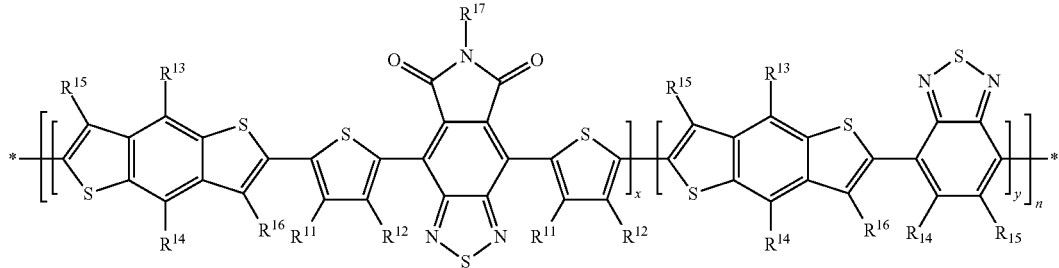
P27
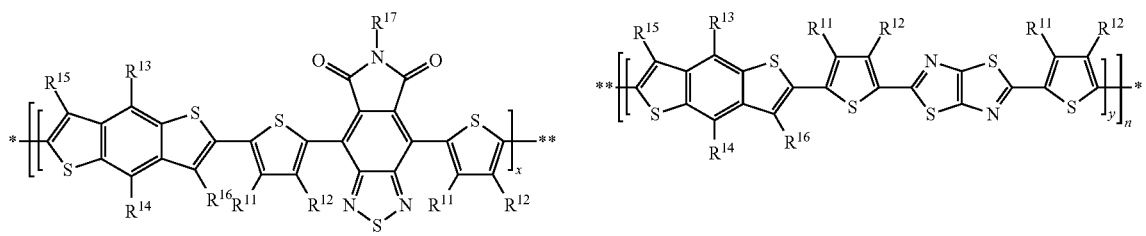
P28
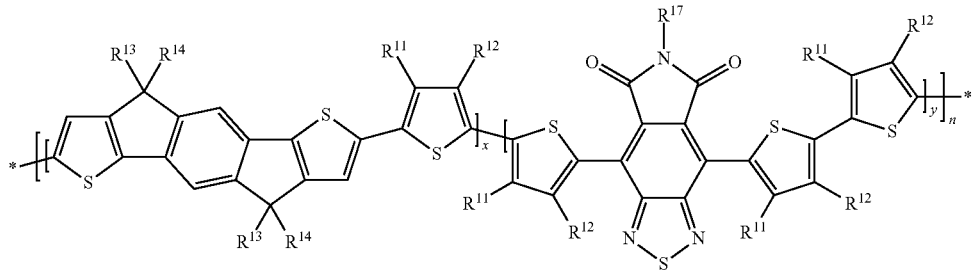

-continued
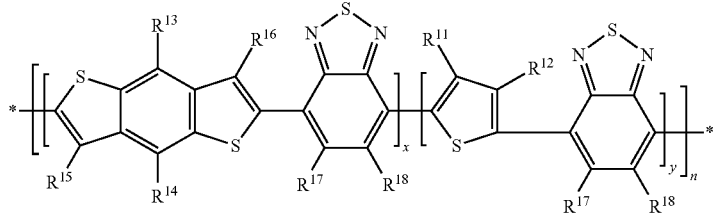
P29
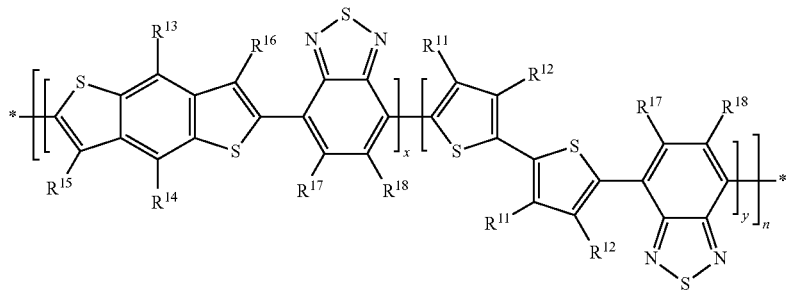
P30
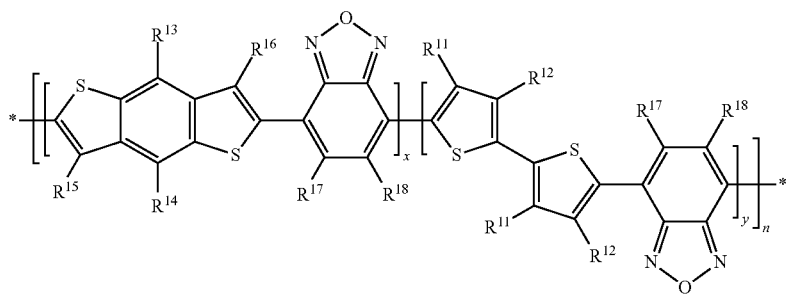
P31
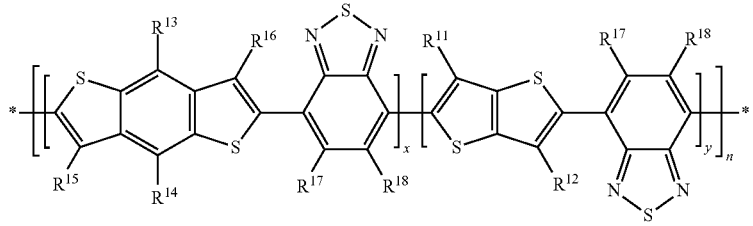
P32
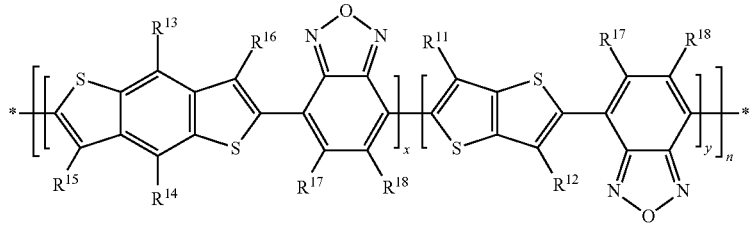
P33
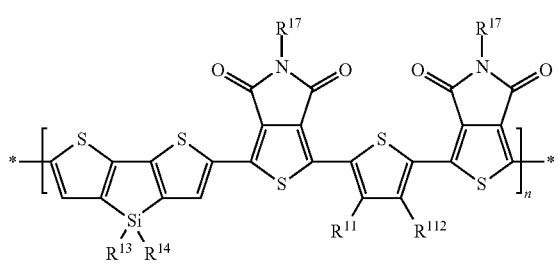
P34
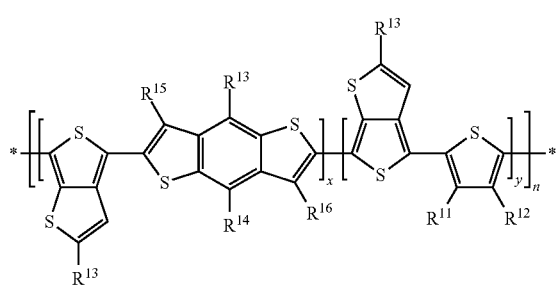
P35

-continued
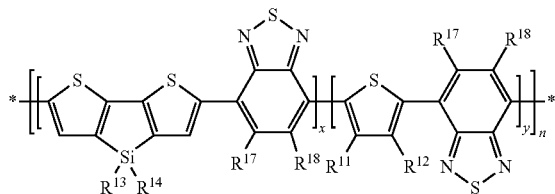
P36
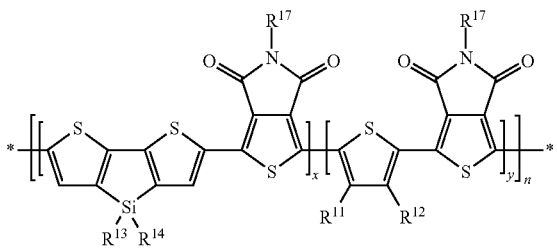
P37
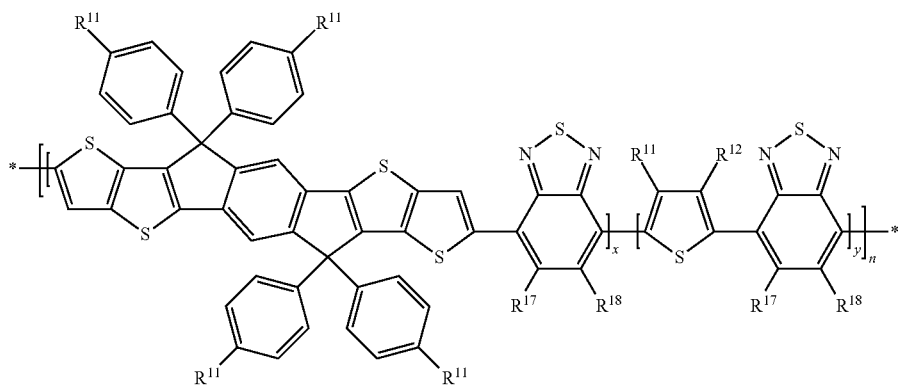
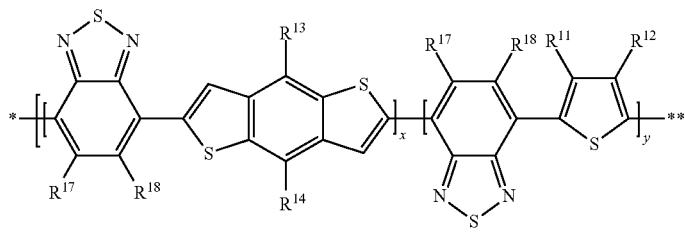
P38
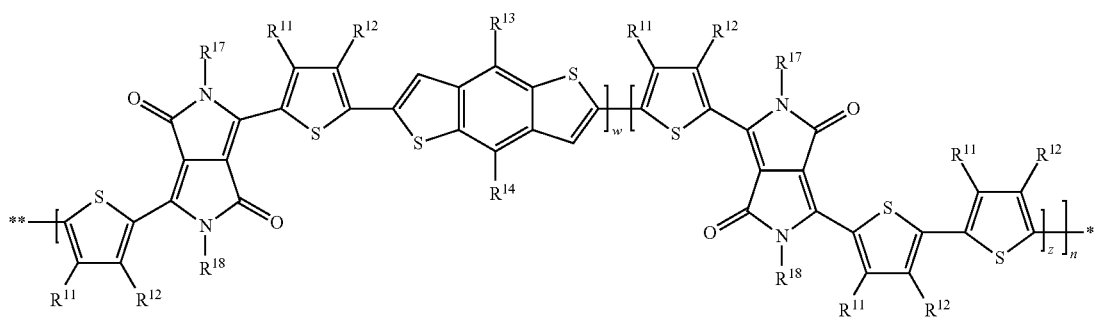
P39
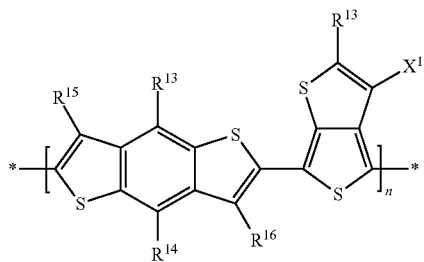
P40
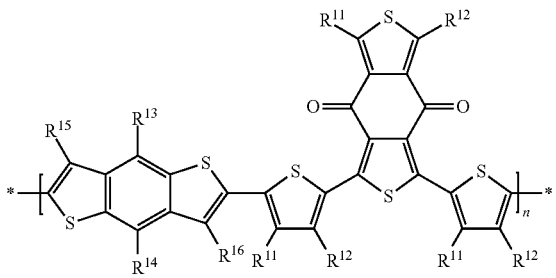
P41

-continued
P42
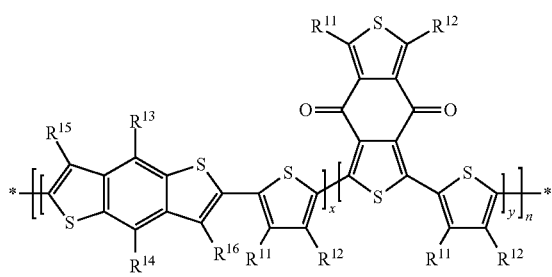
P43
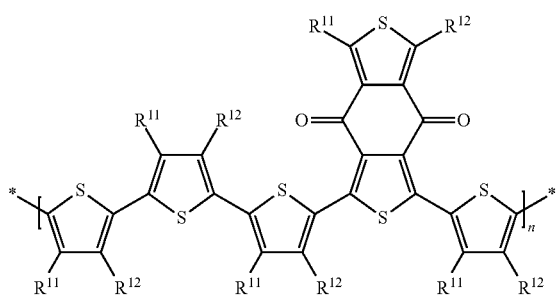
P44
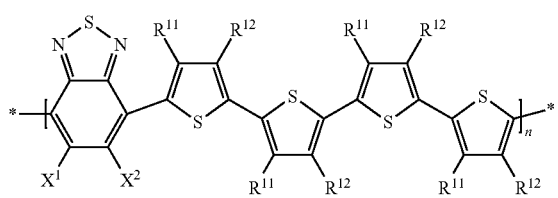
P45
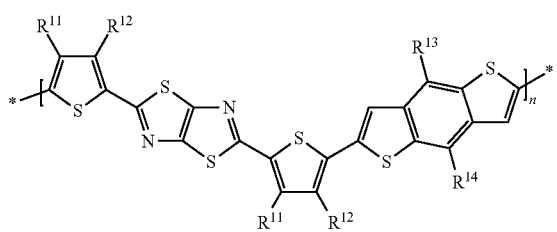
P46
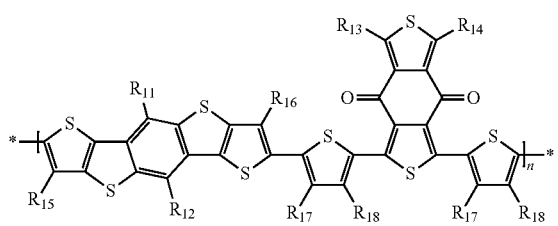
P47
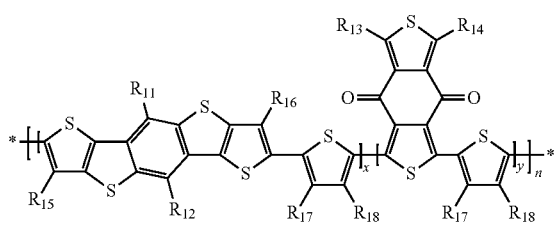
P48
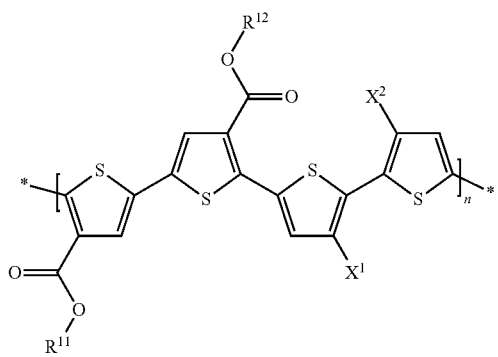
P49
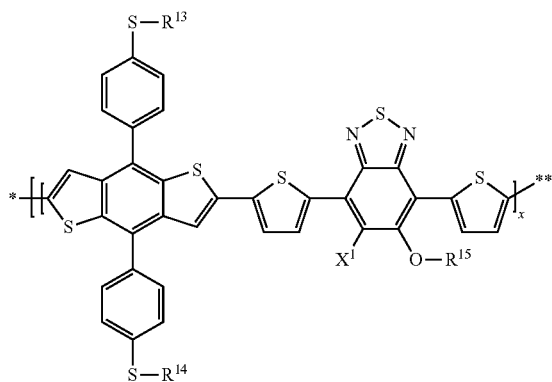
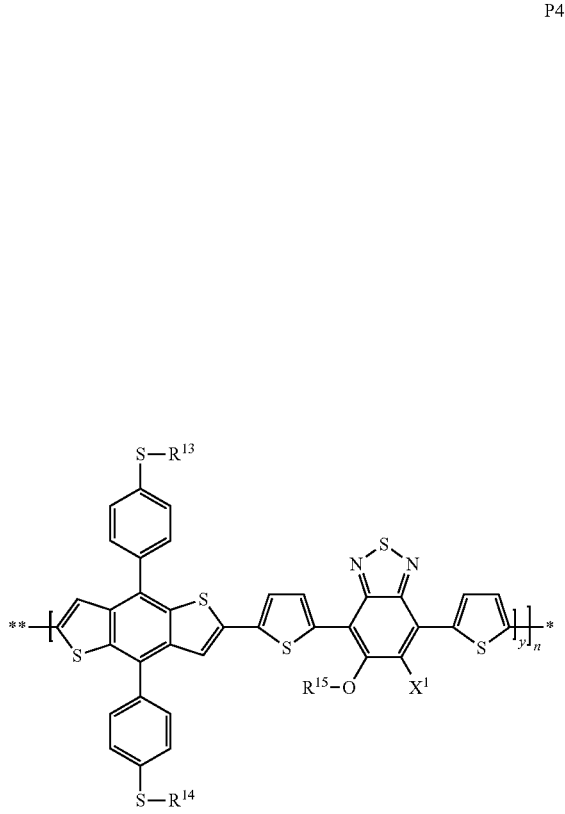

-continued

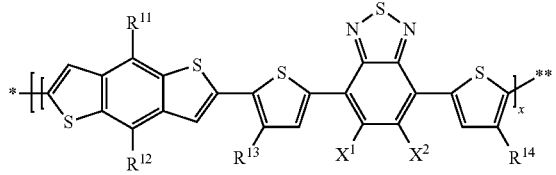

P50

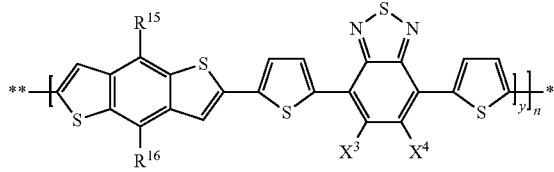

P51

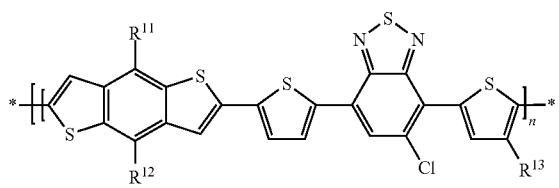

P52

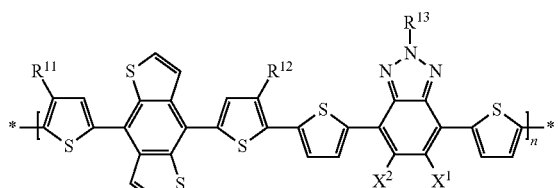

P53

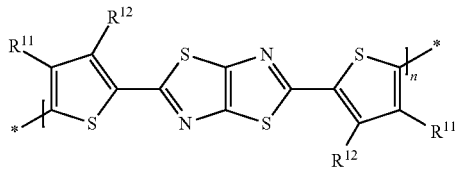

P54

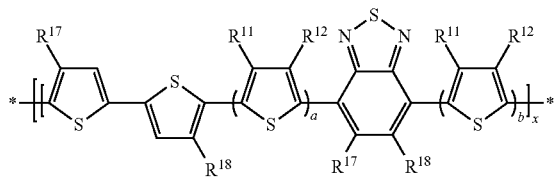

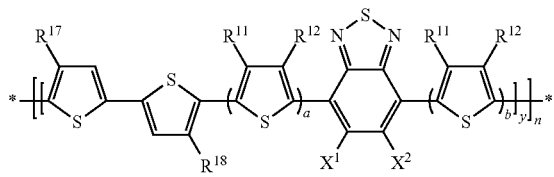

wherein w, x, y and z are each, independently of one another, a non-integer>0 and <1, with x+y=1, and x+y+w+Z=1, n is an integer>1, $R^{11-19}$ are H, F, Cl, CN, -Sp-$R^C$, or straight-chain, branched or cyclic alkyl with 1 to 30 C atoms, in which one or more CH$_2$ groups are each optionally replaced by —O—, —S—, —C(=O)—, —C(=S)—, —C(=O)—O—, —O—C(=O)—, —NR$^0$—, —SiR$^0$R$^{00}$—, —CF$_2$—, —CR$^0$=CR$^{00}$, —CY$^1$=CY$^2$— or —C≡C— in such a manner that O and/or S atoms are not linked directly to one another, and in which one or more H atoms are each optionally replaced by F, Cl, Br, I or CN, or aryl, heteroaryl, arylalkyl, heteroarylalkyl, aryloxy or heteroaryloxy, wherein each of the aforementioned cyclic groups has 5 to 20 ring atoms, is mono- or polycyclic, optionally contains fused rings, and is unsubstituted or substituted by one or more identical or different groups L, L is F, Cl, —NO$_2$, —CN, —NC, —NCO, —NCS, —OCN, —SCN, R$^0$, OR$^0$, SR$^0$, —C(=O)X$^0$, —C(=O)R$^0$, —C(=O)—OR$^0$, —O—C(=O)—R$^0$, —NH$_2$, —NHR$^0$, —NR$^0$R$^{00}$, —C(=O)NHR$^0$, —C(=O) NR$^0$R$^{00}$, —SO$_3$R$^0$, —SO$_2$R$^0$, —OH, —CF$_3$, —SF$_5$, or optionally substituted silyl, or carbyl or hydrocarbyl with 1 to 30 C atoms that is optionally substituted and optionally comprises one or more hetero atoms, —CN, R$^0$, —OR$^0$, —SR$^0$, —C(=O)—R$^0$, —C(=O)—OR$^0$, —O—C(=O)— R$^0$, —O—C(=O)—OR$^0$, —C(=O)—NHR$^0$, or —C(=O)—NR$^0$R$^{00}$, R$^0$, R$^{00}$ denote H or straight-chain or branched alkyl with 1 to 20 C atoms that is optionally fluorinated, X$^0$ is halogen, and X$^1$, X$^2$, X$^3$ and X$^4$ denote H, F or Cl.

13. The formulation according to claim 1, characterized in that the n-type OSC is a small molecule.

14. The formulation according to claim 1, characterized in that the n-type OSC is a fullerene or a substituted fullerene.

15. The formulation according to claim 14, characterized in that the n-type OSC is selected from PCBM-C60, PCBM-C70, bis-PCBM-C60, bis-PCBM-C70, ICMA-c60 (1',4'-dihydro-naphtho [2',3': 1,2] [5,6]fullerene-C60), ICBA, oQDM-C60 (1',4'-dihydro-naphtho [2',3': 1,9] [5,6]fullerene-C60-Ih), and bis-oQDM-C60.

16. A method of preparing an organic semiconductor (OSC) layer or pattern comprising printing a formulation comprising a p-type OSC, an n-type OSC, a first solvent selected from terpenes or terpenoids and a second solvent selected from aromatic, heteroaromatic, or partially unsaturated alicyclic or heterocyclic solvents;

wherein the first solvent is selected from the group consisisting of β-caryophyllene, vetiveryl acetate, carvacrol, valencene, D-carvone, citral diethyl acetal, verbenone, nerol, menthone, citral, derivatives of the aforementioned, and any combination of the aforementioned, and that the p-type OSC is a conjugated polymer having a molecular weight Mn>5000 g/mol.

17. The method according to claim 16, wherein the printing technique is selected from gravure, flexo, inkjet or screen printing.

* * * * *